United States Patent
Mochizuki et al.

(10) Patent No.: US 7,656,041 B2
(45) Date of Patent: Feb. 2, 2010

(54) SEMICONDUCTOR DEVICE AND ITS MANUFACTURING METHOD

(75) Inventors: Chihiro Mochizuki, Ome (JP); Hiroshi Kikuchi, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 170 days.

(21) Appl. No.: 12/031,924

(22) Filed: Feb. 15, 2008

(65) Prior Publication Data
US 2008/0230922 A1 Sep. 25, 2008

(30) Foreign Application Priority Data
Mar. 23, 2007 (JP) ............................. 2007-076481

(51) Int. Cl.
H01L 23/48 (2006.01)
H01L 23/52 (2006.01)
H01L 29/40 (2006.01)
H01L 21/00 (2006.01)
H01L 21/44 (2006.01)

(52) U.S. Cl. .................. 257/777; 257/783; 257/E31.11; 257/E31.127; 438/64; 438/65; 438/107

(58) Field of Classification Search .................. 438/51, 438/64, 65, 107; 257/415, 432, 777, 783, 257/E31.11, E31.127, E21.505, E29.324
See application file for complete search history.

(56) References Cited

U.S. PATENT DOCUMENTS

2008/0067392 A1* 3/2008 Miyaguchi ............. 250/370.11
2008/0237766 A1* 10/2008 Kim ........................ 257/432
2009/0117681 A1* 5/2009 Maruyama et al. ............ 438/59
2009/0126790 A1* 5/2009 Nishi et al. .................. 136/257

OTHER PUBLICATIONS

M. Ohishi, et al., "Si Penetration—A Structure Revolution Chip", Nikkei Electronics, pp. 81-92 in Oct. 10, 2005 issue, published by Nikkei Business Publications, Inc.

* cited by examiner

Primary Examiner—David S Blum
(74) Attorney, Agent, or Firm—Antonelli, Terry, Stout & Kraus, LLP.

(57) ABSTRACT

A technique for mounting a plurality of electronic parts on one surface of a wiring substrate is provided. A semiconductor device comprises a wiring substrate having connection pads disposed outside a parts mount; a plurality of electronic parts with the first surface having a plurality of electrodes and the second surface fixing; a first underlying insulation layer provided between the connecting pads and the electrodes; a first metal layer formed overlaid on the first underlying insulation layer and providing connections between the connecting pads and the electrodes; a second underlying insulation layer having electrically insulating properties, provided between the respective electrodes of adjacent electronic parts; a second metal layer formed overlaid on the second underlying insulation layer and providing connections between the respective electrodes of adjacent electronic parts; and a first surface insulation layer covering the first metal layer and a second surface insulation layer covering the second metal layer.

20 Claims, 26 Drawing Sheets

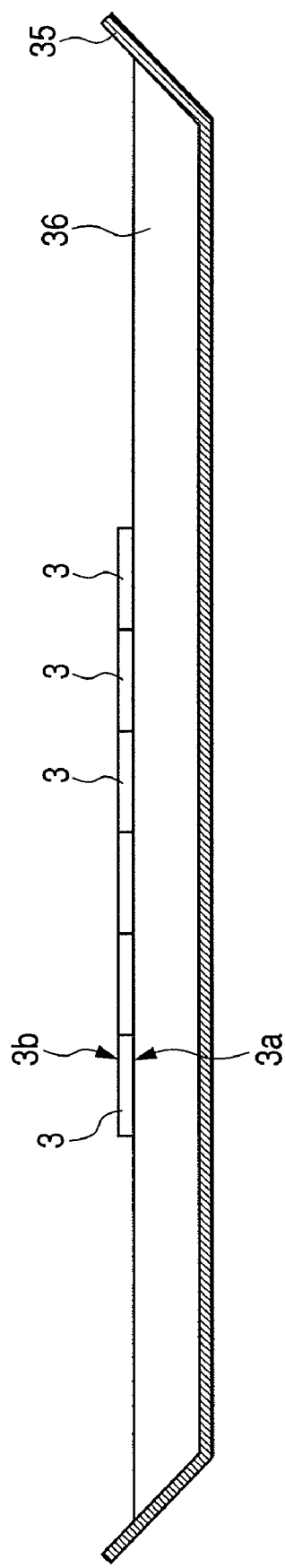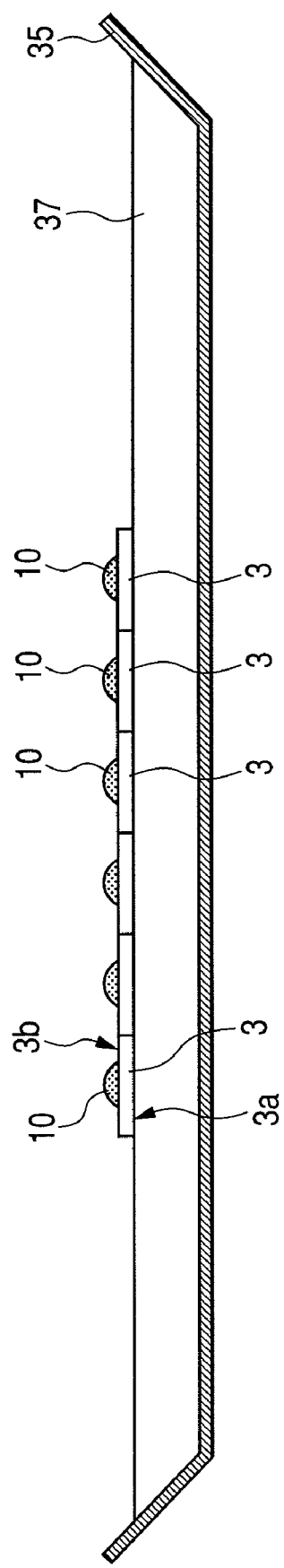

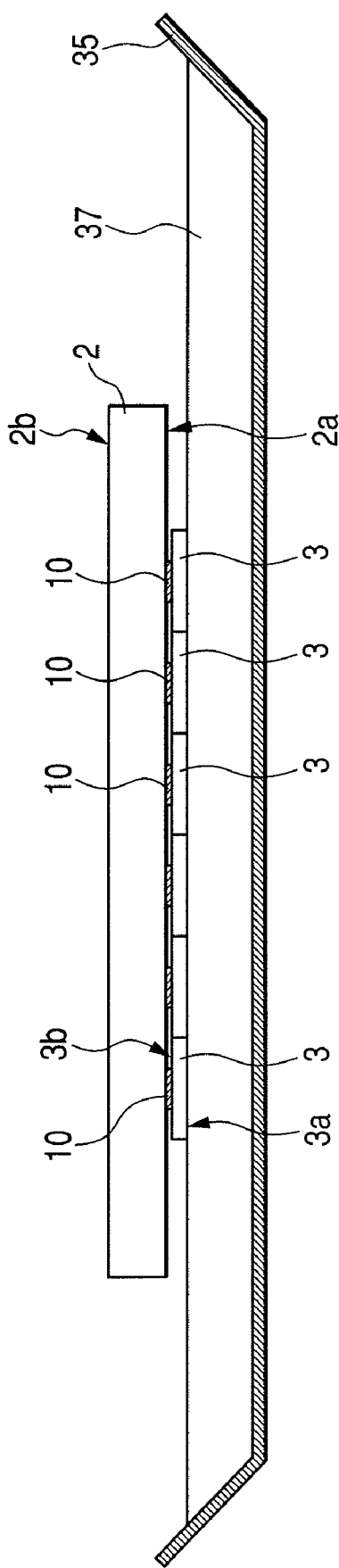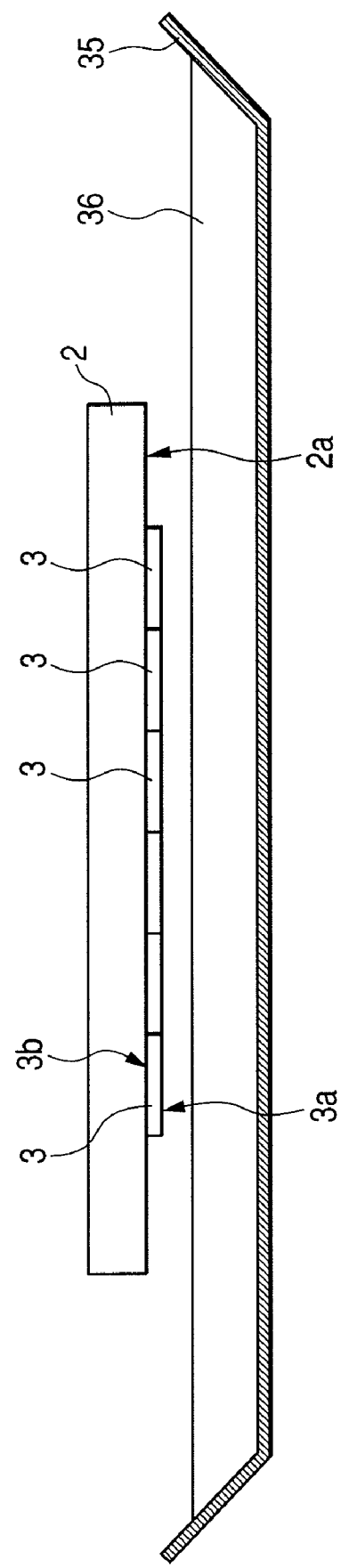

SEMICONDUCTOR DEVICE AND ITS MANUFACTURING METHOD

CLAIM OF PRIORITY

The present application claims priority from Japanese application JP 2007-076481 filed on Mar. 23, 2007, the content of which is hereby incorporated by reference into this application.

FIELD OF THE INVENTION

The present invention relates to a semiconductor device having plural electronic parts on one surface of a wiring substrate and a manufacturing method thereof. The invention relates to a technique that is effectively applied to a method for manufacturing, for example, an image pickup device comprising an array of plural sensor chips installed on one surface of a wiring board.

BACKGROUND OF THE INVENTION

Semiconductor devices are required to have higher performance and lower power consumption and to be produced at lower cost. To meet these requirements, many techniques such as System in Package (SiP) are developed (refer to, for example, "Nikkei Electronics" pp. 81-92 in Oct. 10, 2005 issue, published by Nikkei Business Publications, Inc.) In this non-patent document, techniques for interconnecting plural chips which are sealed in a single package are described. One example disclosed in this document is such that, on one surface of an interposer for, for example, a memory card, four chips (ND type flash memories) are stacked and electrical connections between each chip and the interposer are provided by wires (wire bonding). Another example disclosed in the same document is such that, on one surface of an interposer for a memory card, eight chips (ND type flash memories) are stacked and electrical connections between chips and a chip and the interposer are provided by Si through-hole electrodes.

In the same document, further, a method for manufacturing an image pickup element is disclosed. Disclosed in this document are section views by process step to illustrate a method for manufacturing a conventional image pickup element by utilizing wire bonding and section view by process step to illustrate a method for manufacturing an image pickup element by utilizing Si through-hole electrodes.

In the former section views by process step, the section views are described in which, after chips with their sensor surfaces facing up are joined to the top surface of a supporting substrate, the chips and the supporting substrate are connected by wires and then a protective glass is joined to the sensor surfaces.

In the latter method for manufacturing an image pickup element, the following process steps are disclosed. First, a supporting material for protecting sensors is attached to a wafer. Then, the wafer is thinned. Next, Si through-hole electrodes are formed and a rewiring/backside protection layer is formed on the exposed surface of the wafer. Then, the supporting material is removed and a protective glass is attached to the sensor surface of the wafer. Next, external terminals are installed. Finally, the wafer with the protective glass is cut into individual chips. In this way, the image pickup element is manufactured.

SUMMARY OF THE INVENTION

An X-ray CT scanner is expected to acquire a greater number of vivid images in a short time so that the stress of a patient can be alleviated. For this reason, it is required that an image pickup device having as large a surface for image pick as possible is installed in the X-ray CT scanner and the large image pickup device is rotated at a high speed.

To provide a larger image pickup device for use in the X-ray CT scanner, means are taken to array and fix image pickup elements lengthwise and crosswise onto the substrate of the image pickup device. These image pickup elements are chip bonded or wire bonded to the supporting substrate or those in which external terminals are attached to the Si through-hole electrodes, as described in the above-mentioned document.

A method for arraying and fixing conventional image pickup elements being chip bonded or wire bonded to the supporting substrate onto the substrate of the image pickup device is poor in workability, which results in a rise in the manufacturing cost of the image pickup device.

Here, an image pickup element that is used in the present invention is described. In the present invention, a term, sensor chip is used. This sensor chip is one semiconductor element (semiconductor chip) in which an image pickup element is formed. The first surface of the chip is the image pickup surface and plural electrodes are provided on the first surface. In the above-mentioned document, a sensor chip as described in the present invention, fixed and wire bonded to the supporting substrate or a sensor chip to which external terminals are attached is called an image pickup element.

As a method for producing a large sensor chip, the present inventors examined that one sensor chip is formed by an entire semiconductor wafer with a diameter of 300 mm which is currently used one sensor chip. However, producing a large sensor chip results in a low yield rate, which leads to poor productivity and cost increase. Moreover, to install a large chip, chip handling becomes difficult and there is concern that the yield rate drops in the installation process for installing chips on a wiring substrate, which is called a post-process.

The present inventors examined a method in which small pieces of sensor chips, not a sensor chip as large as a wafer, are installed densely together and the chips are electrically interconnected. These chips are installed as if a large chip almost as large as one wafer was installed. One of sensor chip installation methods which have heretofore commonly been used is to fix a sensor chip onto the wiring substrate with its light receiving surface (sensor surface) being exposed in order to receive light, X-ray, or the like and convert it into an electrical signal, as described in the above-mentioned document. Electrical connections between the wiring substrate and the sensor chip are connected by conductive wires. So, the present inventors examined a structure in which plural sensor chips are densely arranged in parallel and electrical connections, where required, are connected by conductive wires.

FIG. 42 and FIG. 43 are diagrams that relate to an image pickup device (semiconductor device) 70 in which a number of sensor chips are arranged in parallel; the present inventors examined this device prior to the present invention.

The image pickup device 70, as shown in FIG. 42 and FIG. 43, includes a wiring substrate 71 and plural sensor chips 72 which are semiconductor chips. The wiring substrate 71 consists of a square wiring substrate having a first surface 71a and a second surface 71b opposite to the first surface 71a. A parts mount 73 is defined on the first surface 71a of the wiring substrate 71. This parts mount 73 is a square area and square sensor chips 72 are arrayed lengthwise and crosswise and fixed onto the parts mount 73. For explanatory convenience, three sensors arrayed lengthwise and three sensors arrayed crosswise, a total of nine sensors are shown in the figure.

The sensor chips 72 are formed as semiconductor chips, as described above. Within a semiconductor chip, an image pickup element is formed. A first surface of the semiconductor chip is the image pickup surface and plural electrodes 74 are formed on the first surface. A second surface opposite to the first surface of the semiconductor chip is the fixing surface. This surface is fixed to the parts mount 73 of the wiring substrate 71 with a bonding material 75, as shown in FIG. 43.

On the first surface 71a of the wiring substrate 71, connecting pads 76 are disposed around the outer borders of the parts mount 73. The connecting pads 76 are arranged in line along the edges of the parts mount 73. On the second surface 71b of the wiring substrate 71, underlying electrodes 77 are exposed. To the underlying electrodes 77, leads 78 made of a metal plate are electrically connected via a conductive bonding material not shown. The leads 78 make external electrode terminals. The leads protrude from each edge of the square wiring substrate 71, respectively, as shown in FIG. 42. Wiring sections 79 are provided internally to the wiring substrate 71. The connecting pads 76 and the underlying electrodes 77 are connected to predetermined wiring sections 79, respectively.

A sensor chip 72 is square and has electrodes 74 inlaying along its outer edges of the first surface. Between adjacent sensor chips 72, the electrodes 74 of the respective nearby edges of the chips are electrically connected by conductive wires 80. The electrodes 74 located inlaying at the outer orders of the group of the sensor chips and the connecting pads 76 of the substrate 71 are electrically connected by conductive wires 80.

In the image pickup device 70 examined prior to the present invention, square sensor chips 72, each having 30 mm edges, are used. These chips are arrayed in a matrix; that is, a matrix of 10 chips lengthwise and 10 chips crosswise, a total of 100 chips, is formed. Thereby, an image pickup device having an image pickup surface with edges of 300 mm, which can be used in an X-ray CT scanner, can be produced.

In this structure, however, when nearby electrodes 74 are connected by wires 80, the wire length from one chip becomes about 500 μm or longer and there is a loss of about 1 mm for both chips. In consequence, a gap of at least about 1.0 mm is needed between adjacent sensor chips. Because of the presence of the gap of about 1.0 mm between sensor chips, the distance between the electrodes of adjacent sensor chips becomes long and the wire length becomes long. Long wires adversely affect signal transmission characteristics. In addition, trouble becomes liable to occur; e.g., a wire is warped or deformed and bends to contact a neighboring wire.

Furthermore, in the case of sensor chips for CT scanners, unlike general mold type packages, the sensor surface cannot be sealed, as it receives X-ray. However, because used wires with a diameter of about 30 μm are thin and weak to impact, only the wires need to be sealed with resin. If neighboring sensor chips are connected by wires, the wires need to be sealed with resin and, consequently, image discontinuity occurs in an image output by the sensors.

Thus, a method using through-hole electrodes has lately been contemplated as a structure that can prevent image discontinuity. Through-hole electrodes are one connection method in which through holes are bored in a bare chip, filled with a metal such as Cu, and used as electrodes. This allows vertical wiring in a chip and, therefore, shortest and flexible connections between chips and a chip and an interposer (wiring substrate) can be provided. Consequently, there is no need for providing SiP with internal wiring paths. Image pickup elements adopting the through-hole electrodes have an advantage that a mounting area can be reduced. However, their manufacturing cost is high and their evaluation is underway at a prototype level, but it can be said that they have problems such as product reliability at the present time.

It is an object of the present invention to provide a semiconductor device in which plural electronic parts are installed in parallel or in a stack on one surface of a wiring substrate and its manufacturing method.

It is another object of the present invention to provide a semiconductor device in which semiconductor chips as plural electronic parts are installed in parallel or in a stack on one surface of a wiring substrate and its manufacturing method.

It is yet another object of the present invention to provide an image pickup device (semiconductor device) having plural sensor chips installed on one surface of a wiring substrate and its manufacturing method.

It is a further object of the present invention to provide an image pickup device having a large image pickup surface with edges of 300 mm or more, which is effectively used in an X-ray CT scanner.

It is a still further object of the present invention to provide a semiconductor device in which it is possible to prevent a short circuit trouble (a short trouble) due to deformation of connecting means for electrical connections, where required, and its manufacturing method.

The foregoing objects and other objects and novel features of the present invention will be apparent from the description of the present specification and accompanying drawings.

Typical aspects of the invention disclosed in the present application are outlined below.

(1) A semiconductor device according to an aspect of the present invention comprises:

a wiring substrate having a first surface and a second surface opposite to the first surface; a parts mount defined on the first surface for arraying and fixing plural electronic parts; plural connecting pads arranged in place outside the parts mount; and external electrode terminals on the first surface and/or the second surface;

plural electronic parts having a first surface and a second surface opposite to the first surface, the first surface having plural electrodes and the second surface being fixed to the parts mount via a bonding material;

a first underlying insulation layer having electrically insulating properties, provided between the connecting pads of the wiring substrate and the electrodes of the electronic parts and formed on the wiring substrate and on the surface of the electronic parts, in which the connecting pads and the electrodes are electrically connected, a first metal layer formed overlaid on the first underlying insulation layer, one end of the first metal layer being connected to the connecting pads and the other end of the first metal layer being connected to the electrodes;

a second underlying insulation layer having electrically insulating properties, provided between the respective electrodes, which are electrically connected, of adjacent electronic parts and formed on the surface of the electronic parts or on the surface of the electronic parts and between the electronic parts;

a second metal layer formed overlaid on the second underlying insulation layer, one end of the second metal layer being connected to the electrodes of one of the adjacent electronic parts and the other end of the second metal layer being connected to the electrodes of the other one of the adjacent electronic parts; and a first surface insulation layer made of an insulating material for covering the first metal layer and a second surface insulation layer made of an insulating material for covering the second metal layer.

The first underlying insulation layer is formed of a first filling layer made of an insulating material, having a sloping plane which at least fills a gap on the side of the electronic parts and extends from the first surface of the wiring substrate to the first surface of the electronic parts, and a first insulation layer made of an insulating material, which is formed at least overlaid on the first filling layer. The second underlying insulation layer is formed of a second filling layer made of an insulating material, which at least fills a gap between adjacent electronic parts, and a second insulation layer made of an insulating material, which is formed at least overlaid on the second filling layer and defines a flat surface or a smoothly curved surface between the electrodes of adjacent electronic parts. The first filling layer and the first insulation layer are made of different materials and the second filling layer and the second insulation layer are made of different materials. The plural electronic parts are semiconductor chips of the same type and having equal dimensions. The semiconductor chips are, for example, sensor chips, in each of which an image pickup element having an image pickup surface corresponding to the first surface is formed. Accordingly, a semiconductor device in which these sensor chips are mounted on the wiring substrate is an image pickup device.

This semiconductor device may be manufactured by the following manufacturing method.

The semiconductor device is manufactured by the following steps:

(a) preparing a wiring substrate having a first surface and a second surface opposite to the first surface; a parts mount defined on the first surface for arraying and fixing plural electronic parts; plural connecting pads arranged in place outside the parts mount; and external electrode terminals on the first surface and/or the second surface;

(b) preparing plural electronic parts having a first surface and a second surface opposite to the first surface, the first surface having plural electrodes and the second surface being fixed to the parts mount via a bonding material;

(c) arraying and fixing plural electronic parts onto the parts mount of the wiring substrate via a bonding material (d) forming a first underlying insulation layer having electrically insulating properties on the wiring substrate and on the surface of the electronic parts between the connecting pads of the wiring substrate and the electrodes of the electronic parts, in which the connecting pads and the electrodes are electrically connected, and forming a second underlying insulation layer having electrically insulating properties on the surface of the electronic parts or on the surface of the electronic parts and between the electronic parts between the respective electrodes, which are electrically connected, of adjacent electronic parts;

(e) forming a first metal layer on top of the first underlying insulation layer to provide electrical connections between the connecting pads of the wiring substrate and forming a second metal layer on top of the second underlying insulation layer to provide electrical connections between predetermined electrodes of adjacent electronic parts; and (f) forming a first surface insulation layer made of an insulating material to cover the first metal layer and forming a second surface insulation layer made of an insulating material to cover the second metal layer.

In the step (d), the first underlying insulation layer is formed by the following steps:

(g) forming a first filling layer made of an insulating material, having a sloping plane which at least fills a gap on the side of the electronic parts and extends from the first surface of the wiring substrate to the first surface of the electronic parts; and (h) forming a first insulation layer made of an insulating material, which is formed at least overlaid on the first filling layer.

The second underlying insulation layer is formed by the following steps:

(i) forming a second filling layer made of an insulating material, which at least fills a gap between adjacent electronic parts; and (j) forming a second insulation layer made of an insulating material, which is formed at least overlaid on the second filling layer and defines a flat surface or a smoothly curved surface between the electrodes of adjacent electronic parts.

In the above step (d), the first filling layer and the first insulation layer are formed from different materials and the second filling layer and the second insulation layer are formed from different materials.

The first filling layer and the second filling layer are formed using an electrically insulating resin having a viscosity of 40-220 pa·s, the first insulation layer and the second insulation layer are formed using an electrically insulating resin having a viscosity of 10-120 pa·s, and the first surface insulation layer and the second surface insulation layer are formed using an electrically insulating resin having a viscosity of 1-30 pa·s, and the resin is hardened by curing.

In the above step (c), as the electronic parts, sensor chips of the same type and having equal dimensions, in each of which an image pickup element having an image pickup surface corresponding to the first surface is formed, are fixed to the parts mount of the wiring substrate.

The above step (c) of arraying and fixing plural semiconductor chips as the electronic parts onto the parts mount of the wiring substrate via the bonding material comprises the steps of:

(k) floating plural semiconductor chips with the first surface down in a liquid contained in a basin and vibrating the liquid, thereby letting adjacent semiconductor chips get in contact with each other and align lengthwise and crosswise on the surface of the liquid;

(l) transforming the liquid to a hardening body by curing;

(m) drawing or spraying a boding material onto the second surface of the semiconductor chips;

(n) positioning and putting the wiring substrate with the first surface down on the plural semiconductor chips, pressing the wiring substrate against the hardening body to bond the semiconductor chips to the wiring substrate by the bonding material, and curing the bonding material to fix the semiconductor chips to the wiring substrate; and (o) removing the wiring substrate to which the semiconductor chips were fixed from the basin.

An agar solution is used as the liquid.

The above step (l) comprises leaving the liquid as is for a predetermined period of time to allow the liquid to harden naturally.

The above step (o) comprises melting the hardening body with hot water of a certain temperature to liquefy and, then, removing the wiring substrate.

(2) A semiconductor device comprises:

a wiring substrate having a first surface and a second surface opposite to the first surface; a parts mount defined on the first surface for fixing electronic parts; plural connecting pads arranged in place outside the parts mount; and external electrode terminals on the first surface and/or the second surface; and plural electronic parts having a first surface and a second surface opposite to the first surface, the first surface having plural electrodes on the rim and the second surface being a fixing surface, in which the electronic parts are stacked in order via a bonding material on the first surface of the wiring substrate, in which the second surface of a lowest first electronic part among the plural electronic parts which are stacked is fixed to the parts mount of the wiring substrate via the bonding material, in which a second electronic part which is fixed on top of the electronic part via the bonding material, among the plural electronic parts which are stacked, is electrically independently fixed onto the underlying electronic part via the bonding material, in which a third underlying insulation layer made of an insulating material is formed in a region extending from the electrodes of the lowest first electronic part to the connecting pads of the wiring substrate and configured to expose the connecting pads and the electrodes, in which a fourth underlying insulation layer made of an insulating material is formed on the rim, the first surface, and the second surface of a second electronic part which is stacked and fixed onto another electronic part and configured to expose the electrodes, in which a third metal layer is formed overlaid on the connecting pads of the wiring substrate, in which the third metal layer is formed overlaid on the third underlying insulation layer provided on the rim of the first electronic part and on the fourth underlying insulation layer on the rim of the second electronic part and the third metal layer protrudes out of the third or fourth underlying insulation layer in predetermined positions and extends to connect to the appropriate electrodes, in which the third metal layer is covered with a third surface insulation layer made of an insulating material.

All the above electronic parts are semiconductor chips, in which at least one semiconductor chip is a sensor chip in which an image pickup element is formed, at least one semiconductor chip is a logic chip in which a logic circuit is formed, and at least one semiconductor chip is a memory chip in which a memory is formed, and the top semiconductor chip among the plural semiconductor chips which are stacked is the sensor chip.

(3) In the above first aspect (1), the above step (c) of arraying and fixing plural semiconductor chips as the electronic parts onto the parts mount of the wiring substrate via the bonding material comprises the steps of:

(p) drawing or spraying a reactive curing resin liquid on the top surface of the wiring substrate placed with the first surface facing up to form a layer with a predetermined thickness;

(q) floating the plural semiconductor chips with the second surface down in the resin liquid and vibrating the resin liquid, thereby letting adjacent semiconductor chips get in contact with each other and align lengthwise and crosswise on the surface of the resin liquid; and (r) hardening the resin liquid by reactive curing to make the bonding material and fixing the semiconductor chips to the wiring substrate by the bonding material.

The above step (p) comprises drawing or spraying an ultraviolet curing resin liquid which is used as the reactive curing resin liquid on the top surface of the wiring substrate to form a layer with a predetermined thickness. The above step (r) comprises hardening the ultraviolet curing resin liquid by exposure of the ultraviolet curing resin liquid to ultraviolet irradiation to make the boding material.

(4) In the above third aspect (3), the above step (p) comprises drawing or spraying a thermoplastic resin liquid which is used as the reactive curing resin liquid, after being liquefied by heating, on the top surface of the wiring substrate to form a layer with a predetermined thickness. The above step (r) comprises hardening the resin liquid by curing at normal temperature to make the bonding material.

(5) In the above first aspect (1), the electronic parts are semiconductor chips and passive parts having plural electrodes exposed on the first surface.

In manufacture of such a semiconductor device, the above step (c) in the method of manufacturing the semiconductor device of the first aspect (1) comprises fixing the semiconductor chips and the passive parts having plural electrodes exposed on the first surface, as the electronic parts, onto the parts mount.

Advantageous effects provided by typical aspects of the invention disclosed in the present application are outlined below.

According to the above first aspect (1), (a) electrical connections between the electrodes of the semiconductor chips and the connecting pads of the wiring substrate are provided by initially forming the first underlying insulation layer between the electrodes and the connecting pads, which defines a smooth sloping surface, then, forming the first metal layer (metal paste wiring) on this smooth surface, and connecting the electrodes and the connecting pads with the first metal layer. Thus, the connections between the electrodes and the connecting pads are provided reliably and at a high precision.

(b) Because the first metal layer is in solid contact with the first underlying insulation layer, this structure is free from deformation such as bending which may occur with wires. This structure can prevent a short circuit trouble due to that a metal layer is deformed to contact a neighboring metal layer and enhances the reliability of the semiconductor device. Thereby, even microscopic wiring can be performed.

(c) The first underlying insulation layer and the first metal layer can be formed easily and with a high precision by an ink jet, a dispenser, and a printing process which are commonly used in the manufacturing technology of semiconductor devices. This improves the manufacturing efficiency and can achieve a lower cost of semiconductor devices. The nozzle movement of the ink jet and the dispenser is controlled freely in XY directions in a plane and a portion to be printed by the printing process can be selected freely in XY directions in a plane. Thus, it is advantageous that a wiring length and a wiring shape can be selected freely, unlike wire connections. For example, not only a linear wiring, a zigzag wiring is also possible with metal layers. Thereby, the degree of freedom in selecting the positions in which semiconductor chips are fixed and in wiring design increases.

(d) Electrical connections between adjacent electrodes of adjacent semiconductor chips are provided by initially forming the second underlying insulation layer between the electrodes of one semiconductor chip and the electrodes of the other semiconductor, which fills the gap between the adjacent semiconductor chips and defines a gently curved surface, then, forming the second metal layer (metal paste wiring) on this gently curved surface, and connecting the respective electrodes of both chips with the second metal layer. Accordingly, the connections between the respective electrodes is provided reliably and with a high precision.

(e) Because the second metal layer is in solid contact with the second underlying insulation layer, this structure is free from deformation such as bending which may occur with wires. This structure can prevent a short circuit trouble due to that a metal layer is deformed to contact a neighboring metal layer and enhances the reliability of the semiconductor device. Thereby, even microscopic wiring can be performed.

(f) The second underlying insulation layer and the second metal layer can be formed easily and with a high precision by an ink jet, a dispenser, and a printing process which are commonly used in the manufacturing technology of semiconductor devices. This improves the manufacturing efficiency and can achieve a lower cost of semiconductor devices. The nozzle movement of the ink jet and the dispenser is controlled freely in XY directions in a plane and a portion to be printed by the printing process can be selected freely in XY directions in a plane. Thus, it is advantageous that a wiring length and a wiring shape can be selected freely, unlike wire connections. For example, not only a linear wiring, a zigzag wiring is also possible with metal layers. Thereby, the degree of freedom in selecting the positions in which the semiconductor chips 3 are fixed and in wiring design increases.

(g) Electrical connections between the electrodes of the semiconductor chips and the connecting pads of the wiring substrate 2 and electrical connections between the electrodes of adjacent semiconductor chips are provided by the metal layers. There is no need to extend wires in a loop for wire connections and wiring can be shortened as compared with wire connections. Consequently, a smaller and thinner semiconductor device can be achieved. If the semiconductor device becomes smaller and thinner, a lighter semiconductor device can be achieved.

(h) Since electrical connection distance can be shortened as noted above in (g), the mounting area (including electrical connections) per chip becomes smaller. Consequently, a smaller semiconductor device can be achieved. From another perspective, as the mounting area per chip is reduced, the wiring substrate will have more unoccupied space. Therefore, a new electronic part can be installed in such space and more integration in the semiconductor device can be achieved.

(i) Since electrical connection distance, or wiring length is shortened as noted above in (g), decreasing electric signal delay and reducing noise can be achieved.

(j) The first underlying insulation layer is formed of the first filling layer made of an insulating material, having a sloping plane which at least fills a gap on the side of the semiconductor chips and extends from the first surface of the wiring substrate to the first surface of the semiconductor chips, and a first insulation layer made of an insulating material, which is formed at least overlaid on the first filling layer. The second underlying insulation layer is formed of a second filling layer made of an insulating material, which at least fills a gap between adjacent semiconductor chips, and a second insulation layer made of an insulating material, which is formed at least overlaid on the second filling layer and defines a flat surface or a smoothly curved surface between the electrodes of adjacent semiconductor chips. In consequence, the first and second underlying insulation layers provide smooth surfaces and the metal layers formed overlaid on the smooth surfaces provide more reliable connections between the electrodes of the semiconductor chips 3 and the electrodes of the semiconductor chips 3 and the connecting pads 4 of the wiring substrate 2.

(k) The first filling layer and the first insulation layer are formed from different materials and the second filling layer and the second insulation layer are formed from different materials. The first and second filing layers are formed using an electrically insulating resin having a viscosity of 40-220 pa·s. The first and second insulation layers 17, 27 are formed using an electrically insulating resin having a viscosity of 10-120 pa·s. The resin having a high viscosity of 40-220 pa·s is able to exactly fill the gap and thus makes it possible to form the first and second filling layers as the bases of the first and second underlying insulation layers. Since the resin that is formed on top of the first and second filling layers by drawing or spraying and curing has a low viscosity of 10-120 pa·s, it will spread smoothly in a given area. Thus, it makes it possible to form the first and second insulation layers defining smooth surfaces.

(l) The plural semiconductor chips are of the same type and has equal dimensions. If the semiconductor chips are sensor chips, in each of which an image pickup element whose first surface serves as the image pickup surface is formed, the semiconductor device becomes an image pickup device. Since this image pickup device consists of a cluster of multiple sensor chips, its image pickup surface becomes as large as a total sum of the area of the image pickup surface of each sensor chip. An image pickup device with such a large image pickup surface can be constructed. If, for example, ten square sensor chips with edges of 30 mm are arrayed lengthwise and crosswise respectively, an image pickup device having a square image pickup surface having edges of at least 300 mm can be manufactured.

In the device structure examined prior to the present invention, as shown in FIG. 42 and FIG. 43, a wire length (wire path length) of about 1.0 mm is required and the loss corresponding to the wire length significantly contributes to a degradation in the characteristics of the image pickup device. Consequently, it is impossible to connect multiple sensor chips without clearance between chips and operate them as if a single large sensor chip was used.

In contrast, in the case of the present invention, sensor chips are arranged closely adjacent to each other and the underlying insulation layer (second underlying insulation layer) is formed to fill the gap between the sensor chips and compensate uneven heights of the chips. The electrodes formed on each sensor chip are connected by metal layers (second metal layer; metal paste wiring) and, therefore, connections can be made with a very short wiring length of, for example, several ten μm. There are no exposed p-n junctions on the rim of each sensor chip and no electrical trouble occurs even if adjacent sensor chips contact with each other. Thus, by placing adjacent sensor chips so close to each other that they might almost contact each other, the length of wiring with the metal layers can be shortened. Owing to short metal layers, the surface insulation layers (second surface insulation layers) that protect the metal layers occupy a smaller area. This reduces image discontinuity in an sensor output image and avoids an adverse effect on image recognition. As the wiring length can be made shorter, a higher operating speed of the image pickup device is attainable.

(m) In the image pickup device with wire connections, light is reflected by the surfaces of wires and this reflected light is sensed as a noise component in an image. However, in the present invention, the metal layers are covered with the insulation layers. Therefore, there is no light reflection from the metal layer surface and no resulting noise in an image is introduced. Crisp images can be obtained and it is achievable for the image pickup device to produce a higher image quality.

(n) The work of arraying and fixing plural semiconductor chips onto the parts mount of the wiring substrate via the bonding material is performed by the following steps:

floating plural semiconductor chips with the first surface down in a liquid (agar solution) contained in a basin and vibrating the liquid, thereby letting adjacent semiconductor chips get in contact with each other and align lengthwise and crosswise on the surface of the liquid;

transforming the agar solution to a hardening body by natural hardening, i.e., leaving it as is for a predetermined period of time;

drawing or spraying a boding material onto the second surface of the semiconductor chips;

positioning and putting the wiring substrate with the first surface down on the plural semiconductor chips, pressing the wiring substrate against the hardening body to bond the semiconductor chips to the wiring substrate by the bonding material, and curing the bonding material to fix the semiconductor chips to the wiring substrate; and melting the hardening body with hot water of a certain temperature to liquefy to the agar solution and then removing the wiring substrate to which the semiconductor chips were fixed from the basin.

Consequently, the work of arraying the semiconductor chips lengthwise and crosswise in a matrix and fixing them to the wiring substrate becomes easier. The semiconductor chips (parts) floated in the solution move so as to get in close contact with each other by the surface tension of the solution and align in an array by a phenomenon (self alignment) in which they move to align naturally so that the surface area in a planar direction becomes minimum. In this process, the alignment behavior of the parts can be facilitated and the time required for the alignment can be shortened by performing the following: vibrating the liquid, directing an air blow against the parts, altering the surface state of the liquid by placing another object in the vicinity of the parts, or taking other measures.

According to the above second aspect (2), (a) electrical connections between the connecting pads of the wiring substrate and the electrodes of the semiconductor chips are provided by the third metal layer which couples the electrodes and the connecting pads, respectively. This third metal layer 51 is formed overlaid on the connecting pads. Also, the third metal layer is formed overlaid on the third underlying insulation layer provided on the rim of the lowest semiconductor chip (first semiconductor chip) and connected to the electrodes of the first semiconductor chip. Further, the third metal layer extends upward across the layers and extends overlaid on the fourth underlying insulation layer formed on the top and under surfaces on the edge and on the rim of the second semiconductor chip and is also connected to the electrodes of the second semiconductor chip. The underlying insulation layers define smooth surfaces and, therefore, the metal layer formed on the underlying insulation layers extends continuously. The connections between the connecting pads and the electrodes are provided reliably and with a high precision.

(b) Because the third metal layer is in solid contact with the third and fourth underlying insulation layers, this structure is free from deformation such as bending which may occur with wires. This structure can prevent a short circuit trouble due to that a metal layer is deformed to contact a neighboring metal layer and enhances the reliability of the semiconductor device 1. Thereby, even microscopic wiring can be performed.

(c) The third and fourth underlying insulation layers and the third metal layer can be formed easily and with a high precision by an ink jet and a dispenser which are commonly used in the manufacturing technology of semiconductor devices. This improves the manufacturing efficiency and can achieve a lower cost of semiconductor devices. The nozzle movement of the ink jet and the dispenser is controlled freely in XY directions in a plane. Thus, it is advantageous that a wiring length and a wiring shape can be selected freely, unlike wire connections. For example, not only a linear wiring, a zigzag wiring is also possible with metal layers. Thereby, the degree of freedom in selecting the positions in which semiconductor chips are fixed and in wiring design increases.

(d) The connecting pads of the wiring substrate and the electrodes of the semiconductor chips are connected by the metal layers formed overlaid on the underlying insulation layers. This can make the device smaller and thinner as compared with a device structure in which the connections between the electrodes of semiconductor chips (electronic parts) and the connecting pads of the wiring substrate are made by wire bonding. In wire bonding, wires are looped to connect the electrodes of the semiconductor chips (electronic parts) and the connecting pads of the wiring substrate, which requires longer wiring at higher than wiring with the metal layers. In the present invention, since the semiconductor device can be made smaller and thinner, a lighter semiconductor device can be achieved. (e) As noted above in (d), electrical connection distance can be shortened, that is, wiring length becomes shorter, with the result that decreasing electric signal delay and reducing noise can be achieved. Particularly, for the semiconductor device in which a sensor chip, a logic chip, and a memory chip are stacked, the effects of decreasing electric signal delay and reducing noise will be significant.

According to the above third aspect (3), the work of arraying and fixing plural semiconductor chips onto the parts mount of the wiring substrate via the bonding material is performed by the following steps:

drawing or spraying a reactive curing resin liquid (ultraviolet curing resin liquid) on the top surface of the wiring substrate placed with the first surface facing up to form a layer with a predetermined thickness;

floating plural semiconductor chips with the second surface down in the resin liquid and vibrating the resin liquid, thereby letting adjacent semiconductor chips get in contact with each other and align lengthwise and crosswise on the surface of the liquid; and hardening the resin liquid by reactive curing, i.e., exposure of the resin liquid to ultraviolet irradiation to make a boding material and fixing the semiconductor chips to the wiring substrate by the bonding material.

Consequently, the work of arraying the semiconductor chips lengthwise and crosswise in a matrix and fixing them to the wiring substrate becomes easier. As is the case for the first aspect (1), to facilitate the alignment of plural semiconductor chips (parts) floated in the solution, the following measures may be taken: vibrating the liquid, directing an air blow against the parts, altering the surface state of the liquid by placing another object in the vicinity of the parts, or taking other measures.

According to the above fourth aspect (4), the work of arraying and fixing plural semiconductor chips onto the parts mount of the wiring substrate via the bonding material is performed by the following steps:

drawing or spraying a reactive curing resin liquid (thermoplastic resin liquid), after being liquefied by heating, on the top surface of the wiring substrate placed with the first surface facing up to form a layer with a predetermined thickness;

floating plural semiconductor chips with the second surface down in the resin liquid and vibrating the resin liquid, thereby letting adjacent semiconductor chips get in contact with each other and align lengthwise and crosswise on the surface of the liquid; and hardening the resin liquid by curing at normal temperature to make a bonding material and fixing the semiconductor chips to the wiring substrate by the bonding material.

Consequently, the work of arraying the semiconductor chips lengthwise and crosswise in a matrix and fixing them to the wiring substrate becomes easier. As is the case for the first aspect (1), to facilitate the alignment of plural semiconductor chips (parts) floated in the solution, the following measures may be taken: vibrating the liquid, directing an air blow against the parts, altering the surface state of the liquid by placing another object in the vicinity of the parts, or taking other measures.

According to the above fifth aspect (5), in addition to the advantageous effects of the invention in the first aspect (1), passive parts other than semiconductor chips can be used and, therefore, enhancements of semiconductor device functions can be achieved.

BRIEF DESCRIPTION OF THE DRAWINGS

FIGS. 22A and 22B are schematic sectional views showing steps involved in a method for arraying and fixing plural semiconductor chips onto a wiring substrate according to a second embodiment of the present invention;

FIGS. 23A and 23B are schematic sectional views showing steps involved in the method for arraying and fixing plural semiconductor chips onto a wiring substrate in accordance with the second embodiment of the present invention;

DETAILED DESCRIPTION OF THE PREFERRED EMBODIMENTS

Embodiments of the present invention will now be described in detail with reference to the drawings. In all drawings for explaining the embodiments of the invention, constituent elements having the same functions are assigned the same reference numbers and their repeating explanation is omitted.

First Embodiment

FIGS. 1 through 21 are diagrams relating to a semiconductor device and its manufacturing method in accordance with a first embodiment of the present invention. FIGS. 1 through 6 are diagrams relating to the semiconductor device and FIGS. 7 through 21 are diagrams relating to the semiconductor device manufacturing method.

Figure 1:
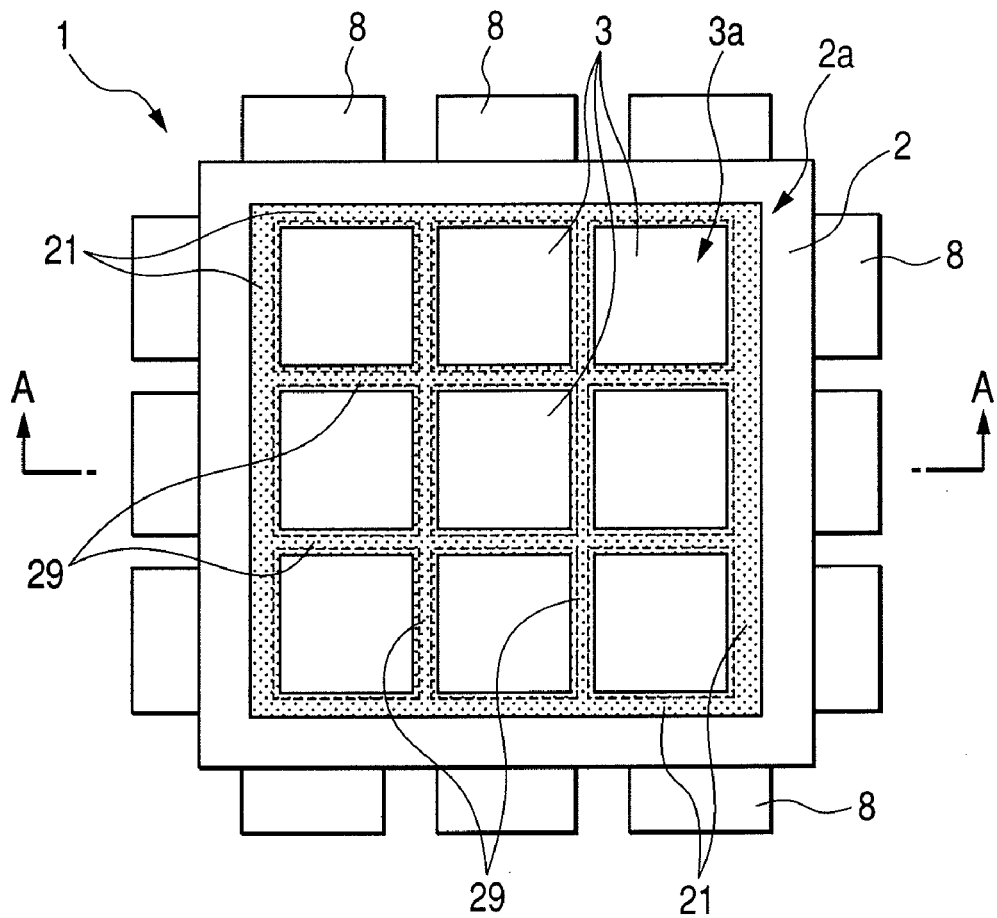
FIG. 1 is a schematic plan view of a semiconductor device in accordance with a first embodiment of the present invention.
Figure 2:
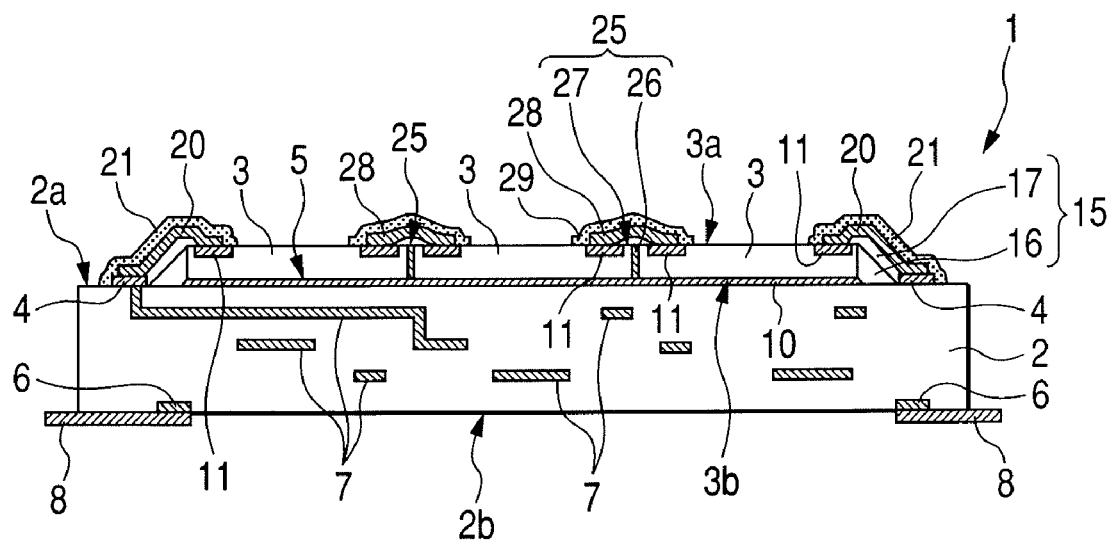
FIG. 2 is a schematic sectional view taken along an A-A line in FIG. 1.
Figure 3:
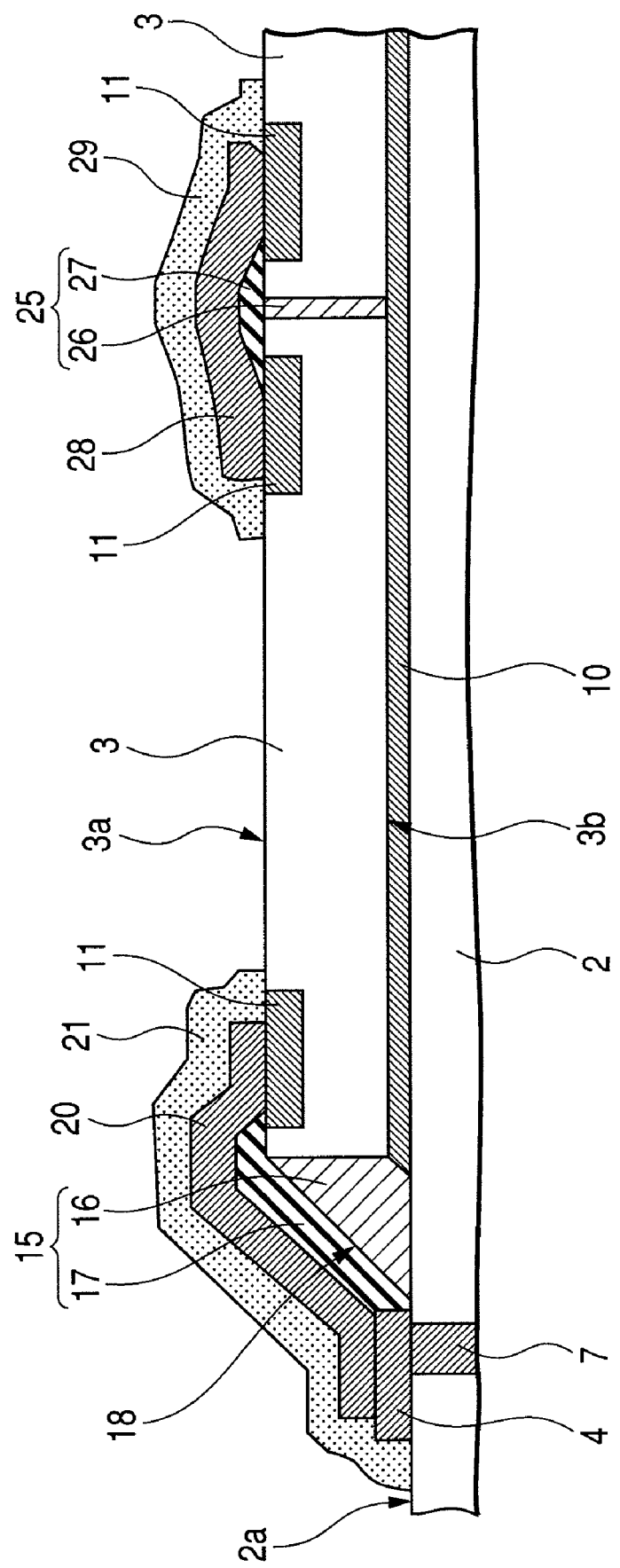
FIG. 3 is an enlarged sectional view of a part of FIG. 2.
Figure 4:
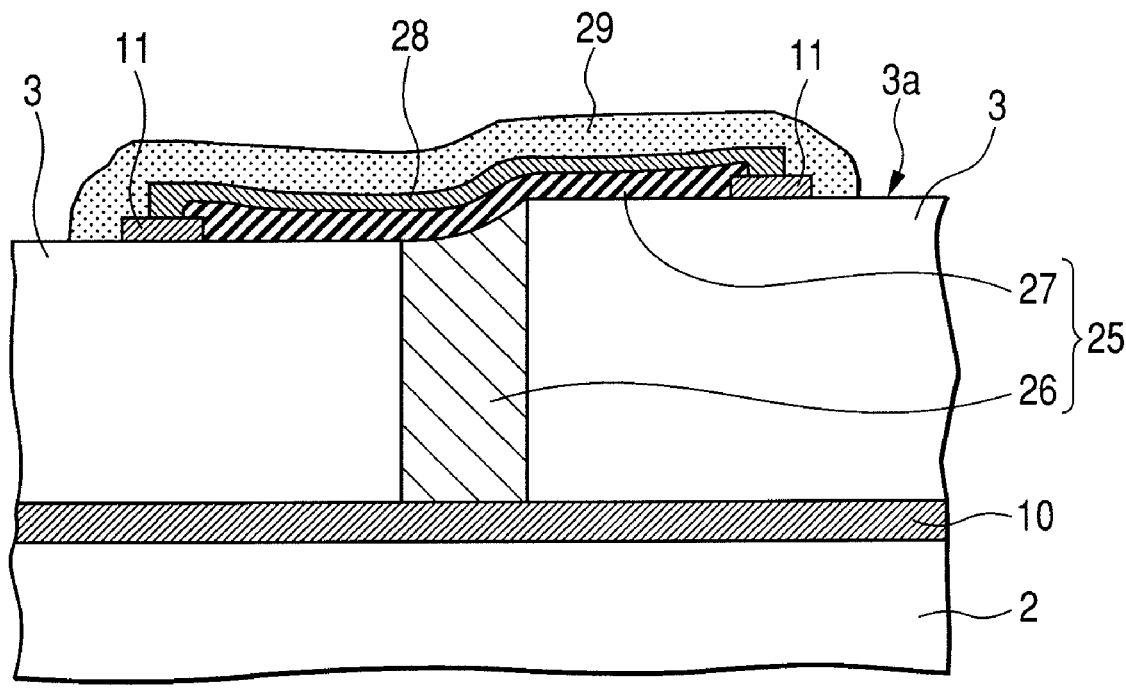
FIG. 4 is an enlarged sectional view of a part of FIG. 3.
Figure 5:
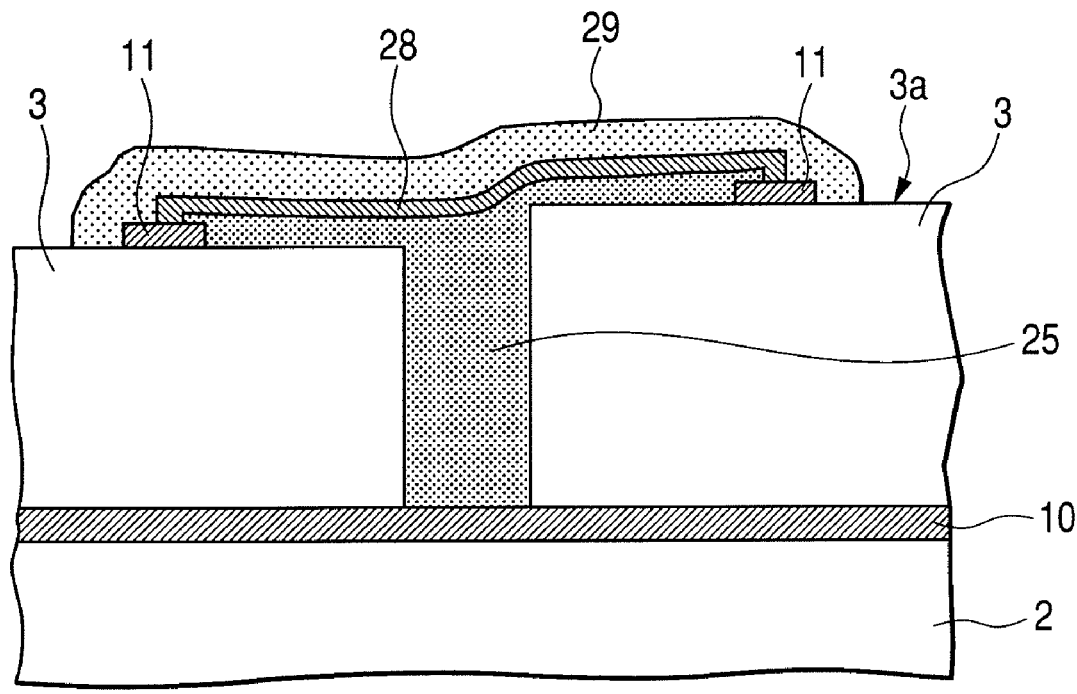
FIG. 5 is an enlarged sectional view showing another example of a structure of the part corresponding to FIG. 3.

In the first embodiment, the semiconductor device in which semiconductor chips as electronic parts are arrayed lengthwise and crosswise on a wiring substrate, as shown in FIG. 1 and FIG. 2, is described. A semiconductor chip is a sensor chip that receives light and converts it into electrical signals. Accordingly, the semiconductor device makes an image pickup device. FIG. 1 is a schematic plan view of the semiconductor device. FIG. 2 is a schematic sectional view taken along an A-A line in FIG. 1. FIG. 3 is an enlarged sectional view of a part of FIG. 2. FIG. 4 is an enlarged sectional view of a part of FIG. 3. FIG. 5 is an enlarged sectional view showing another example of a structure of the part corresponding to FIG. 3.

The semiconductor device 1 includes a wiring substrate 2 and plural semiconductor chips 3, as shown in FIG. 1 and FIG. 2. The wiring substrate 2 consists of a square board having a first surface 2a and a second surface 2b opposite to the first surface 2a. Connecting pads 4 are disposed on the first surface 2a along the edges of the wiring substrate 2. Although not restrictive, these connecting pads 4 are arranged to form a square frame. A parts mount 5 is a square portion (square region) inside the frame in which the connecting pads are arranged. Onto this parts mount 5, the semiconductor chips 3 are arrayed lengthwise and crosswise and fixed.

Underlying electrodes 6 are disposed on the second surface 2b along the edges of the wiring substrate 2. Inside the wiring substrate 2, wiring sections 7 of conductive layers are formed as shown in FIG. 2. These wiring sections 7 are interconnected in certain places, and connected to predetermined connecting pads 4 and underlying electrodes 6 to form a predetermined wiring pattern. Leads 8 made of a metal plate are connected to the underlying electrodes 6 via a bonding material not shown. The leads 8 have a broad shape and protrude to a predetermined distance out of each edge of the wiring substrate 2, as shown in FIG. 1. The leads 8 form external electrode terminals of the semiconductor device 1.

Although the external electrode terminals are formed by metal plate leads in the first embodiment, these terminals may be provided in other forms. The external electrode terminals may be formed by, for example, ball electrodes connecting to the underlying electrodes 6. The external electrode terminals are provided on the second surface 2b of the wiring substrate 2 in the first embodiment, the external electrode terminals may be provided on the first surface 2a or on both the first surface 2a and the second surface 2b. This may be determined depending on an electronic equipment in which the semiconductor device 1 is assembled.

The wiring substrate 2 is made of a ceramic material such as silicon carbide, silicon nitride, or aluminum nitride having a thermal expansion coefficient approximating to the thermal expansion coefficient of silicon from which the semiconductor chips 3 are made, or made of silicon or the like, so that a metal layer which will be described later is not broken by thermal stress.

The plural semiconductor chips 3 are fixed to the parts mount 5 on the first surface 2a of the wiring substrate 2 with a bonding material 10. A semiconductor chip 3 consists of a square silicon semiconductor having a first surface 3a and a second surface 3b opposite to the first surface 3a. The semiconductor chip 3 is a chip sensor and the first surface 3a of the semiconductor chip 3 is an image pickup surface that receives light. Plural electrodes 11 are arranged in line inlaying along the outer edges of the first surface 3a. Although not restrictive, the semiconductor chip 3 is about 400 μm thick and has a square shape with edges of 30 mm. Although not shown, the first surface 3a of the semiconductor chip 3 is covered with an insulation layer and the electrodes protrude to be bared from the insulation layer in places. On the perimeter of the semiconductor chip 3, there are no exposed p-n junctions so that no trouble occurs even if adjacent semiconductor chips 3 contact with each other.

For explanatory convenience, three sensors arrayed lengthwise and three sensors arrayed crosswise, a total of nine sensors are shown in the figure. However, in a practical structure of the first embodiment, for example, 10 semiconductor chips 3 are arrayed lengthwise and 10 chips arrayed crosswise; i.e., a total of 100 chips are arrayed in a matrix. Accordingly, the semiconductor device 1 has a square image pickup surface with 300 mm edges to make an image pickup device that is used in an X-ray CT scanner.

Figure 6:
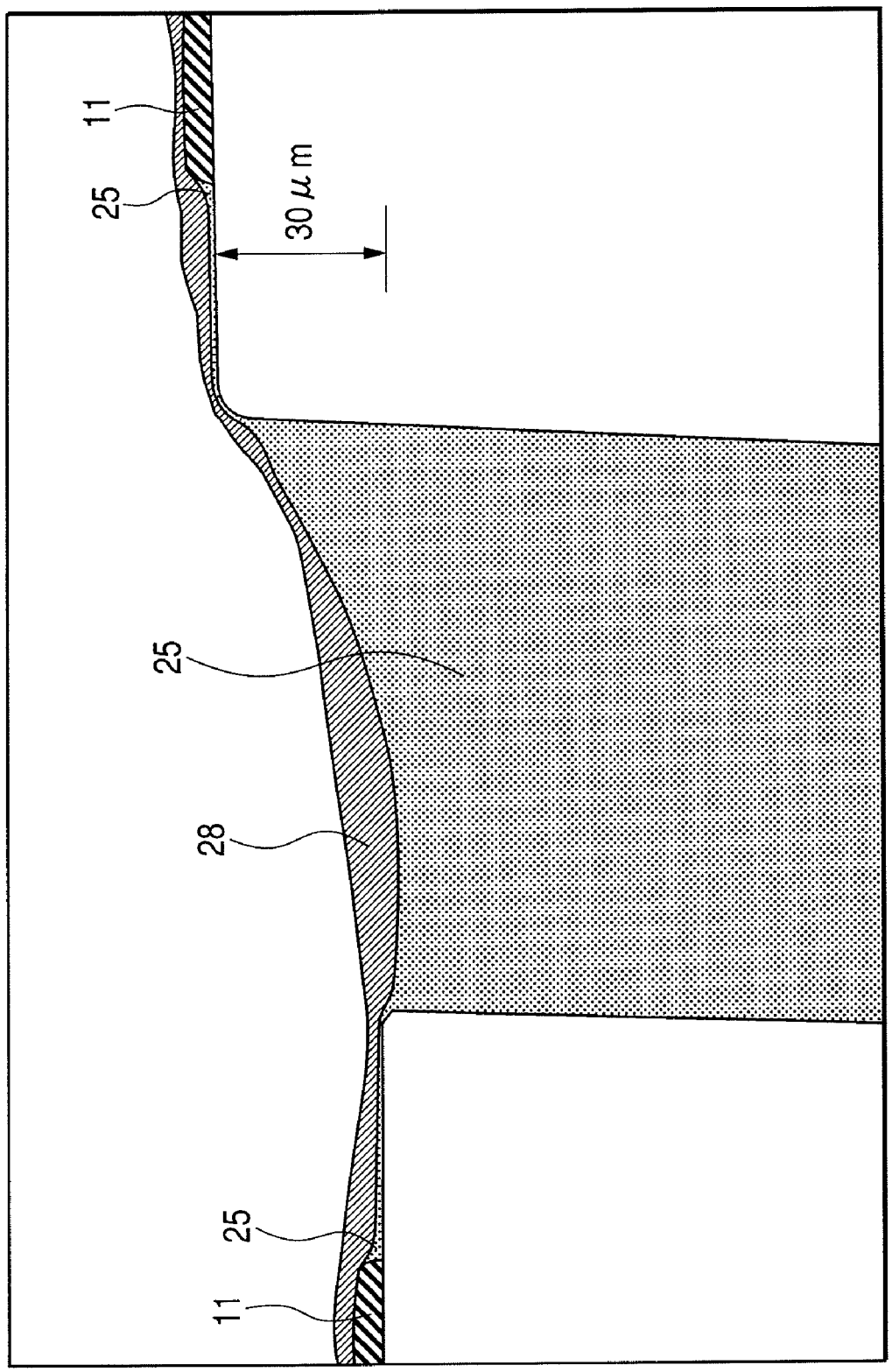
FIG. 6 shows a cross section obtained by tracing an SEM photograph of an underlying insulation layer formed of a second filling layer and a second insulation layer in the semiconductor device of the first embodiment.

There is a gap between adjacent semiconductor chips 3 as shown in FIG. 2; however, this gap is on the order of 100 μm, for example (see FIG. 6).

Referring to FIG. 3 showing a enlarged view of a part of FIG. 2, then, electrical connections between the connecting pads of the wiring substrate 2 and the electrodes 11 and electrical connections between the electrodes 11 of the semiconductor chips 3 are described.

Figure 16:
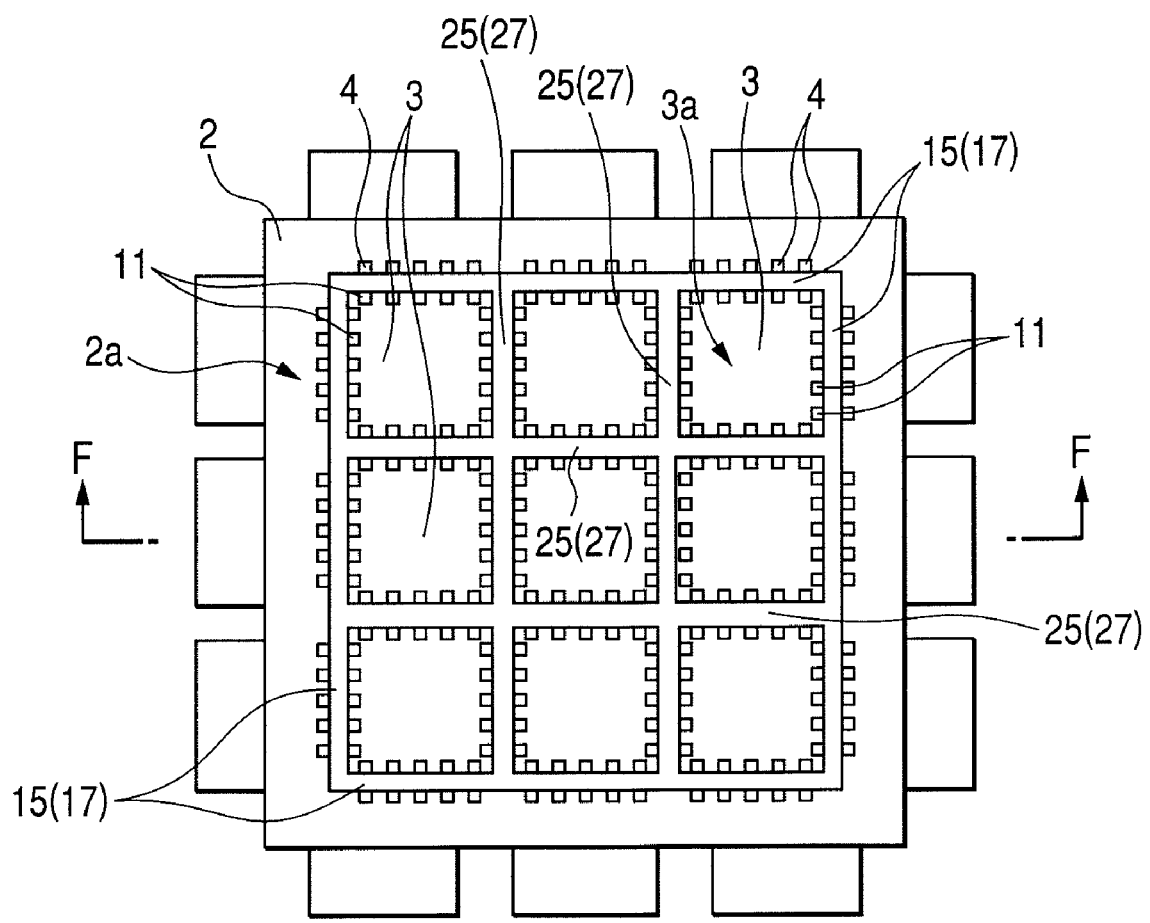
FIG. 16 is a schematic plan view showing a state where upper insulation layers of underlying insulation layers were formed between semiconductor chips and along the outer edges of the chips in the method of manufacturing the semiconductor device of the first embodiment.
Figure 17:
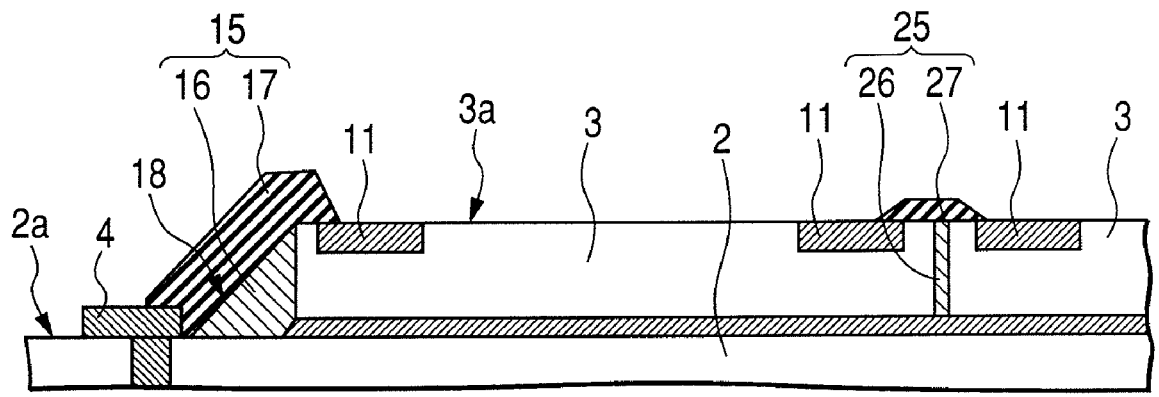
FIG. 17 is a schematic enlarged sectional view of a part taken along an F-F line in FIG. 16.

As shown in FIG. 3, between a connecting pad 4 of the wiring substrate 2 and an electrode 11 of a semiconductor chip 3 which are electrically connected, a first underlying insulation layer 15 having electrical insulating properties is provided across the surfaces of the wiring substrate 2 and the semiconductor chip (see FIG. 16 and FIG. 17). For explanation of this portion, a connection between an electrode 11 of a leftmost semiconductor chip 3 and a connecting pad of the wiring substrate 2 is taken as an example. Although may be one layer, the first underlying insulation layer 15 consists of two layers in the first embodiment (see FIG. 16 and FIG. 17), because the first surface 3a of the semiconductor chip 3 is approximately 400 μm higher than the first surface 2a of the wiring substrate 2.

As shown in FIG. 3, the first underlying insulation layer 15 consists of a first filling layer 16 and a first insulation layer 17 formed, overlaid on the first filling layer 16. The first filling layer 16 is provided to fill a side level difference from the inner end of the connecting pad 4 of the wiring substrate to the top edge of the semiconductor chip 3 (see FIG. 15). Therefore, the first filling layer 16 at least fills the side of the semiconductor chip 3 and has a sloping plane 18 extending from the first surface 2a of the wiring substrate 2 to the first surface 3a of the semiconductor chip 3. This sloping plane 18 is formed to have a smooth sloping surface (smooth surface) free from unevenness spots.

The first insulation layer 17 is formed, overlaid on the smooth sloping plane 18 (see FIG. 17). Therefore, the first insulation layer 17 also has a smooth sloping surface. The angle of gradient of the sloping plane 18 is, for example, about 80 degrees or less. This angle of gradient is important to form the first insulation layer 17a to a predetermined thickness reproducibly later. The first filling layer 16 and the first insulation layer 17 are formed by drawing or spraying electrically insulating paste by, for example, an ink jet, a dispenser, or a printing process and curing the paste.

As the electrically insulating paste, a reactive curing resin is used. In the first embodiment, an ultraviolet curing resin is used as the reactive curing resin and curing is performed by exposure to ultraviolet irradiation. The first filling layer 16 is formed using a resin having a viscosity of 40-220 pa·s. The first insulation layer 17 is formed using a resin having a viscosity of 10-120 pa·s. The resin having a high viscosity of 40-220 pa·s is able to exactly fill the gap between the first surface 2a of the wiring substrate 2 and the rim of the semiconductor chip 3 and thus makes it possible to form the first filling layer 16 as the base of the first underlying insulation layer 15. Since the resin that is formed on top of the first filling layer 16 by drawing or spraying and curing has a low viscosity of 10-120 pa·s, it will spread smoothly in a given area. Thus, it makes it possible to form the first insulation layer 17 having the sloping plane with a smooth surface.

Figure 18:
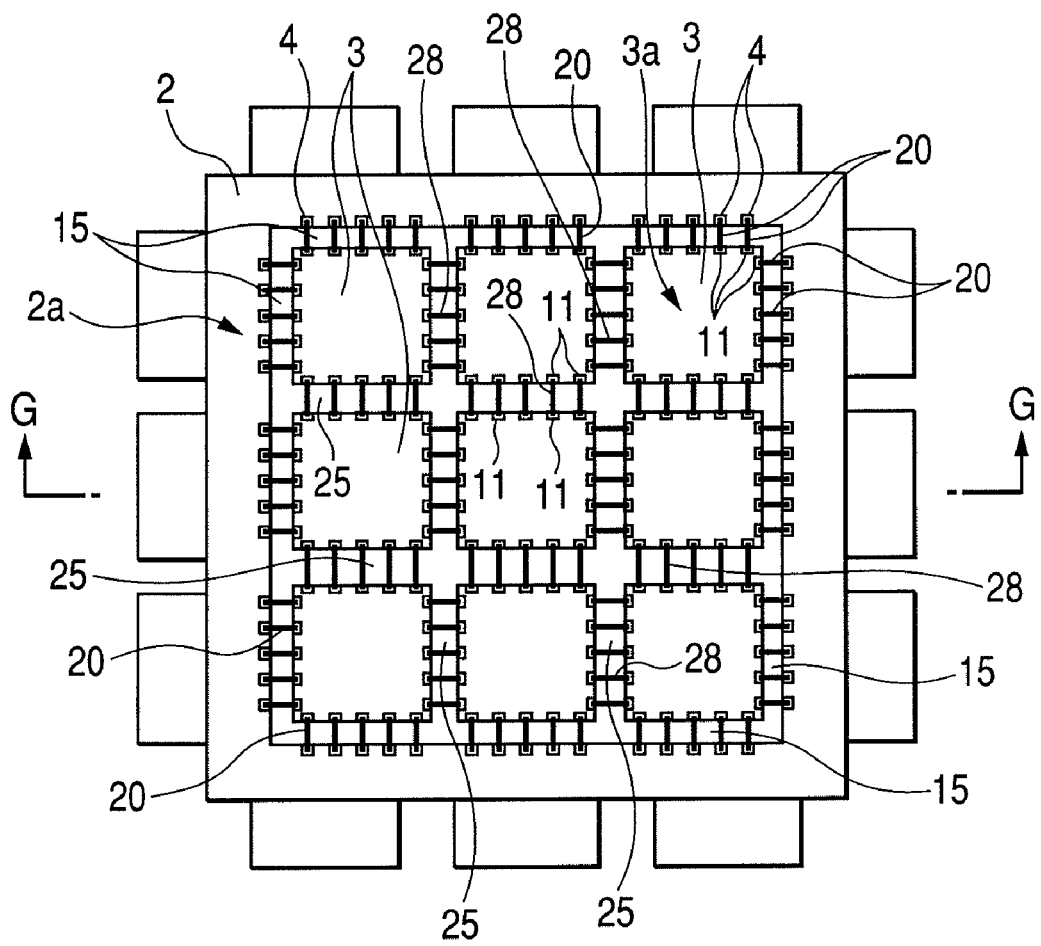
FIG. 18 is a schematic plan view showing a state where metal layers which electrically connect electrode pads between semiconductor chips and metal layers which electrically connect the electrode pads of the wiring substrate and the electrode pads of the chips were formed in the method of manufacturing the semiconductor device of the first embodiment.
Figure 19:
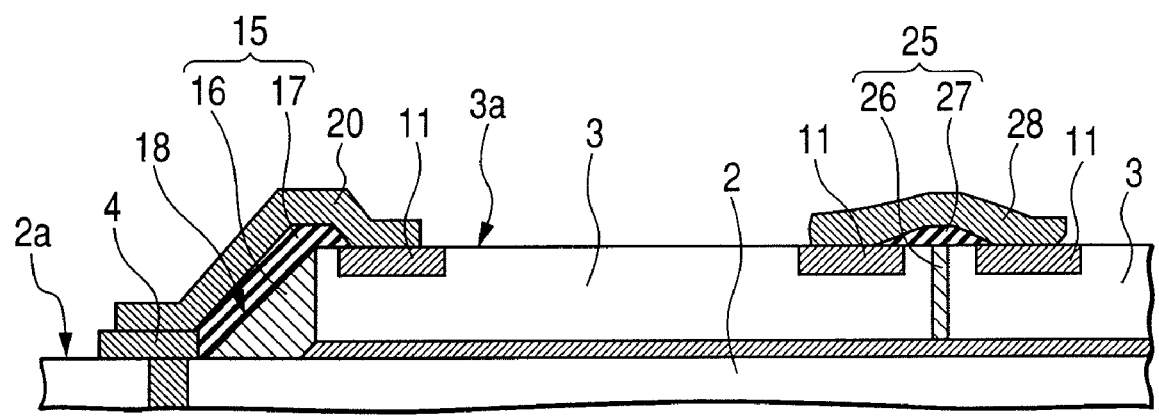
FIG. 19 is a schematic enlarged sectional view of a part taken along a G-G line in FIG. 18.

As shown in FIG. 3, a first metal layer 20 is formed on top of the first insulation layer 17 (see FIG. 18 and FIG. 19). The first metal layer 20 is formed such that its both ends protrude to a predetermined distance from both ends of the first insulation layer 17. In consequence, one protrusion at one end of the first metal layer 20 is overlaid on the connecting pad 4 and the other protrusion at the other end of the first metal layer 20 is overlaid on the electrode 11. This provides an electrical connection between the particular connecting pad 4 and the particular electrode 11. At both ends of the first insulation layer 17, one protrusion end may extend to the outer edge of the connecting pad 4 and the other protrusion end may extend to the inner edge of the electrode 11.

The first metal layer 20 has a width of, approximately, 50 to several hundred μm, and may have a thickness of on the order of several μm to several hundred μm. The first metal layer has a length of on the order of several ten μm to several hundred μm. The first metal layer 20 is formed by drawing or spraying electrically conducting paste (metal paste) by, for example, an ink jet, a dispenser, or a printing process and curing the paste. The first metal layer 20 is formed using electrically conducting paste comprising particles of a noble metal such as Au or Ag, Cu, or an alloy including these metals.

Figure 20:
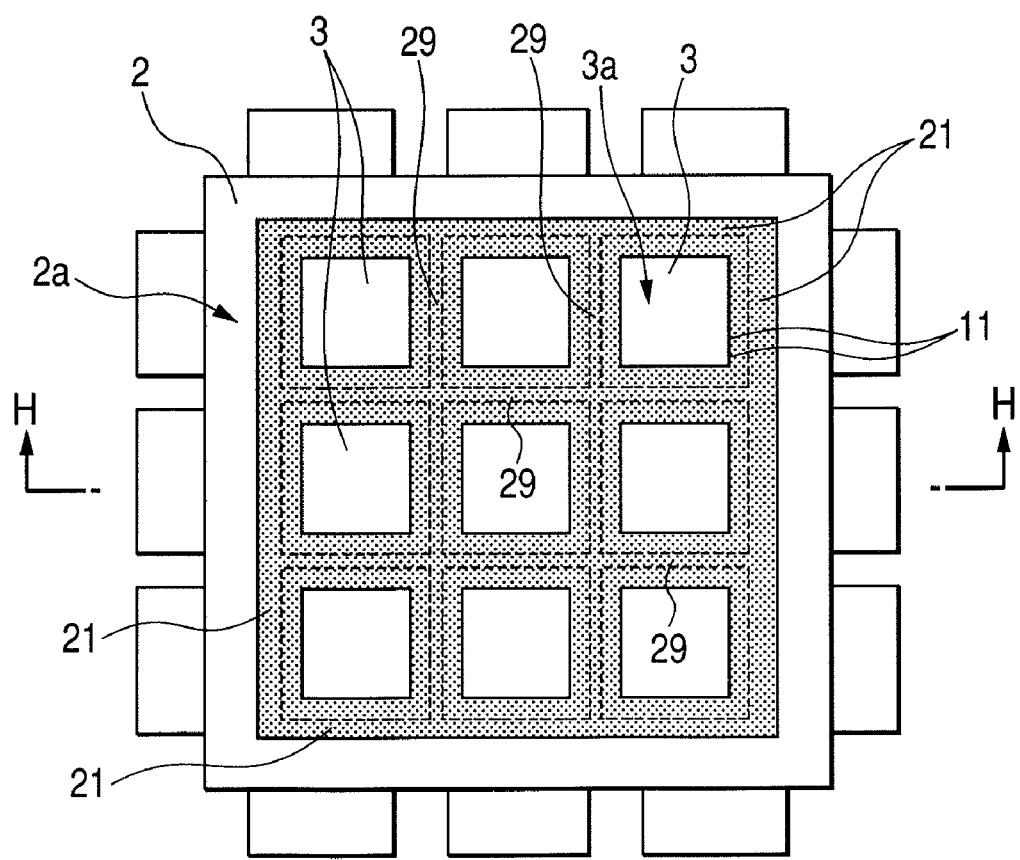
FIG. 20 is a schematic plan view showing a state where surface protective layers which cover the metal layers were formed in the method of manufacturing the semiconductor device of the first embodiment.

As shown in FIG. 3, the first metal layer 20 is protected by covering of a first surface insulation layer 21 consisting of an insulating material (see FIG. 20). This first surface insulation layer 21 is formed using, for example, an ultraviolet curing resin. Specifically, this layer is formed by drawing or spraying an ultraviolet curing resin along the edges of semiconductor chips 3 at the perimeter of the semiconductor chip cluster by, for example, an ink jet, a dispenser, or a printing process and then curing (hardening) the ultraviolet curing resin by exposure to ultraviolet irradiation. The ultraviolet curing resin that is used for forming the first surface insulation layer 21 has a low viscosity of about 1-30 pa·s or less and, hence, it can cover the first metal layer 20 without clearance.

As shown in FIG. 3, a second underlying insulation layer 25 is provided between the electrically connected electrodes 11 between adjacent semiconductor chips 3 connected (see FIG. 16 and FIG. 17). Although may be one layer, the second underlying insulation layer 25 consists of two layers in the first embodiment to fill a gap which is liable to be produced between two semiconductor chips 3 (see FIG. 16 and FIG. 17).

As shown in FIG. 3, the second underlying insulation layer 25 consists of a second filling layer 26 and a second insulation layer 27 formed, overlaid on the second filling layer 26. A second metal layer 28 is formed, overlaid on the top of the second underlying insulation layer 25. FIG. 4 is a schematic enlarged view of the electrical connection portion between the electrodes 11 of the adjacent semiconductor chips 3. FIG. 5 is a view corresponding to FIG. 4, when the second underlying insulation layer 25 is provided as one layer. By using the two layers of the second underlying insulation layer 25, the surface of the second underlying insulation layer 25 that does not depend on the above clearance can be provided. In the case of one layer, the process for forming the second underlying insulation layer 25 is shortened and the manufacturing cost of the semiconductor device 1 can be reduced.

The second filling layer 26, as shown in FIG. 3 and FIG. 4, is primarily provided to fill the gap between the two semiconductor chips 3. As shown in FIG. 4, in a case where the heights of the semiconductor chips 3 are uneven, the second filling layer 26 fills the gap between one semiconductor chip 3 and the other semiconductor chip 3 and defines a gently curved surface (slope) shaped like the letter S, as seen from the cross section between the semiconductor chips. In consequence, the second insulation layer 27 which is formed overlaid on the second filling layer 26 also has a gently curved surface.

In a case where the heights of adjacent semiconductor chips 3 are even, the surface of the second filling layer 26 that fills the gap between one semiconductor chip 3 and the other semiconductor chip 3 can be made flat or substantially flat.

As shown in FIG. 3, a second metal layer 28 is formed on top of the second insulation layer 27 (see FIG. 18 and FIG. 19). The second metal layer 28 is formed such that its both ends protrude to a predetermined distance from both ends of the second insulation layer 27. In consequence, one protrusion at one end of the second metal layer 28 is overlaid on the electrode 11 of one semiconductor chip 3 and the other protrusion at the other end of the second metal layer 28 is overlaid on the electrode 11 of the other semiconductor chip 3. This provides an electrical connection between the particular electrodes 11 of the adjacent semiconductor chips 3. At both ends of the second insulation layer 27, one protrusion end may extend to the outer edge of one electrode 11 and the other protrusion end may extend to the outer edge of the other electrode 11.

As shown in FIG. 3, the second metal layer 28 is protected by covering of a first surface insulation layer 21 consisting of an insulating material (see FIG. 20).

FIG. 6 shows a cross section obtained by tracing a photograph of a SEM observed section of the second underlying insulation layer 25 consisting of one layer. This shows a state in which the second underlying insulation layer 25 was formed by filling the space between adjacent semiconductor chips 3 with an ultraviolet curing resin (with a viscosity of about 1-30 pa·s) and then both electrodes 11 were electrically connected by the second metal layer 28. It can be seen that both electrodes 11 of the adjacent semiconductor chips 3 are electrically connected in a good condition without breaks by the second metal layer 28 formed on the gently curved surface.

The second filling layer 26 is formed using a resin having a viscosity of 40-220 pa·s. The second insulation layer 27 is formed using a resin having a viscosity of 10-120 pa·s. The resin having a high viscosity of 40-220 pa·s exactly fills the gap between the adjacent semiconductor chips 3, because it hardly runs off the gap and it is easy to handle. When the heights of the semiconductor chips 3 are uneven, the surface of the second filling layer 26 filled from the edge of one semiconductor chip and the edge of the other semiconductor chip defines a gently curved surface (slope) shaped like the letter S to fill the unevenness (level difference). In consequence, the second filling layer 26 can be formed as the base of the second underlying insulation layer 25. Since the resin that is formed on top of the second filling layer 26 by drawing or spraying and curing has a low viscosity of 10-120 pa·s, it will spread smoothly in a given area. Thus, it makes it possible to form the second insulation layer 27 having a gently curved surface.

Since the second metal layer 28 is formed on the gently curved surface of the second underlying insulation layer 25, the electrical connection between the electrodes 11 of the adjacent semiconductor chips 3 is free of disconnection or the like and provides a high reliability of connection.

The ultraviolet curing resin that is used for forming the second surface insulation layer 29 has a low viscosity of 1-30 pa·s and, hence, it can cover the second metal layer 28 without clearance. The second surface insulation layer 29 becomes one of grid bars, as shown in FIG. 1, which extend along the edges of the semiconductor chips on the cluster of the semiconductor chips 3. The width of each grid bar is about 50 μm, depending on the length of the second metal layer 28 which is approximately, several ten to several hundred μm. This results in suppressing image discontinuity in a sensor output image to a negligible level.

For explanatory convenience, the electrical connection structure between the electrodes 11 of the adjacent semiconductor chips 3 has been explained using the terms of the second underlying insulation layer 25, second filling layer 26, second insulation layer 27, second metal layer 28, and second surface insulation layer 29. In the manufacturing process of the semiconductor device 1, however, the second filling layer 26 is formed simultaneously when the first filling layer 16 is formed and the second insulation layer 27 is formed simultaneously when the first insulation layer 17 is formed. Accordingly, the second underlying insulation layer 25 is formed simultaneously when the first underlying insulation layer 15 is formed. Likewise, the second metal layer 28 is formed simultaneously when the first metal layer 20 is formed and the second surface insulation layer 29 is formed simultaneously when the first surface insulation layer 21 is formed.

Figure 7:
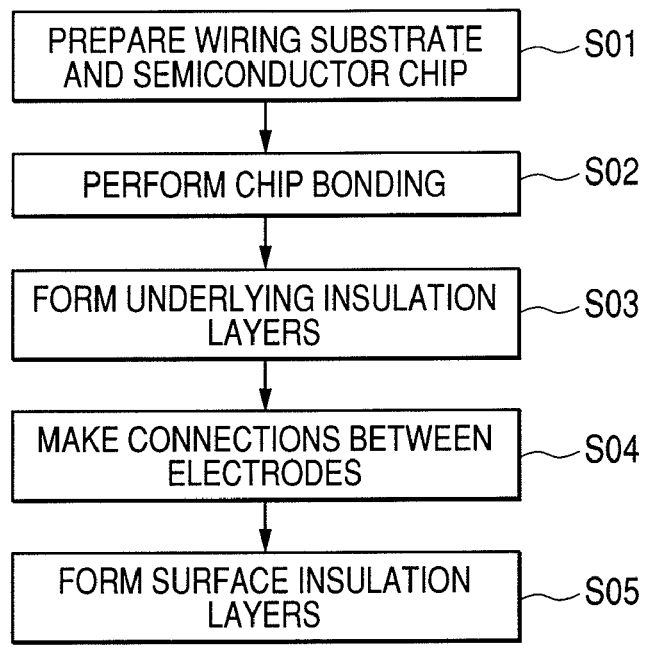
FIG. 7 is a flowchart outlining a method of manufacturing the semiconductor device of the first embodiment.

Next, a method of manufacturing the semiconductor device 1 which makes an image pickup device is described. As shown in FIG. 7, the semiconductor device 1 is manufactured through the following steps: preparing a wiring substrate and semiconductor chips (S01), chip bonding (S02), forming underlying insulation layers (S03), making connections between electrodes (S04), and forming surface insulation layers (05).

Figure 8:
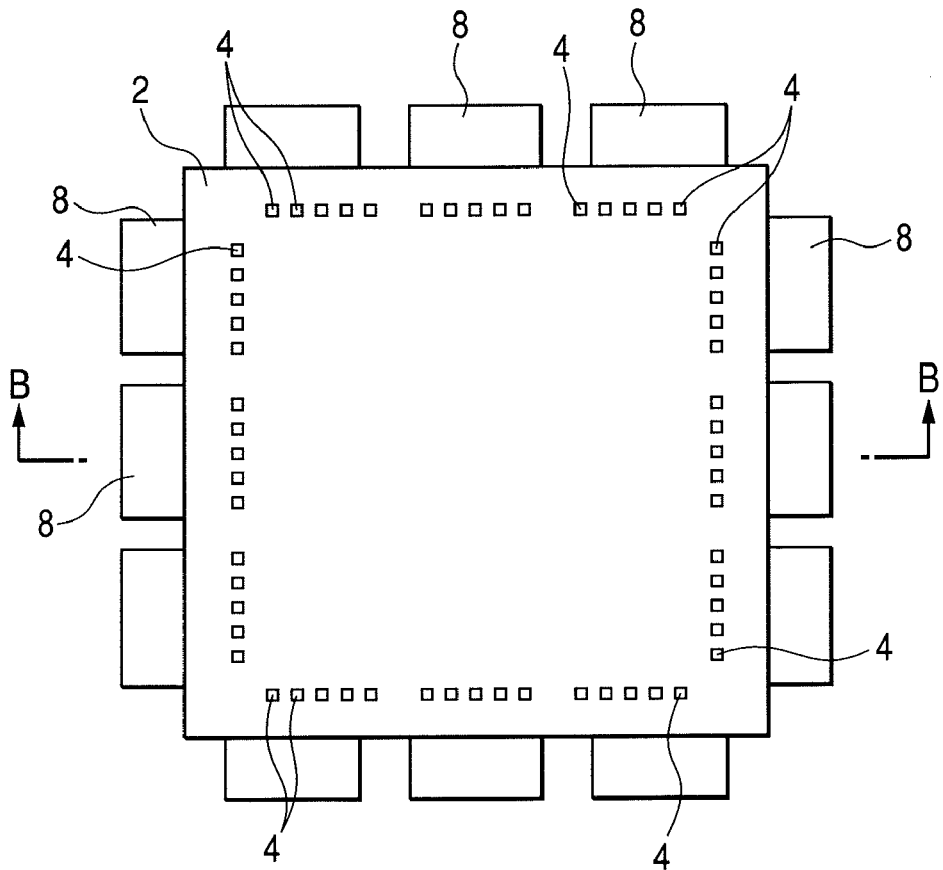
FIG. 8 is a schematic plan view of a wiring substrate which is used in the method of manufacturing the semiconductor device of the first embodiment.
Figure 9:
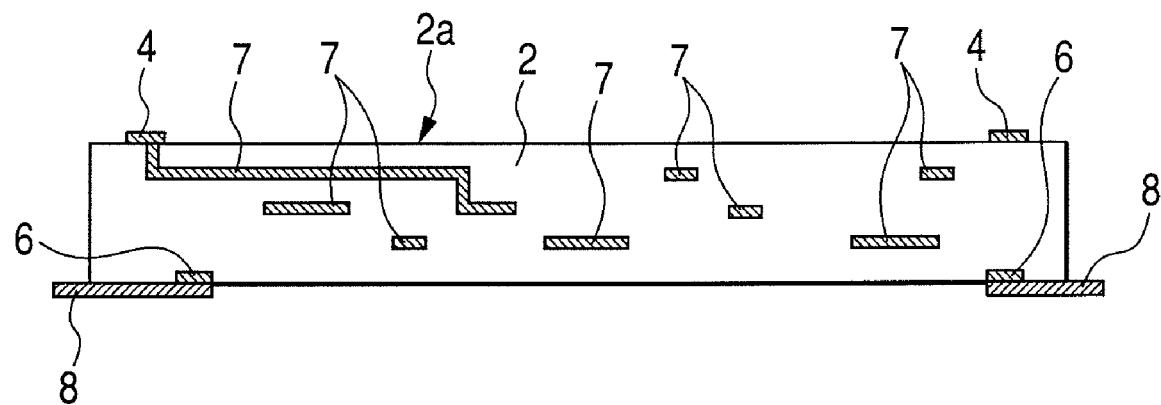
FIG. 9 is a schematic sectional view taken along a B-B line in FIG. 8.

In the manufacture of the semiconductor device 1, namely, the image pickup device, the wiring substrate 2 and the semiconductor chips 3 are prepared (S01). The wiring substrate 2 has a structure as shown in FIG. 8 and FIG. 9. Specifically, the wiring substrate 2, as shown in FIG. 8, consists of a square board having the first surface 2a and the second surface 2b and the connecting pads 4 are disposed on the first surface 2a along its edges. These connecting pads 4 are arranged to form a square frame. The parts mount 5 is a square portion inside the frame in which the connecting pads are arranged. Onto this parts mount 5, the semiconductor chips 3 are arrayed lengthwise and crosswise and fixed.

The method of manufacturing the image pickup device of the first embodiment is explained, using the diagram in which three semiconductor chips 3 arrayed lengthwise and three chips 3 arrayed in crosswise, a total of nine chips are fixed onto the wiring substrate. However, to make the semiconductor device 1 available as the image pickup device that is used in an X-ray CT scanner, it is needed to produce a square image pickup surface having edges as long as 300 mm, for example, consisting of a matrix structure of a total of 100 semiconductor chips 3, 10 chips arrayed lengthwise and 10 chips arrayed crosswise.

The underlying electrodes 6 are disposed on the second surface 2b along the edges of the wiring substrate 2. Inside the wiring substrate 2, the wiring sections 7 are formed as shown in FIG. 9. These wiring sections 7 are interconnected in certain places, respectively, and connected to predetermined connecting pads 4 and underlying electrodes 6 to form a predetermined wiring pattern.

Ball electrodes or leads are connected to the underlying electrodes 6 of the wiring substrate 2 to make external electrode terminals. In the first embodiment, the leads has already been attached to the wiring substrate 2.

Figure 12:
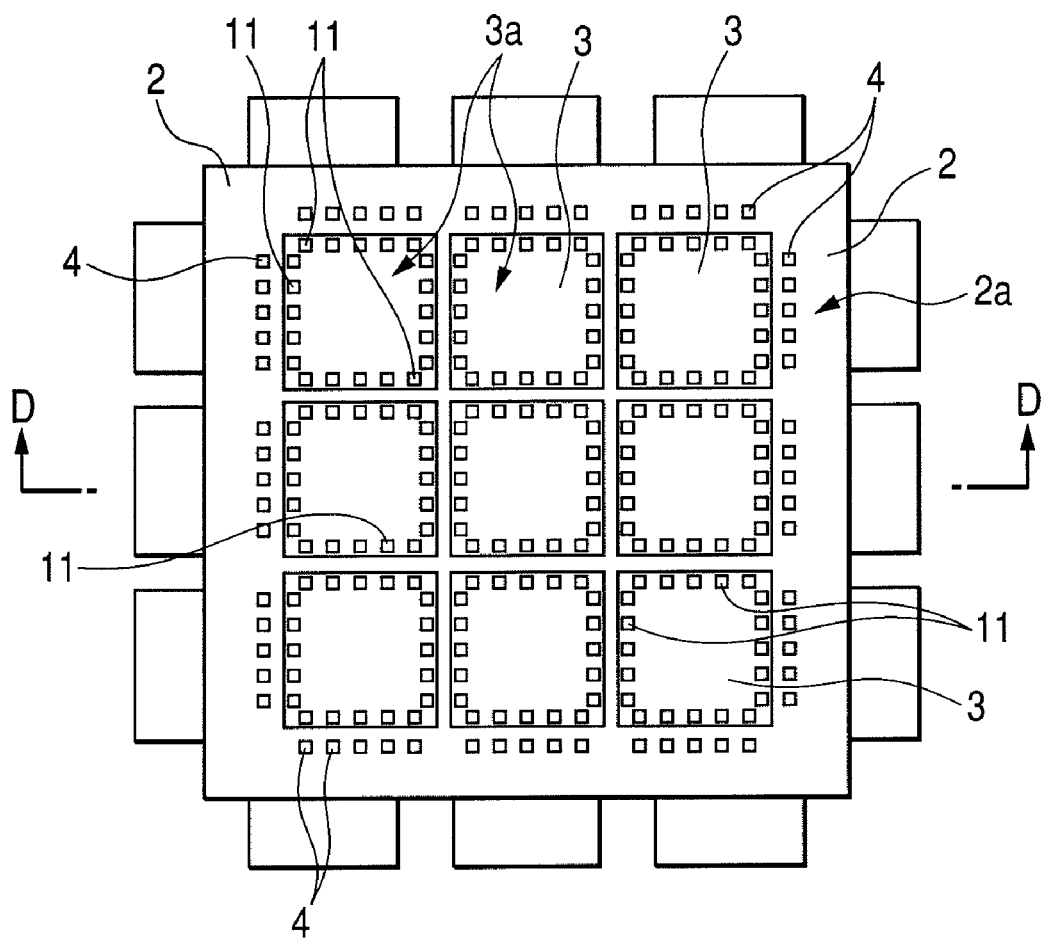
FIG. 12 is a schematic plan view showing a state where plural semiconductor chips are arrayed and fixed onto the first surface of the wiring substrate in the method of manufacturing the semiconductor device of the first embodiment.
Figure 13:
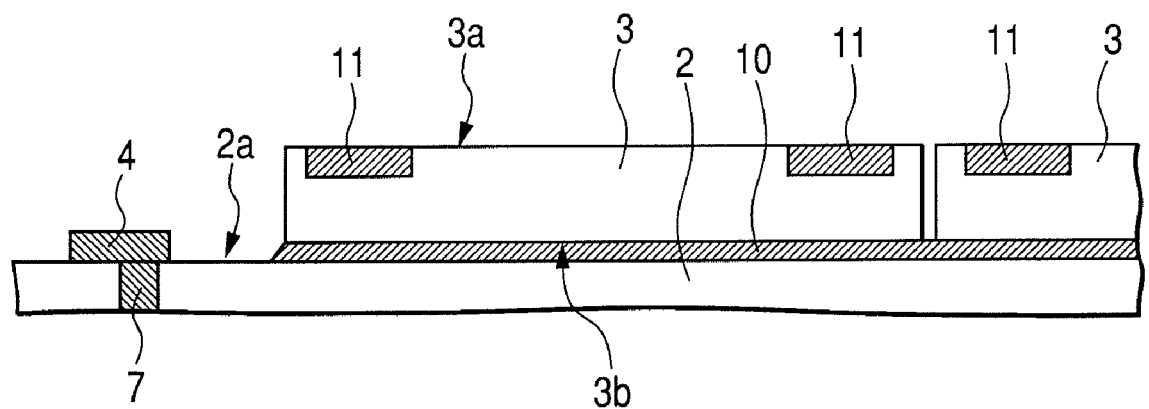
FIG. 13 is a schematic enlarged sectional view of a part taken along a D-D line in FIG. 12.

Each semiconductor chip 3 consists of a square silicon semiconductor having the first surface 3a and the second surface 3b, as shown in FIG. 12 and FIG. 13. The semiconductor chip 3 is a chip sensor and the first surface 3a of the semiconductor chip 3 is an image pickup surface that receives light. Plural electrodes 11 are arranged in line inlaying along the outer edges of the first surface 3a. Although not restrictive, the semiconductor chip 3 is about 400 μm thick and has a square shape with edges of 30 mm. The electrodes 11 are disposed at a distance of several hundred μm apart from the outer edges of the semiconductor chip 3. Each electrode has a square shape with edges of about 100 μm. The electrodes 11 are disposed at a pitch of, for example, about 500 μm. Although not shown, the first surface 3a of the semiconductor chip 3 is covered with an insulation layer and the electrodes protrude to be bared from the insulation layer in places. On the rim of the semiconductor chip 3, there are no exposed p-n junctions so that no trouble occurs even if adjacent semiconductor chips 3 contact with each other.

Figure 10:
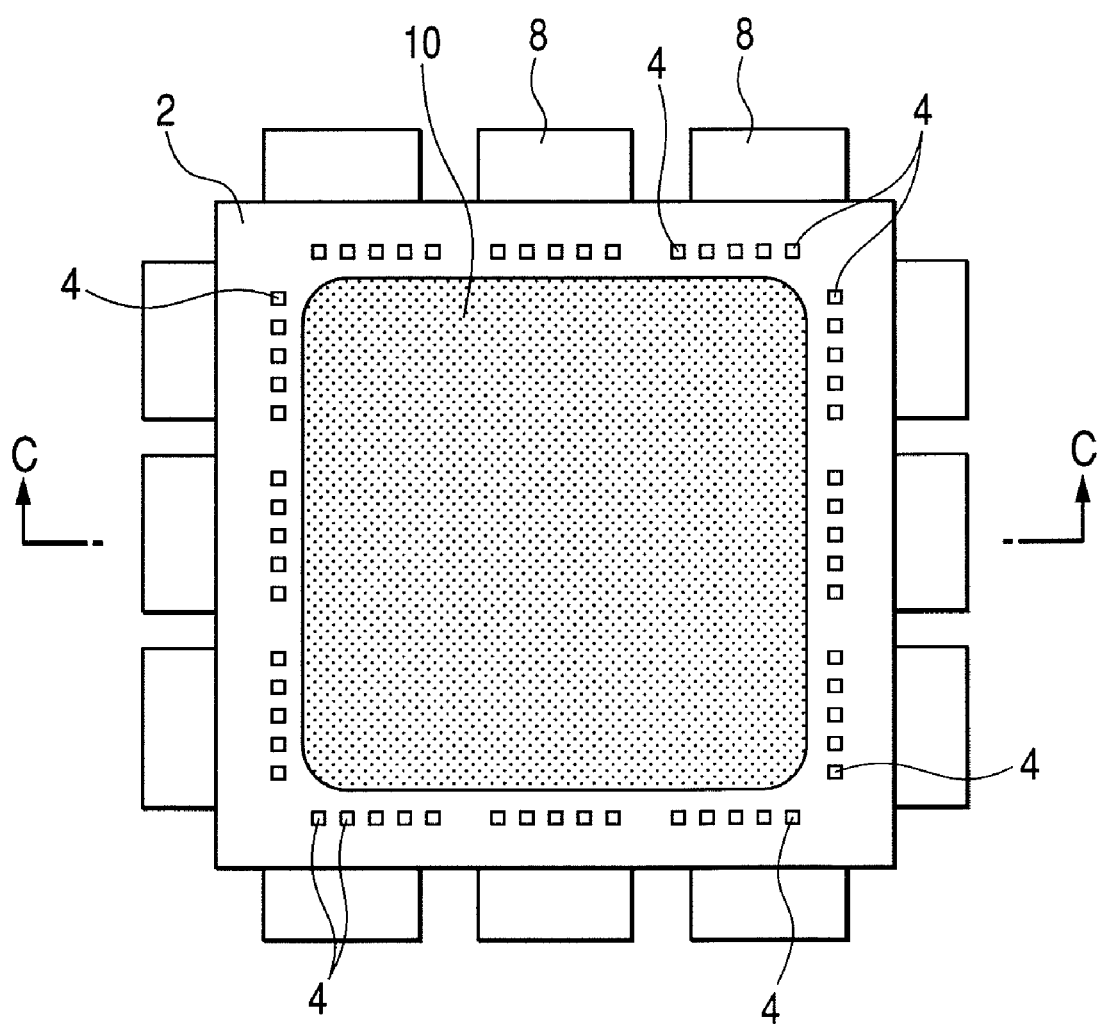
FIG. 10 is a schematic plan view showing a state where a liquid bonding material is selectively drew or sprayed on the first surface of the wiring substrate in the method of manufacturing the semiconductor device of the first embodiment.
Figure 11:
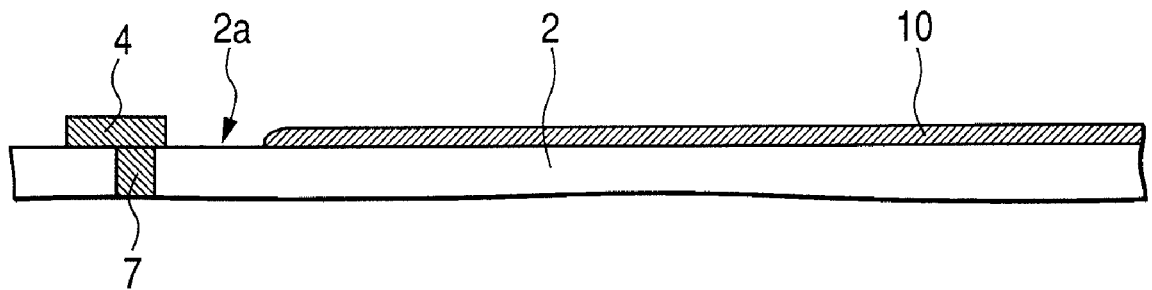
FIG. 11 is a schematic enlarged sectional view of a part taken along a C-C line in FIG. 10.

Then, as shown in FIG. 10 and FIG. 11, after drawing or spraying a liquid bonding material 10 to form a layer with a predetermined thickness on the parts mount 5 on the first surface 2a of the wiring substrate 2, the semiconductor chips 3 are bonded by the bonding material 10 to the wiring substrate 2, as shown in FIG. 12 and FIG. 13 (S02). The liquid bonding material 10 is drawing or spraying throughout the parts mount 5 by a dispenser or the like. After that, the semiconductor chips 3 are arrayed lengthwise and crosswise 3 on the parts mount 5 with the second surface 3b facing down. Then, the semiconductor chips 3 are fixed to the wiring substrate 2 by curing the liquid bonding material 10. Supply of the semiconductor chips 3 to the wiring substrate 2 is performed by a carrier device having plural nozzles that hold the semiconductor chips 3 by vacuum contact. After placing the semiconductor chips 3 on a jig, on the top surface of which the semiconductor chips 3 can be arranged in an array, the semiconductor chips 3 are held and moved to a position over the parts mount 5 by the above carrier device without altering their positional relationships. The semiconductor chips 3 are released and placed in the array on the wiring substrate 2 by stopping the vacuum contact. The gap between adjacent semiconductor chips 3 should be around 100 μm or less. In this state, the connecting pads 4 are positioned around the chip cluster fixed to the wiring substrate 2. As the bonding material 10, for example an epoxy resin adhesive is used. Curing is performed for about one hour at a baking temperature of 100° C. to 200° C.

Next, electrical connections between the electrodes 11 of the outermost semiconductor chips 3 in the chip cluster and the connecting pads of the wiring substrate 2 are made by metal layers and electrical connections between the electrodes 11 of adjacent semiconductor chips 3 are made by metal layers. Before making these electrical (connections between electrodes; S04), underlying insulation layers are formed (S03) and metal layers are formed on the top of the underlying insulation layers to prevent disconnection of the metal layers. Further, surface insulation layers that protect the metal layers are formed (S05).

Figure 14:
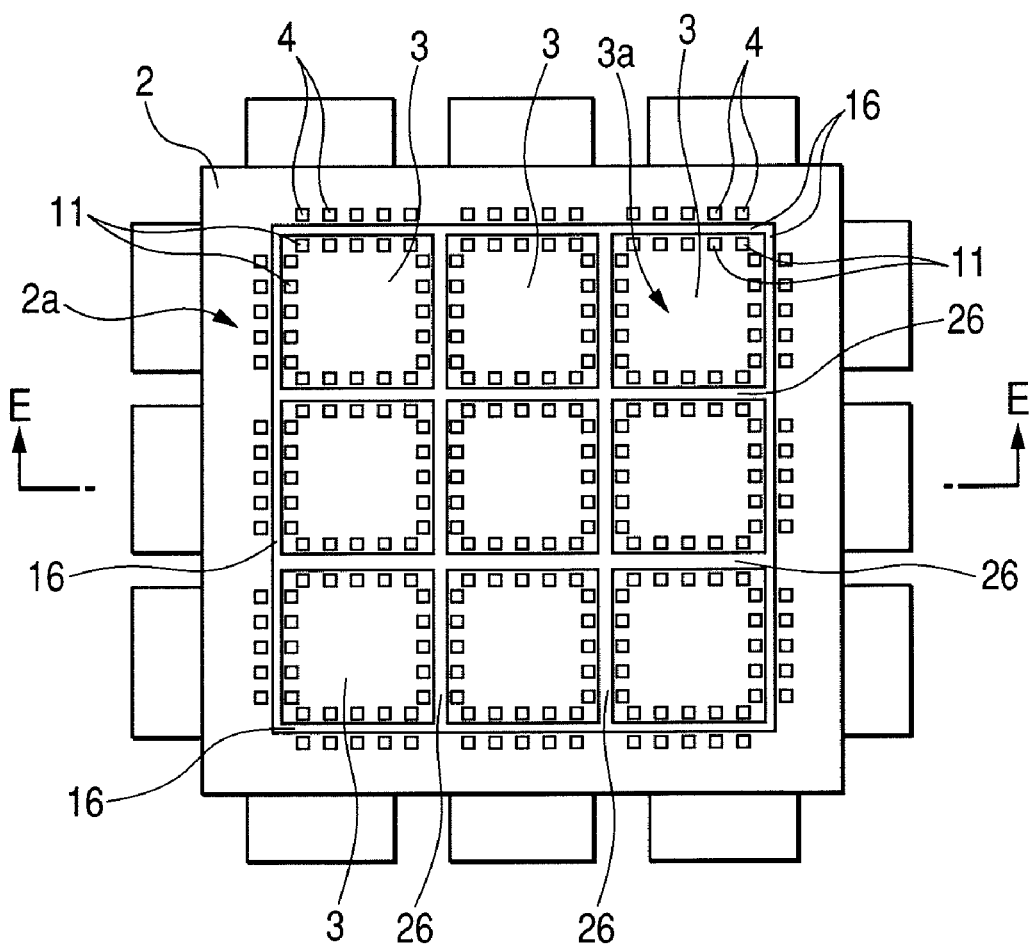
FIG. 14 is a schematic plan view showing a state where lower filling layers of underlying insulation layers were formed between semiconductor chips and along the outer edges of the chips in the method of manufacturing the semiconductor device of the first embodiment.
Figure 15:
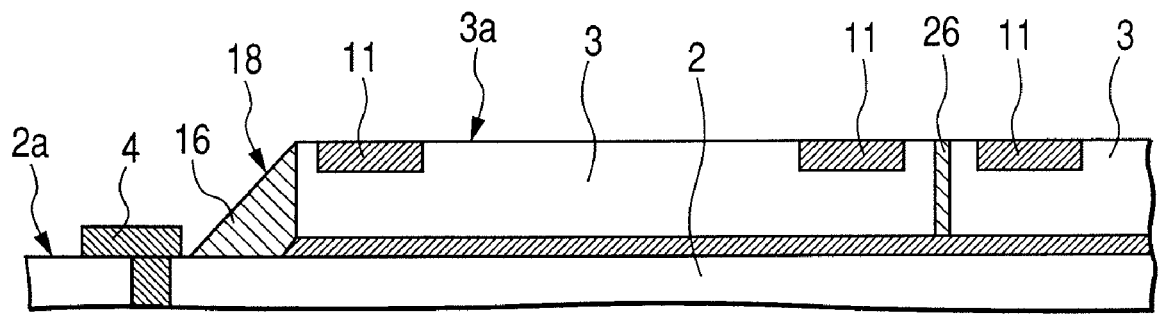
FIG. 15 is a schematic enlarged sectional view of a part taken along an E-E line in FIG. 14.

Although an underlying insulation layer may be one layer as shown in FIG. 5, it consists of two layers in the first embodiment. As shown in FIG. 14 and FIG. 15, the first filling layer 16 of the first underlying insulation layer 15 and the second filling layer 26 of the second underlying insulation layer 25 are formed.

The first filling layer 16 and the second filling layer 26 are formed by drawing or spraying a predetermined amount of electrically insulating paste by, for example, an ink jet, a dispenser, or a printing process and curing the paste. The first filling layer 16 is positioned on the rim of each outermost semiconductor chip in the chip cluster, as shown in FIG. 15. The second filling layer 26 is formed to fill the gap between adjacent semiconductor chips 3. The surface of the first filling layer 16 can be made to be a sloping plane 18 by adjusting the amount of the electrically insulating paste to be drew or sprayed. The sloping plane 18 can be made to a slop which is about 400 mm thick and extends from the outer edge of the first surface 3a of the semiconductor chip 3 to the edge of the connecting pad 4.

In a case where the heights of the semiconductor chips 3 are even, the surface of the second filling layer 26 filling the gap can be made flat by selecting the injection amount of electrically insulating paste. In a case where the heights of adjacent semiconductor chips 3 are uneven, a gently curved surface structure (gentle surface), shaped like the letter S in the cross section view, can be provided across the edge of a higher semiconductor chip 3 and the edge of a lower semiconductor chip 3.

As the electrically insulating paste, a reactive curing resin is used; for example, an ultraviolet curing resin with a viscosity of 1-30 pa·s is used. Curing the electrically insulating paste is performed by exposure to ultraviolet irradiation. To facilitate the curing, the curing is performed in an atmosphere at 80° C. Exposure to ultraviolet irradiation shortens the curing time as compared with curing by heating and contributes to a reduction in the manufacturing cost of the semiconductor device 1. A resin having a high viscosity of 40-220 pa·s is able to exactly fill the gap between the first surface 2a of the wiring substrate 2 and the rim of the semiconductor chip 3 and thus makes it possible to form the first filling layer 16 as the base of the first underlying insulation layer 15.

In a case where electrically insulating paste is injected into a gap between adjacent semiconductor chips 3 by, for example a commercially available ink jet or dispenser, the gap between the semiconductor chips 3 should be at least about 40 μm. Since the inside diameter of a nozzle for drawing or spraying electrically insulating paste of a commercially available ink jet or dispenser is about several ten μm, the gap between the semiconductor chips 3 should be at least about 40 μm. Hence, if the inside diameter of the nozzle is made smaller, the gap between the semiconductor chips 3 can be made even smaller. However, taking it into consideration that electrically insulating paste must be filled (injected) into the gap positively and in view of workability or the like, the gap between the semiconductor chips 3 would, preferably, be on the order of several hundred to several millimeters. In the first embodiment, the semiconductor chips 3 are fixed to the wiring substrate 2 so that the gap between the semiconductor chips 3 will be about 100 μm.

After the first filling layer 16 and the second filling layer 26 are formed, then, the first insulation layer 17 is formed on top of the first filling layer 16 and the second insulation layer 27 is formed on top of the second filling layer 26. These insulating layers are also formed by drawing or spraying electrically insulating paste to form a layer with a predetermined thickness by an ink jet, a dispenser, or a printing process and curing the paste. As the electrically insulating paste, a reactive curing resin is used; for example, an ultraviolet curing resin with a viscosity of 1-120 pa·s is used. Curing the electrically insulating paste is performed by exposure to ultraviolet irradiation in an atmosphere at 80° C. Exposure to ultraviolet irradiation does not need baking for about one hour as compared with curing by heating and contributes to a reduction in the manufacturing cost of the semiconductor device 1. Because of its low viscosity of 1-120 pa·s, the resin will spread smoothly in a given area. Thus, it makes it possible to form the first insulation layer 17 having the sloping plane with a flat surface or gently curved surface and the second insulation layer 27 having a gently curved surface.

The first insulation layer 17 and the second insulation layer 27 are formed on the first filling layer 16 and the second filling layer 26 having the sloping plane 18 with a flat surface or defining a flat surface or a gently curved surface. Therefore, these insulation layers have a relatively constant thickness. The thickness of the first insulation layer 17 and the second insulation layer 27 is, for example, on the order of several ten μm to several hundred μm. The first underlying insulation layer 15 is formed by the first filling layer 16 and the first insulation layer 17. The second underlying insulation layer 25 is formed by the second filling layer 26 and the second insulation layer 27.

As shown in FIG. 18 and FIG. 19, then, the first metal layer 20 is formed on top of the first insulation layer 17 and the second metal layer 28 is formed on top of the second insulation layer 27. The first metal layer 20 is formed such that its both ends protrude to a predetermined distance out of both ends of the first insulation layer 17. In consequence, one protrusion at one end of the first metal layer 20 is overlaid on the connecting pad 4 and the other protrusion at the other end of the first metal layer 20 is overlaid on the electrode 11. This provides an electrical connection between the particular connecting pad 4 and the particular electrode 11.

The second metal layer 28 is formed such that its both ends protrude to a predetermined distance out of both ends of the second insulation layer 27. In consequence, one protrusion at one end of the second metal layer 28 is overlaid on the electrode 11 of one semiconductor chip 3 and the other protrusion at the other end of the second metal layer 28 is overlaid on the electrode 11 of the other semiconductor chip 3. This provides an electrical connection between the particular electrodes 11 of adjacent semiconductor chips 3.

The second metal layer 28 has a width of on the order of several ten to several hundred μm and a thickness of on the order of several μm to several hundred μm. The second metal layer 28 has a length of on the order of several μm to several hundred μm.

The first metal layer 20 and the second metal layer 28 are formed by drawing or spraying electrically conducting paste (metal paste) by, for example, an ink jet, a dispenser, or a printing process and curing the paste. As the electrically conducting paste, a paste comprising particles of a noble metal such as Au or Ag, Cu, or an alloy including these metals is used. The electrically conducting paste is cured by baking for about 30 minutes at 200° C., for example.

Figure 21:
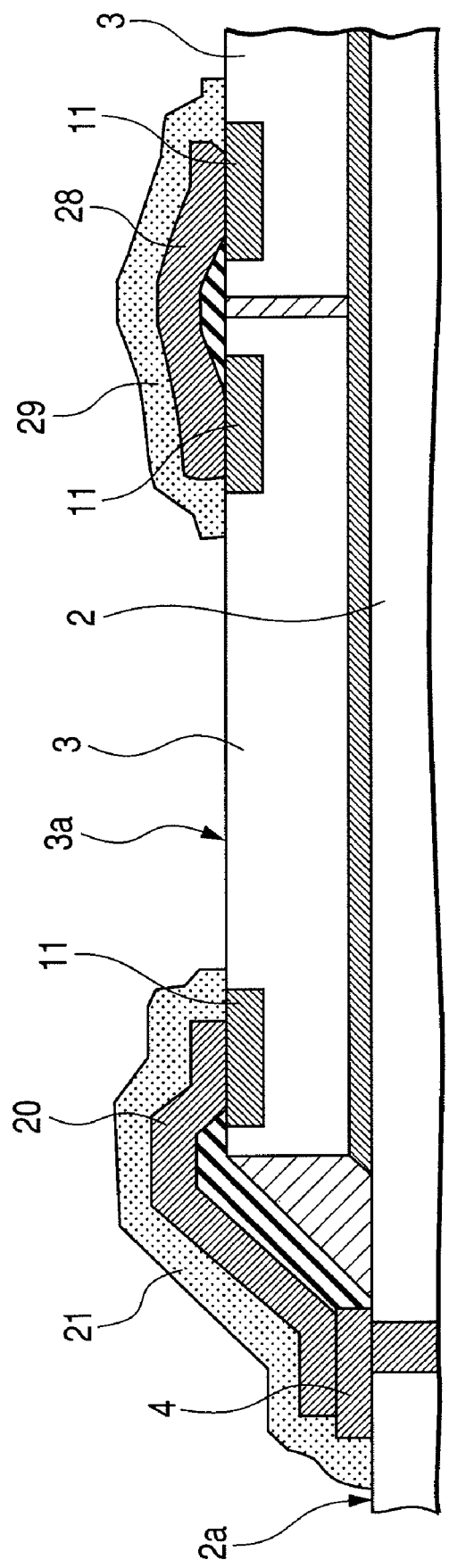
FIG. 21 is a schematic enlarged sectional view of a part taken along an H-H line in FIG. 20.

As shown in FIG. 20 and FIG. 21, then, the first metal layer 20 and the second metal layer 28 are protected by covering of the first surface insulation layer 21 and the second surface insulation layer 29 consisting of an insulating material. The first surface insulation layer 21 and the second surface insulation layer 29 is formed using, for example, an ultraviolet curing resin. Specifically, these layers are formed by drawing or spraying an ultraviolet curing resin along the edges of semiconductor chips 3 at the perimeter of the semiconductor chip cluster and along the gaps between adjacent semiconductors 3 by, for example, an ink jet, a dispenser, or a printing process and then curing the ultraviolet curing resin by exposure to ultraviolet irradiation (in an atmosphere at 80° C.). The ultraviolet curing resin that is used for forming the first surface insulation layer 21 and the second surface insulation layer 29 has a low viscosity of 1-30 pa·s or less. Because of the low viscosity of 1-30 pa·s, the resin can cover the first metal layer 20 and the second metal layer 28 without clearance.

Through the above-described steps, the semiconductor device 1, namely, the image pickup device can be manufactured.

The first embodiment provides the following advantageous effects.

(1) For an electrical connection between an electrode 11 of a semiconductor chip 3 and a connecting pad 4 of the wiring substrate 2, the first underlying insulation layer 15 is formed beforehand between the electrode 11 and the connecting pad 4 to define a smooth sloping surface. Then, the first metal layer 20 is formed on this smooth surface and the electrode 11 and the connecting pad 4 are connected by the first metal layer 20. Accordingly, the connection between the electrode 11 and the connecting pad 4 is provided reliably and with a high precision.

(2) Because the first metal layer 20 is in solid contact with the first underlying insulation layer 15, this structure is free from deformation such as bending which may occur with wires. This structure can prevent a short circuit trouble due to that a metal layer (first metal layer 20) is deformed to contact a neighboring metal layer (first metal layer 20) and enhances the reliability of the semiconductor device 1. Thereby, even microscopic wiring can be performed.

(3) The first underlying insulation layer 15 and the first metal layer 20 can be formed easily and with a high precision by an ink jet, a dispenser, and a printing process which are commonly used in the manufacturing technology of the semiconductor device 1. This improves the manufacturing efficiency and can achieve a lower cost of the semiconductor device 1. The nozzle movement of the ink jet and the dispenser is controlled freely in XY directions in a plane and a portion to be printed by the printing process can be selected freely in XY directions in a plane. Thus, it is advantageous that a wiring length and a wiring shape can be selected freely, unlike wire connections. For example, not only a linear wiring, a zigzag wiring is also possible with metal layers (first metal layers 20). Thereby, the degree of freedom in selecting the positions in which the semiconductor chips 3 are fixed and in wiring design increases.

(4) For an electrical connection between the electrodes 11 of adjacent semiconductor chips 3, the second underlying insulation layer 25 is formed beforehand between the electrodes 11 of one semiconductor chip 3 and the electrodes 11 of the other semiconductor chip 3 to fill the gap between the adjacent semiconductor chips 3 and define a gently curved surface. Then, the second metal layer 28 is formed on this gently curved surface and the electrode 11 and both electrodes 11 are connected by the second metal layer 28. Accordingly, the connection between both electrodes 11 is provided reliably and with a high precision.

(5) Because the second metal layer 28 is in solid contact with the second underlying insulation layer 25, it is free from deformation such as bending which may occur with wires. This structure can prevent a short circuit trouble due to that a metal layer (second metal layer 28) is deformed to contact a neighboring metal layer (second metal layer 28) and enhances the reliability of the semiconductor device 1. Thereby, even microscopic wiring can be performed.

(6) The second underlying insulation layer 25 and the second metal layer 28 can be formed easily and with a high precision by an ink jet, a dispenser, and a printing process which are commonly used in the manufacturing technology of the semiconductor device 1. This improves the manufacturing efficiency and can achieve a lower cost of the semiconductor device 1. The nozzle movement of the ink jet and the dispenser is controlled freely in XY directions in a plane and a portion to be printed by the printing process can be selected freely in XY directions in a plane. Thus, it is advantageous that a wiring length and a wiring shape can be selected freely, unlike wire connections. For example, not only a linear wiring, a zigzag wiring is also possible with metal layers (second metal layers 28). Thereby, the degree of freedom in selecting the positions in which the semiconductor chips 3 are fixed and in wiring design increases.

(7) Electrical connections between the electrodes 11 of the semiconductor chips 3 and the connecting pads 4 of the wiring substrate 2 and electrical connections between the electrodes 11 of adjacent semiconductor chips 3 are provided by the metal layers (first metal layer 20 and second metal layer 28). There is no need to extend wires in a loop for wire connections and wiring can be shortened as compared with wire connections. Consequently, a smaller and thinner semiconductor device 1 can be achieved. If the semiconductor device 1 becomes smaller and thinner, a lighter semiconductor device 1 can be achieved.

(8) Since electrical connection distance can be shortened as noted above in (7), the mounting area (including electrical connections) per chip (semiconductor chip 3) becomes smaller. Consequently, a smaller semiconductor device 1 can be achieved. From another perspective, as the mounting area per chip (semiconductor chip 3) is reduced, the wiring substrate will have more unoccupied space. Therefore, a new electronic part can be installed in such space and more integration in the semiconductor device 1 can be achieved.

(9) Since electrical connection distance or wiring length is shortened as noted above in (7), decreasing electric signal delay and reducing noise can be achieved.

(10) The first underlying insulation layer 15 is formed of the first filling layer 16 made of an insulating material, having the sloping plane 18 which at least fills the side of a semiconductor chip 3 and extends from the first surface 2a of the wiring substrate 2 to the first surface 3a of the semiconductor chip 3, and the first insulation layer 17 made of an insulating material, which is formed at least overlaid on the first filling layer 16. The second underlying insulation layer 25 is formed of the second filling layer 26 made of an insulating material, which at least fills the gap between adjacent semiconductor chips 3 and the second insulation layer 27 made of an insulating material, which is formed at least overlaid on the second filling layer 26 and defines a flat surface or a gently curved surface between the electrodes of adjacent semiconductor chips 3. In consequence, the first and second underlying insulation layers 15, 25 provide smooth surfaces and the metal layers formed overlaid on the smooth surfaces provide more reliable connections between the electrodes 11 of the semiconductor chips 3 and the electrodes of the semiconductor chips 3 and the connecting pads 4 of the wiring substrate 2.

(11) The first filling layer 16 and the first insulation layer 17 are formed from different materials and the second filling layer 26 and the second insulation layer 27 are formed from different materials. The first and second filing layers 16, 26 are formed using an electrically insulating resin having a viscosity of 40-220 pa·s. The first and second insulation layers 17, 27 are formed using an electrically insulating resin having a viscosity of 10-120 pa·s. The resin having a high viscosity of 40-220 pa·s is able to exactly fill the gap and thus makes it possible to form the first and second filling layers 16, 26 as the bases of the first and second underlying insulation layers 15, 25. Since the resin that is formed on top of the first and second filling layers 16, 26 by drawing or spraying and curing has a low viscosity of 10-120 pa·s, it will spread smoothly in a given area. Thus, it makes it possible to form the first and second insulation layers 17, 27 defining smooth surfaces.

(12) The plural semiconductor chips 3 are of the same type and has equal dimensions. If the semiconductor chips 3 are sensor chips, in each of which an image pickup element whose first surface 3a serves as the image pickup surface is formed, the semiconductor device 1 becomes an image pickup device. Since this image pickup device consists of a cluster of multiple sensor chips, its image pickup surface becomes as large as a total sum of the area of the image pickup surface of each sensor chip. An image pickup device with such a large image pickup surface can be constructed. If, for example, ten square sensor chips with edges of 30 mm are arrayed lengthwise and crosswise respectively, an image pickup device having a square image pickup surface having edges of at least 300 mm can be manufactured.

Figure 42:
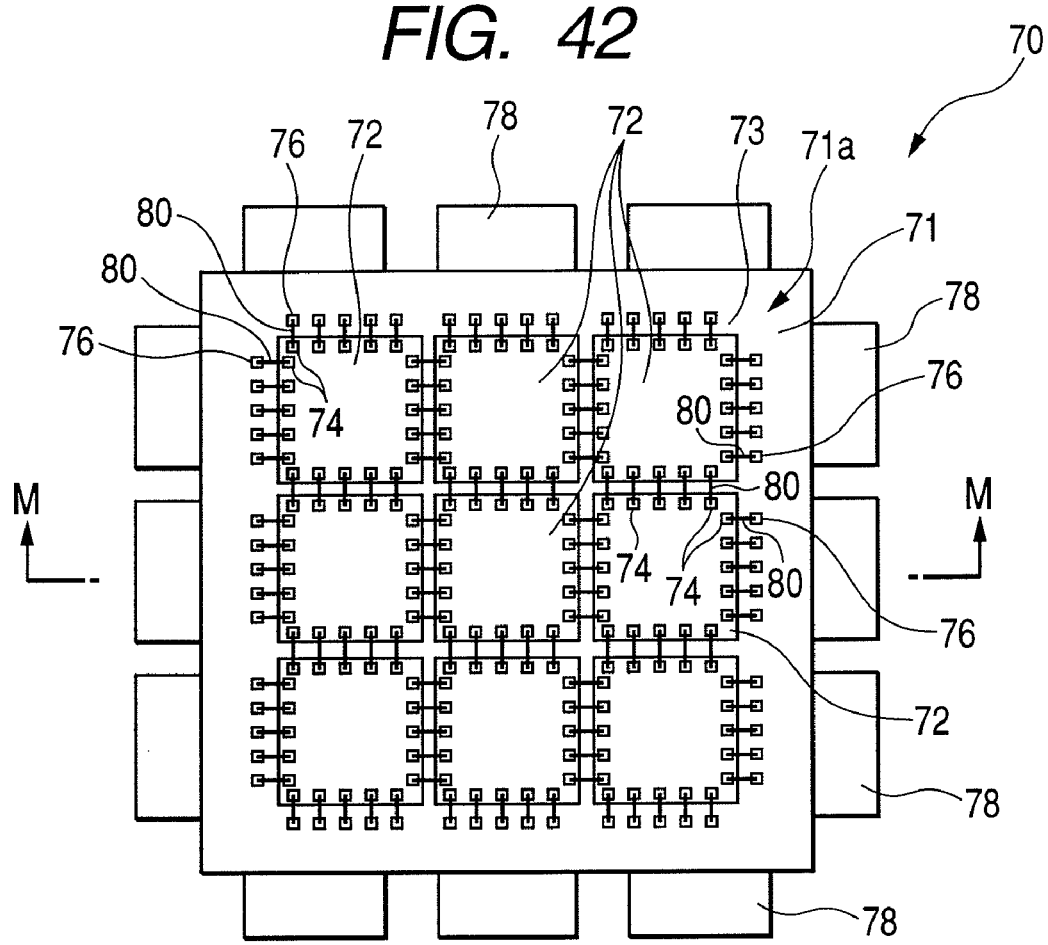
FIG. 42 is a schematic sectional view of a semiconductor device examined prior to the present invention.
Figure 43:
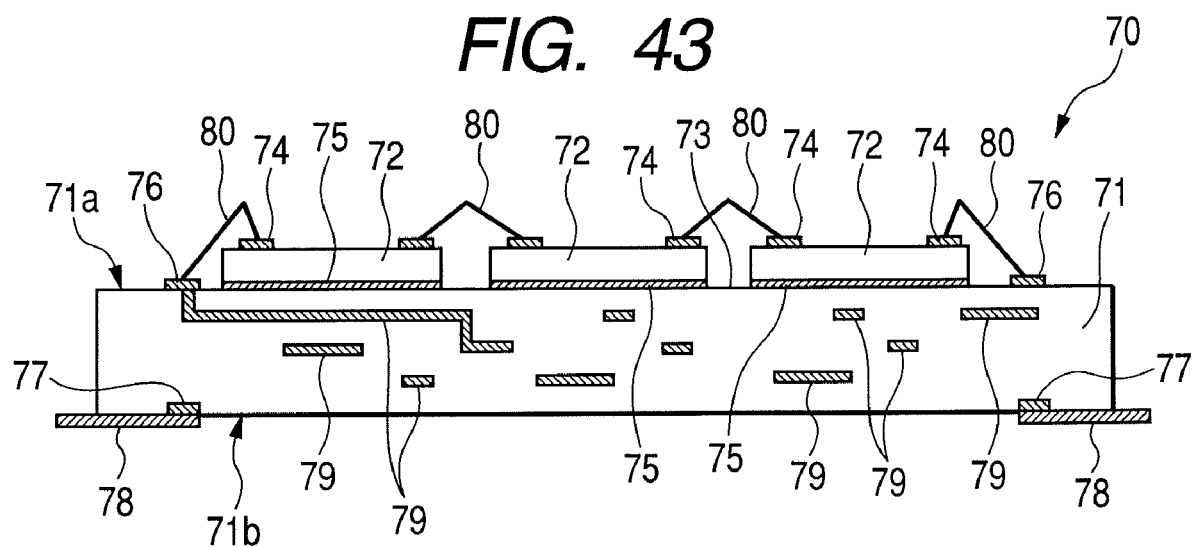
FIG. 43 is a schematic enlarged sectional view taken along an M-M line in FIG. 42.

In the device structure examined prior to the present invention, as shown in FIG. 42 and FIG. 43, a wire length (wire path length) of about 1.0 mm is required and the loss corresponding to the wire length significantly contributes to a degradation in the characteristics of the image pickup device. Consequently, it is impossible to connect multiple sensor chips without clearance between chips and operate them as if a single large sensor chip was used.

In contrast, in the case of the present invention, sensor chips (semiconductor chips 3) are arranged closely adjacent to each other and the underlying insulation layer (second underlying insulation layer 25) is formed to fill the gap between the sensor chips and compensate uneven heights of the chips. The electrodes formed on each sensor chip are connected by metal layers (second metal layer 28; metal paste wiring) and, therefore, connections can be made with a very short wiring length of, for example, several ten μm. There are no exposed p-n junctions on the rim of each sensor chip and no electrical trouble occurs even if adjacent sensor chips contact with each other. Thus, by placing adjacent sensor chips so close to each other that they might almost contact each other, the length of wiring with the metal layers (second metal layers 28) can be shortened. Owing to short metal layers, the surface insulation layers (second surface insulation layers 29) that protect the metal layers occupy a smaller area. This reduces image discontinuity in an sensor output image and avoids an adverse effect on image recognition. As the wiring length can be made shorter, a higher operating speed of the image pickup device is attainable.

(13) In the image pickup device with wire connections, light is reflected by the surfaces of wires and this reflected light is sensed as a noise component in an image. However, in the present invention, the metal layers (second metal layers 28) are covered with the insulation layers (second surface insulation layers 29). Therefore, there is no light reflection from the metal layer surface and no resulting noise in an image is introduced. Crisp images can be obtained and it is achievable for the image pickup device to produce a higher image quality.

Second Embodiment

A second embodiment presents an example of arraying and fixing plural semiconductor chips in the first embodiment onto a wiring substrate (chip tiling). FIGS. 22 through 24 relate to diagrams showing an example of arraying and fixing semiconductor chips onto a wiring substrate (chip tiling). By the chip timing, the multiple chips are arrayed in a matrix without clearance between chips.

As shown in FIG. 22A, a flat basin 35 holding a liquid (solution) 36 is prepared and plural semiconductor chips are allowed to float in the liquid 36. Preferably, the liquid has a large surface tension; for example, an agar solution is used. The semiconductor chips 3 are sensor chips and floated in the liquid 36 with the first surface 3a having the image pickup surface facing down. The semiconductor chips gather together 3 as shown in FIG. 24A by the force of the liquid 36 agitated by placing the chips on the surface of the liquid 36 and the surface tension of the liquid 36. However, at this stage, the semiconductor chips 3 do not always becomes arrayed in a matrix.

Then, an external force is directly applied to the liquid 36 and the semiconductor chips 3 or an external force is applied to the basin 35 so that the semiconductor chips 3 will vibrate or wag. External force may be applied by, for example, vibrating the basin 35, directing an air blow against the surface of the liquid, or by other methods.

Figure 24B:
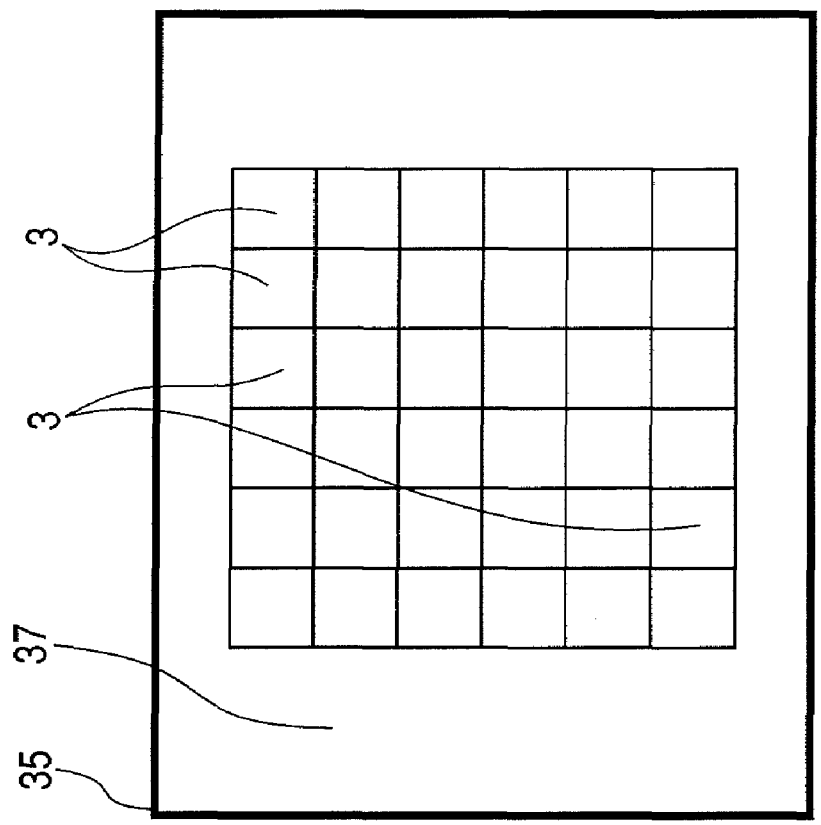
FIGS. 24A and 24B are schematic plan views showing two states before and after the semiconductor chips floated in a liquid are arrayed in the second embodiment.
Figure 24A:
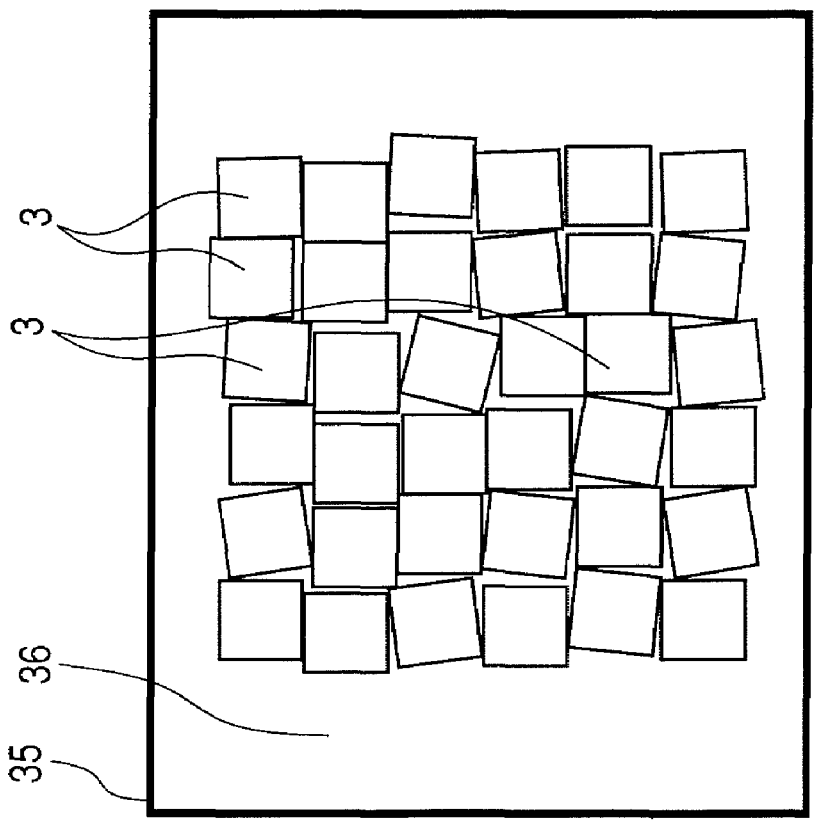

Under such vibration or the like, the semiconductor chips 3 come in contact with each other by the surface tension of the liquid 36 and closely contact with each other and arrayed in a matrix as shown in FIG. 24B.

Then, by leaving the chips in the basin for a certain period of time, the liquid 36 of the agar solution naturally hardens and changes to a hardening body 37 as shown in FIG. 22B.

Then, a liquid bonding material 10 is drew or sprayed on the second surface 3b of each semiconductor chip 3 as shown in FIG. 22B. Then, as shown in FIG. 23A, the wiring substrate 2 is positioned and put on the semiconductor chips 3 with the first surface 2a facing down. By pressing the wiring substrate 2 against the hardening body 37, the semiconductor chips 3 are bonded to the wiring substrate 2 with the bonding material 10. The bonding material 10 is cured (for example, while it is heated) to fix the semiconductor chips 3 to the wiring substrate 2.

Then, the hardening body 37 is molten with hot water of a certain temperature and liquefied to the liquid 36 (agar solution). After that, as shown in FIG. 23B, the wiring substrate 2 to which the semiconductor chips 3 were fixed is removed from the basin 35.

Figure 25A:
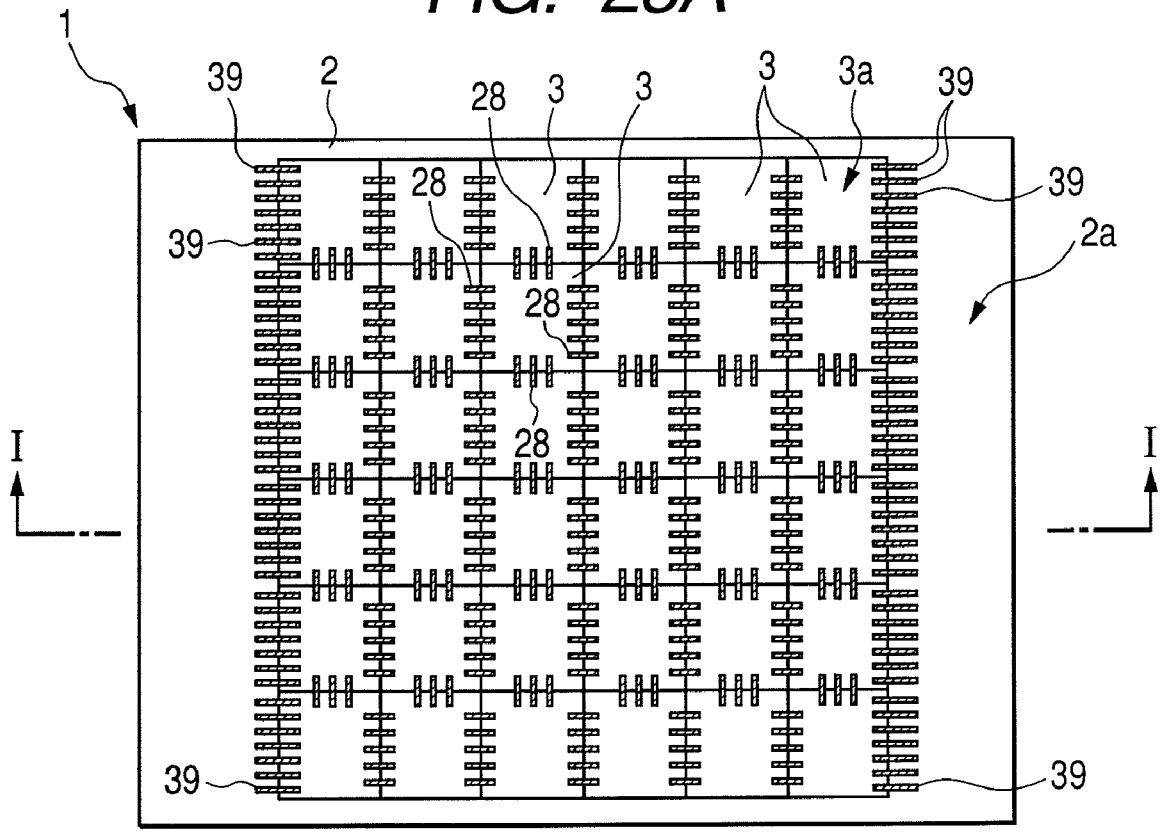
FIGS. 25A and 25B are schematic plan views showing two states where connections between electrode pads of semiconductor chips were made by metal layers and connections between electrode pads of the chips and electrode pads of the wiring substrate were made by wires in the wiring substrate formed by the method for arraying and fixing plural semiconductor chips onto a wiring substrate in accordance with the second embodiment of the present invention.
Figure 25B:
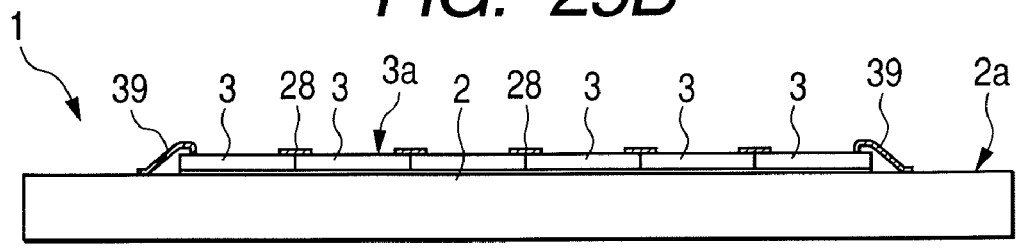

FIGS. 25A and 25B show substrate views in which, after the semiconductor chips 3 arrayed in contact with each other in a matrix were fixed to the wiring substrate 2, electrical connections between the electrodes 11 of adjacent semiconductor chips 3 were provided by metal paste wiring described in the first embodiment. FIGS. 25A and 25B also show connections made by conducting wires 39 between the electrodes 11, not shown, at the outer edges of the semiconductor chips 3 in the rightmost and leftmost columns and the connecting pads 4, not shown, of the wiring substrate 2. FIG. 25B is a schematic sectional view taken along an I-I line in FIG. 25A. For the semiconductor device 1, namely, the image pickup device manufactured by the second embodiment 2, the portions outside the electrodes 11 at the outer edges of the semiconductor chips 3 positioned in the rightmost and leftmost columns of the chip cluster are out of the image pickup surface and, therefore, use of the wires 39 poses no problem.

According to the method of manufacturing a semiconductor device in accordance with the second embodiment, the work of arraying the semiconductor chips 3 lengthwise and crosswise in a matrix and fixing them to the wiring substrate 2 becomes easier. Specifically, the semiconductor chips 3 floated in the solution 36 move so as to get in close contact with each other by the surface tension of the solution 36 and align in an array by a phenomenon (self alignment) in which they move to align naturally so that the surface area in a planar direction becomes minimum. In this process, the alignment behavior of the semiconductor chips 3 can be facilitated and the time required for the alignment can be shortened by performing the following: vibrating the solution 36, directing an air blow against the semiconductor chips 3 and solution 36, altering the surface state of the solution 36 by placing another object in the vicinity of the semiconductor chips 3, or taking other measures. This manner of alignment can also be applied to any square parts other than semiconductor chips.

Although an agar solution is used as the liquid 36 in the second embodiment, other solutions may be used. For example, a gelatin solution heated may be used as the liquid 36. Since this solution hardens (becomes non-fluid) and turns into a hardening body 37 as it is left as is for a given time, it can be used instead of the agar solution. After the semiconductor chips 3 are fixed to the wiring substrate 2, the hardening body is heated again to liquefy to the liquid 36

In the description of the second embodiment, the external electrode terminals provided on the wiring substrate 2 are omitted. While, in the second embodiment, an example where the semiconductor chips 3 are aligned in close contact with each other and arrayed in six rows and six columns of a matrix on the surface of the liquid 36 in the basin 35 has been described with the relevant drawings, an image pickup device of the first embodiment can be manufactured by aligning the semiconductor chips 3 in close contact with each other and arraying them in, for example, 10 rows and 10 columns of a matrix.

FIGS. 6A through 6C relate to an example of modification to the second embodiment of the present invention and are schematic section views by process showing another method for arraying and fixing plural semiconductor chips onto the wiring substrate (chip tiling).

Figure 26A:
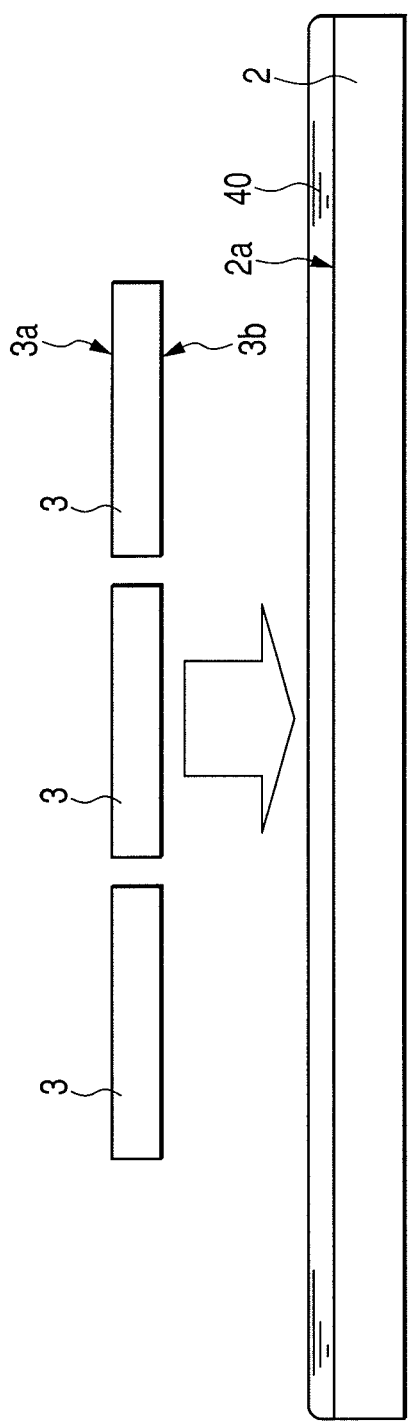
FIGS. 26A, 26B, and 26C are schematic section views by process step in the method for arraying and fixing plural semiconductor chips onto a wiring substrate modified in accordance with a example of modification to the second embodiment of the present invention.

As shown in FIG. 26A, a reactive curing resin liquid 40 is drew or sprayed to form a layer with a predetermined thickness on the top surface of the wiring substrate 2 placed with the first surface 2a facing up.

Figure 26B:
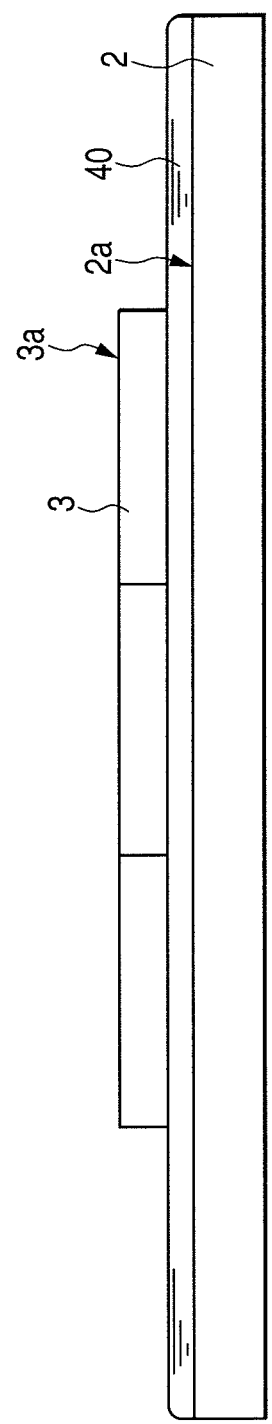

Then, as shown in FIG. 26B, plural semiconductor chips 3 are floated in the resin liquid 40 with the second surface 3b facing down. After that, in the same manner as the second embodiment, the resin liquid 40 is vibrated and adjacent semiconductor chips 3 are aligned in close contact with each other lengthwise and crosswise on the surface of the region liquid 40 by this vibration.

Figure 26C:
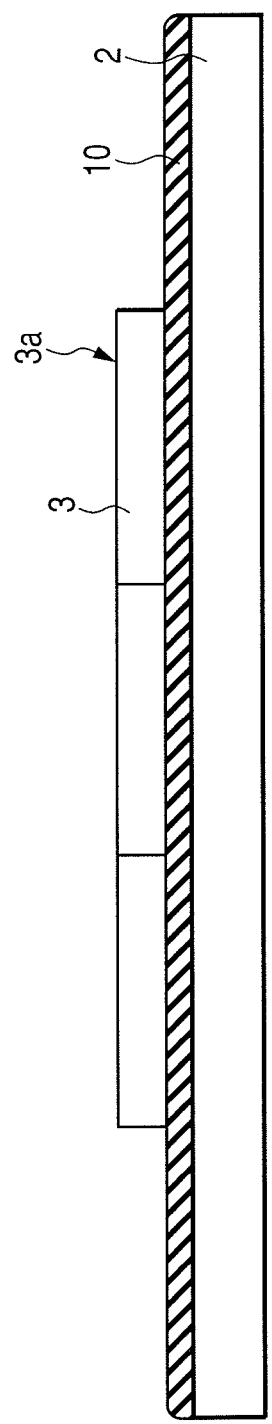

Then, as shown in FIG. 26C, the resin liquid 40 is cured to turn to the bonding material 10 and the semiconductor chips 3 are fixed to the wiring substrate 2 with the bonding material 10.

Thereby, the semiconductor device 1, or image pickup device can be manufactured as is the case for the second embodiment.

As the reactive curing resin liquid 40, for example, an ultraviolet curing resin liquid or a thermoplastic resin liquid may be used.

If the ultraviolet curing resin liquid is used, first, the ultraviolet curing resin liquid is drew or sprayed to form a layer with a certain thickness on the top first surface 2a of the wiring substrate 2.

Then, the semiconductor chips 3 are floated in the ultraviolet curing resin liquid and aligned in a matrix under vibration or the like applied.

Then, the ultraviolet curing resin liquid is cured by exposure to ultraviolet irradiation to turn to the bonding material 10 and the semiconductor chips 3 are arrayed and fixed onto the wiring substrate 2.

If the thermoplastic resin liquid is used, first, the thermoplastic resin liquid liquefied by heating is drew or sprayed to form a layer with a certain thickness on the top first surface 2a of the wiring substrate 2.

Then, the semiconductor chips 3 are floated in the thermoplastic resin liquid and aligned in a matrix under vibration or the like applied.

Then, the thermoplastic resin liquid is cured at normal temperature to turn to the bonding material 10 and the semiconductor chips 3 are arrayed and fixed to the wiring substrate 2.

Third Embodiment

Figure 27:
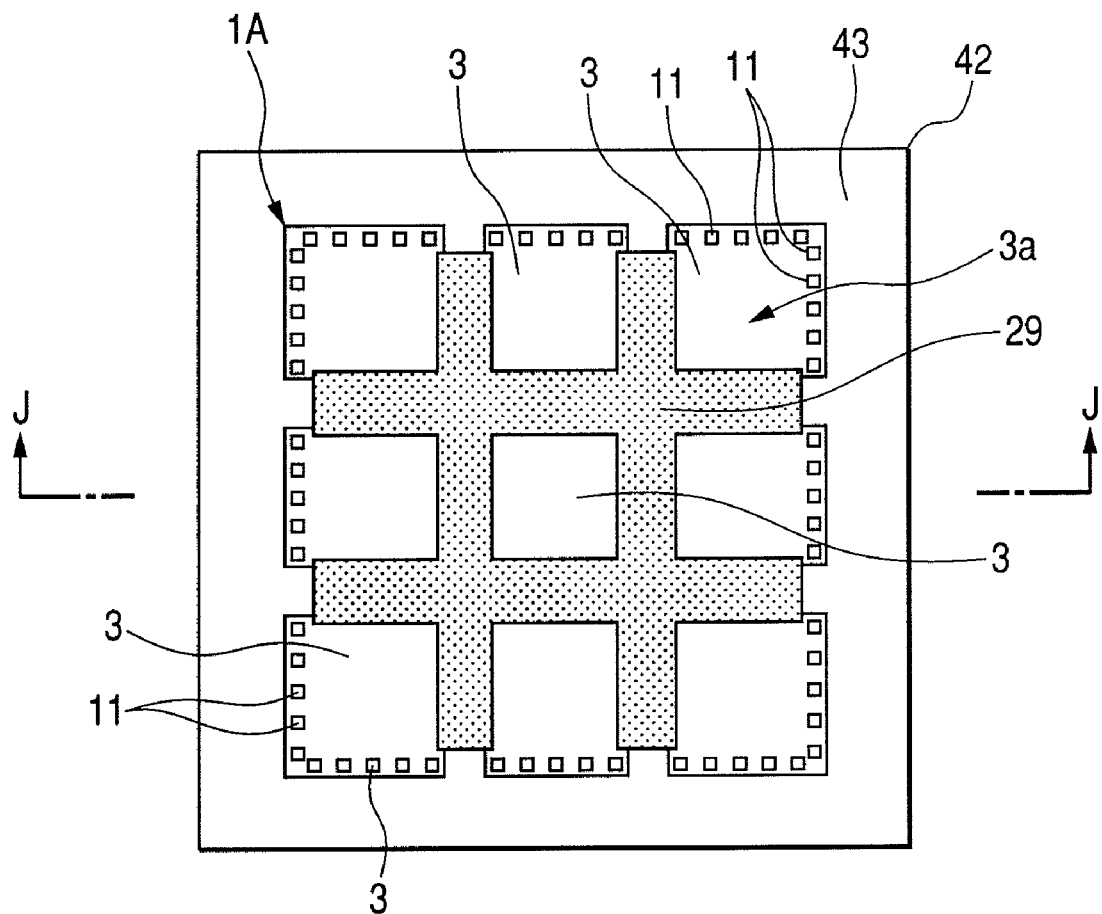
FIG. 27 is a schematic plan view of a semiconductor device according to a third embodiment of the present invention.
Figure 28:
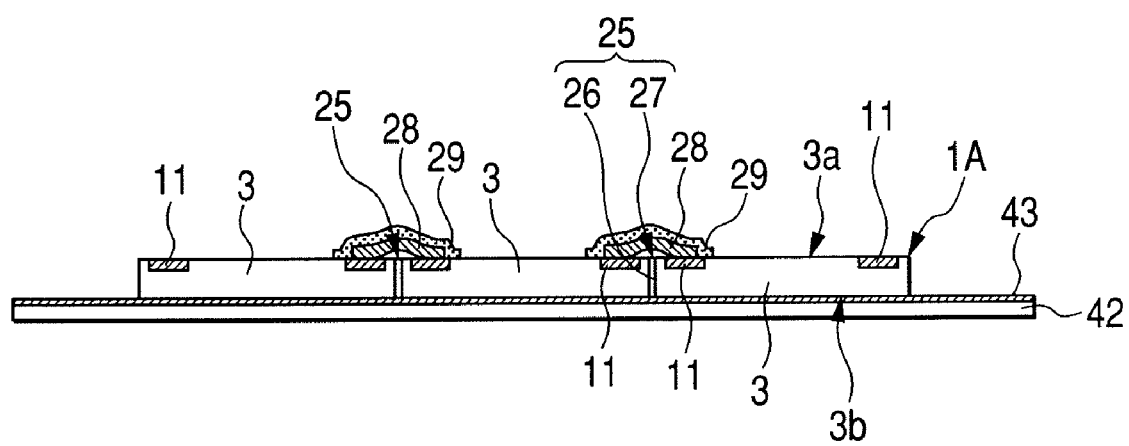
FIG. 28 is a schematic enlarged sectional view taken along a J-J line in FIG. 27.

FIG. 27 and FIG. 28 relate to a semiconductor device in accordance with a third embodiment of the present invention. FIG. 27 is a schematic plan view of the semiconductor device and FIG. 28 is a schematic enlarged sectional view taken along a J-J line in FIG. 27.

The third embodiment is a semiconductor device 1A formed by chip tiling of a cluster of chips on a removable adhesive tape. In the process for the semiconductor device 1A of the third embodiment, after the semiconductor chips 3 are aligned in close contact with each other in a matrix on the surface of the liquid 36, as described in the second embodiment and shown in FIG. 24B, the liquid 36 is left as is to turn to the hardening body 37. Instead of fixing the semiconductor chips 3 to the wiring substrate 2 via the bonding material 10, as shown in FIG. 23A, then, an adhesive tape 42 having the adhesive surface (adhesive layer 43) is put on the second surface 3b of the semiconductor chips 3, thus sticking the semiconductor chips 3 to the adhesive surface (see FIG. 28). After the hardening body 37 is liquefied to the liquid 36, the adhesive tape 42 to which the semiconductor chips 3 were fixed is removed from the basin 35. Further, electrical connections between the electrodes 11 of adjacent semiconductor chips 3 are provided by metal paste wiring in the first embodiment.

A metal paste wiring portion, as shown in FIG. 28, consists of a second underlying insulation layer 25, a second metal layer 28, and a second surface insulation layer 29. In FIG. 27, the second surface insulation layer 29 is denoted by a dotted region. In the semiconductor device 1A, the electrodes located at the outer edge of the chip cluster are exposed.

In the case where the semiconductor device 1A stuck to such adhesive tape 42 is used, the semiconductor device 1A in which the chips are integrated in the metal paste wiring portions where the connections between the electrodes 11 between adjacent semiconductor chips are provided is detached from the adhesive tape 42. After that, for example, the semiconductor device 1A is fixed to a predetermined wiring substrate and the electrodes 11 located at the perimeter of the chip cluster are connected to the connecting pads of the wiring substrate by conductive wires. In this way, the semiconductor device 1 as described in the second embodiment and shown in FIGS. 25A and 25B can be manufactured.

The semiconductor device 1A of the third embodiment can be provided to users as an image pickup device module that is not installed on a wiring substrate.

Fourth Embodiment

Figure 29:
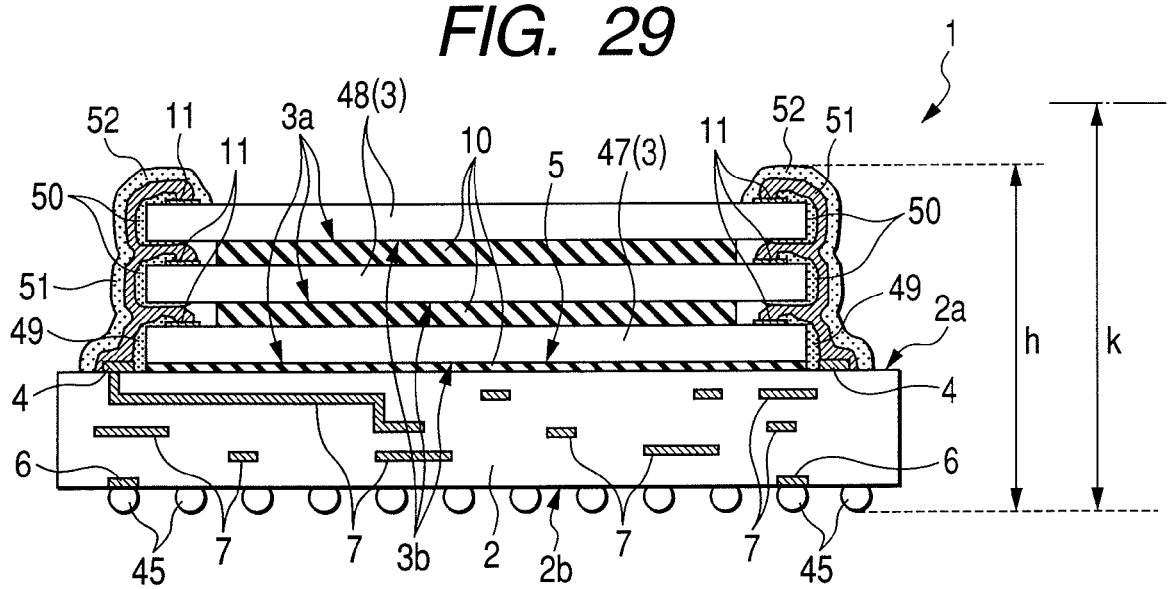
FIG. 29 is a schematic sectional view of a semiconductor device in accordance with a fourth embodiment of the present invention.
Figure 30:
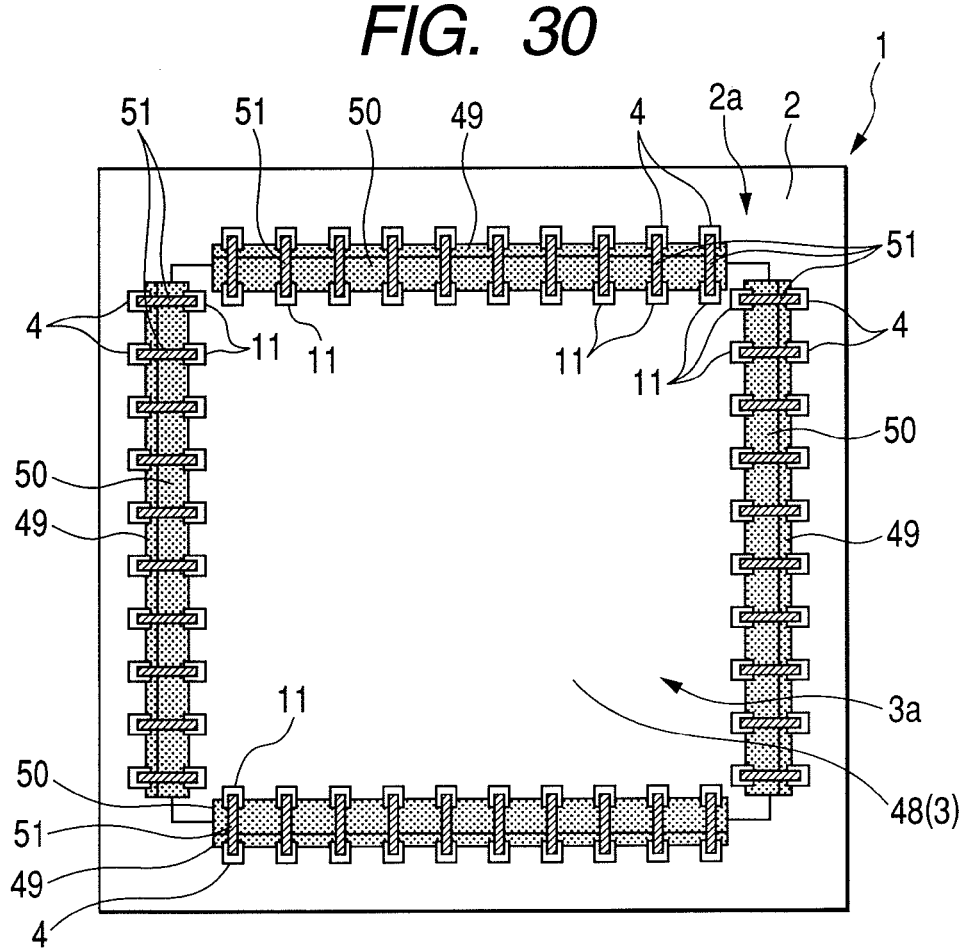
FIG. 30 is a schematic plan view showing connections in the semiconductor device of the fourth embodiment.
Figure 31:
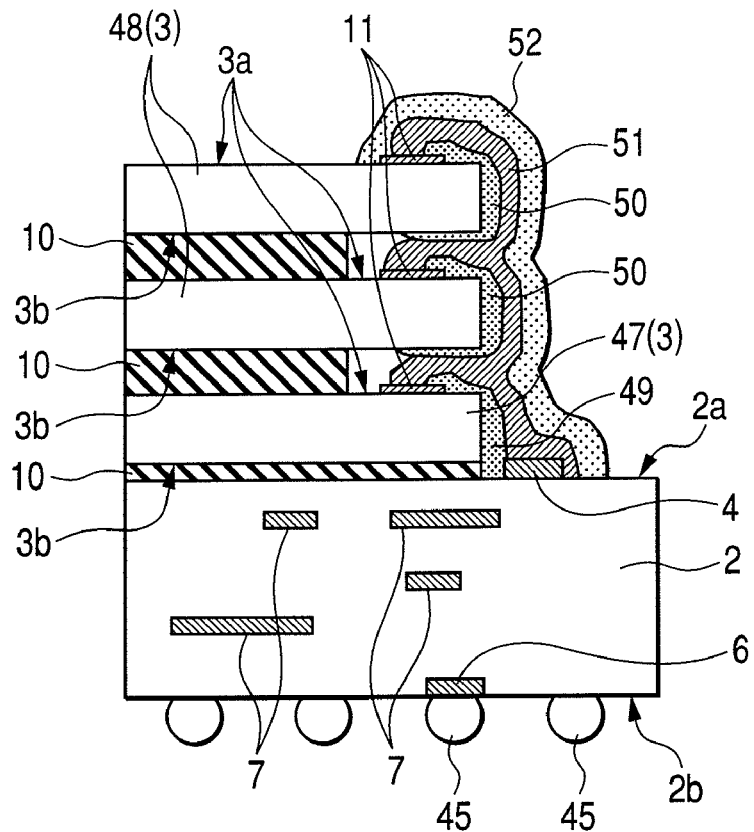
FIG. 31 is an enlarged sectional view of a part in FIG. 29.

FIGS. 29 through 31 relate to a semiconductor device in accordance with a fourth embodiment of the present invention. FIG. 29 is a schematic sectional view of the semiconductor device. FIG. 30 is a schematic plan view showing connections in the semiconductor device. FIG. 31 is an enlarged sectional view of a part in FIG. 29.

The fourth embodiment is an application of the metal past wiring technique of the present invention to the manufacturing technology of a semiconductor device comprising plural semiconductor chips stacked in order on the first surface of the wiring substrate.

The semiconductor device 1 has the wiring substrate 2. This wiring substrate 2 corresponds to the wiring substrate 2 described in the first embodiment, in which ball electrodes 45 are formed on the underlying electrodes 6 on the second surface 2b to provide external electrode terminals. In the fourth embodiment, one semiconductor chip 3 as an electronic part is fixed to the parts mount 5. Over this semiconductor chip 3, semiconductor chips 3 as electronic parts are stacked in order.

In the fourth embodiments, all semiconductor chips 3 are equal in size, each having plural electrodes 11 on the rim of its top first surface 3a, as shown in FIG. 30. Therefore, the second surface 3b of each semiconductor chip 3 is the fixing surface. Each semiconductor chip 3 is stacked and fixed in order by, for example, a bonding material 10 having electrical insulating properties.

As shown in FIG. 29, among plural semiconductor chips 3 (plural electronic parts) which are stacked, a lowest first semiconductor chip 47 (first electronic part) is fixed to the parts mount 5 of the wiring substrate 2 by the bonding material Among the semiconductor chips 3 which are stacked, a second semiconductor chip 48 (second electronic part) which is fixed on top of another semiconductor chip 3 is electrically independently fixed onto the underlying semiconductor chip 3 by bonding material 10, as shown in FIG. 29. In the fourth embodiment, because the semiconductor chips 3 are stacked in three layers (three stages), there are two second semiconductor chips 48. The bonding material 10 regions on the first surfaces 3a of the first semiconductor chip 47 and the second semiconductor chip 48 at the second layer are defined inner than the rows of the electrodes 11 not to contact the electrodes 11.

As shown in FIG. 31, between a connecting pad 4 of the wiring substrate 2 and an electrode 11 of the lowest first semiconductor chip 47, a third underlying insulation layer 49 made of an insulating material is formed, configured to expose the connecting pad 4 and the electrode 11. The third underlying insulation layer 49 extends from the first surface 2a of the wiring substrate 2 over the side of the first semiconductor chip 47 and to the edge of the first surface 3a. This third underlying insulation layer 49 corresponds to the first underlying insulation layer 15 in the first embodiment. The third underlying insulation layer 49 may consist of two layers like the first underlying insulation layer 15.

As shown in FIG. 31, fourth underlying insulation layers 50 made of an insulating material are formed on the rim of and on the first and second surfaces of two second semiconductor chips 48 and they are configured to expose the electrodes 11.

As shown in FIG. 31, a third metal layer 51 is formed overlaid on each connecting pad 4 of the wiring substrate 2. This third metal layer 51 extends upward. That is, the third metal layer 51 is formed so as to be overlaid on third underlying insulation layer 49 provided on the rim of the first semiconductor chip 47 and on the fourth underlying insulation layers 50 provided on the rim of the two second semiconductor chips 48.

The third metal layer 51 protrudes out of the third or fourth underlying insulation layers 49, 50 in predetermined positions and extends to connect to the electrodes 11 of the appropriate semiconductor chips 3. In particular, to the electrode 11 of the lowest first semiconductor chip 47, a portion of the third metal layer 51 extending between the third underlying insulation layer 49 and the fourth underlying insulation layer 50 provided on the rim of and extending to the under surface of the second semiconductor chip 48 at the second layer is connected.

To the electrode 11 of the second semiconductor chip 48 at the second layer, a portion of the third metal layer 51 extending between the fourth underlying insulation layer 50 provided on the rim of and extending to the top surface of the second semiconductor chip 48 at the second layer and the fourth underlying insulation layer 50 provided on the rim of and extending to the under surface of the top second semiconductor chip 48 is connected.

To the electrode 11 of the top second semiconductor chip 48, a portion of the third metal layer 51 provided overlaid on the third underlying insulation layer 49 and the fourth underlying insulation layers 50 provided on the rim of and extending to the top surface of the two second semiconductor chips 48 is connected.

The third metal layer 51 is covered with a third surface insulation layer 52 made of an insulating material. FIG. 30 is a plan view schematizing the third metal layer 51, with the third surface insulation layer 52 removed. The semiconductor chip 3 depicted in FIG. 30 is the top second semiconductor chip 48.

In the embodiment, all electronic parts are semiconductor chips 3, in which one semiconductor chip 3 is a sensor chip in which an image pickup element is formed, one semiconductor chip 3 is a logic chip in which a logic circuit is formed, and one semiconductor chip 3 is a memory chip in which a memory is formed. Among the plural semiconductors which are stacked, the top semiconductor chip 3 is the sensor chip.

Next, a method of manufacturing the semiconductor device 1 of the fourth embodiment is described. First, the wiring substrate 2 which is used in the first embodiment is prepared. In the fourth embodiment, ball electrodes 45 are attached to the underlying electrodes 6 to for external electrode terminals at the first or last stage of manufacture.

After, for example, the wiring substrate 2 in which the ball electrodes 45 are not attached is prepared, the lowest first semiconductor chip 47 is fixed to the parts mount 5 on the first surface 2a of the wiring substrate 2 by the bonding material 10. Then, the second semiconductor chip 48 at the second layer is fixed on top of the lowest first semiconductor chip 47 by the bonding material 10 and the top second semiconductor chip 48 is fixed onto the second semiconductor chip 48 at the second layer by the bonding material 10. These chips may be fixed in such a way that, after positioning the bonding material 10 regions and the semiconductor chips 3 in order, all the chips are fixed at a time by heating the bonding material 10.

Then, in a portion from the edge of the connecting pad 4 of the wiring substrate 2 up to the edge of the electrode of the lowest first semiconductor chip 47 (that portion on the surfaces of the wiring substrate 2 and the first semiconductor chip 47), the third underlying insulation layer 49 is formed by drawing or spraying electrically insulating paste by an ink jet or dispenser and curing the paste.

Then, on the rim of and on the top surface (first surface) and the under surface (second surface) of the second semiconductor chip 48, the fourth underlying insulation layer 50 made of an insulating material, configured to expose the electrode 11, is formed by drawing or spraying electrically insulating paste by an ink jet or dispenser and curing the paste.

In forming the third underlying insulation layer 49 and the fourth underlying insulation layer 50, these layers are formed to create a predetermined gap (for example, on the order of several ten μm to several hundred μm) between the lowest first semiconductor chip 47 and the second semiconductor chip 48 at the second layer. Similarly, the layers are formed to create a predetermined gap (for example, on the order of several ten μm to several hundred μm) between the second semiconductor chip 48 at the second layer and the top second semiconductor chip 48.

Before stacking and fixing the two second semiconductor chips 48, the fourth underlying insulation layers 50 may be formed, respectively.

Then, the third metal layer 51 is formed to make electrical connections between the connecting pads of the wiring substrate 2 and the electrodes 11 of predetermined semiconductor chips 3. In forming the third metal layer 51, by moving the nozzle of, for example, an ink jet or dispenser from down to up or from up to down, electrically conducting paste (metal paste) is or drawing or spraying over the connecting pads 4, the third underlying insulation layer 49, the fourth underlying insulation layers 50, and the electrodes of the top second semiconductor chip 48. Then, the electrically conducting paste is cured form the third metal layer 51. By jetting or drawing or spraying the electrically conducting paste, the paste enters the above gaps between the chips. The thus entered and hardened portions of the third metal layer 51 are electrically connected to the electrodes 11 of predetermined semiconductor chips 3.

To protect the third metal layer 51, then, electrically insulating paste is drew or sprayed over the third metal layer 51 by an ink jet or dispenser. The paste is cured to form the third surface insulation layer 52. In forming the third underlying insulation layer 49, the fourth underlying insulation layers 50, the third metal layer 51, and the third surface insulation layer 52, electrically conducting paste and electrically insulating paste used in the first embodiment can be used.

Finally, by forming the ball electrodes 45 to the underlying electrodes 6 on the second surface 2b of the wiring substrate 2 by a commonly used method, the semiconductor device 1 shown in FIG. 29 can be manufactured.

The second embodiment provides the following advantageous effects.

(1) Electrical connections between the connecting pads 4 of the wiring substrate 2 and the electrodes 11 of the semiconductor chips 3 are provided by the third metal layer 51 which couples the electrodes 11 and the connecting pads 4, respectively. This third metal layer 51 is formed overlaid on the connecting pads 4. Also, the third metal layer 51 is formed overlaid on the third underlying insulation layer 49 provided on the rim of the lowest semiconductor chip 3 (first semiconductor chip 47) and connected to the electrodes 11 of the first semiconductor chip 47. Further, the third metal layer 51 extends upward across the layers and extends overlaid on the fourth underlying insulation layer 50 formed on the top and under surfaces on the edge and on the rim of the second semiconductor chip 48 and is also connected to the electrodes 11 of the second semiconductor chip 48. The underlying insulation layers define smooth surfaces and, therefore, the metal layer formed on the underlying insulation layers extends continuously. The connections between the connecting pads 4 and the electrodes 11 are provided reliably and with a high precision.

(2) Because the third metal layer 51 is in solid contact with the third and fourth underlying insulation layers 49, 50, this structure is free from deformation such as bending which may occur with wires. This structure can prevent a short circuit trouble due to that a metal layer is deformed to contact a neighboring metal layer and enhances the reliability of the semiconductor device 1. Thereby, even microscopic wiring can be performed.

(3) The third and fourth underlying insulation layers 49, 50 and the third metal layer 51 can be formed easily and with a high precision by an ink jet and a dispenser which are commonly used in the manufacturing technology of the semiconductor device. This improves the manufacturing efficiency and can achieve a lower cost of the semiconductor device 1. The nozzle movement of the ink jet and the dispenser is controlled freely in XY directions in a plane. Thus, it is advantageous that a wiring length and a wiring shape can be selected freely, unlike wire connections. For example, not only a linear wiring, a zigzag wiring is also possible with metal layers. Thereby, the degree of freedom in selecting the positions in which the semiconductor chips 3 are fixed and in wiring design increases.

(4) The connecting pads 4 of the wiring substrate 2 and the electrodes 11 of the semiconductor chips 3 are connected by the metal layers formed overlaid on the underlying insulation layers. This can make the device smaller and thinner as compared with a device structure in which the connections between the electrodes of the semiconductor chips and the connecting pads of the wiring substrate are made by wire bonding. In wire bonding, wires are looped to connect the electrodes of the semiconductor chips (electronic parts) and the connecting pads of the wiring substrate, which requires longer wiring at higher than wiring with the metal layers. In the present invention, since the semiconductor device 1 can be made smaller and thinner, a lighter semiconductor device 1 can be achieved. Height k in FIG. 29 indicates a height in the case where the electrodes of the semiconductor chips and the connecting pads 4 of the wiring substrate 2 are connected by wires. Height h is the height of the semiconductor device 1 of the fourth embodiment. Difference is, for example, on the order of several hundred μm.

(5) As noted above in (4), electrical connection distance can be shortened, that is, wiring length becomes shorter, with the result that decreasing electric signal delay and reducing noise can be achieved. Particularly, for the semiconductor device 1 in which a sensor chip, a logic chip, and a memory chip are stacked, the effects of decreasing electric signal delay and reducing noise will be significant.

Figure 32:
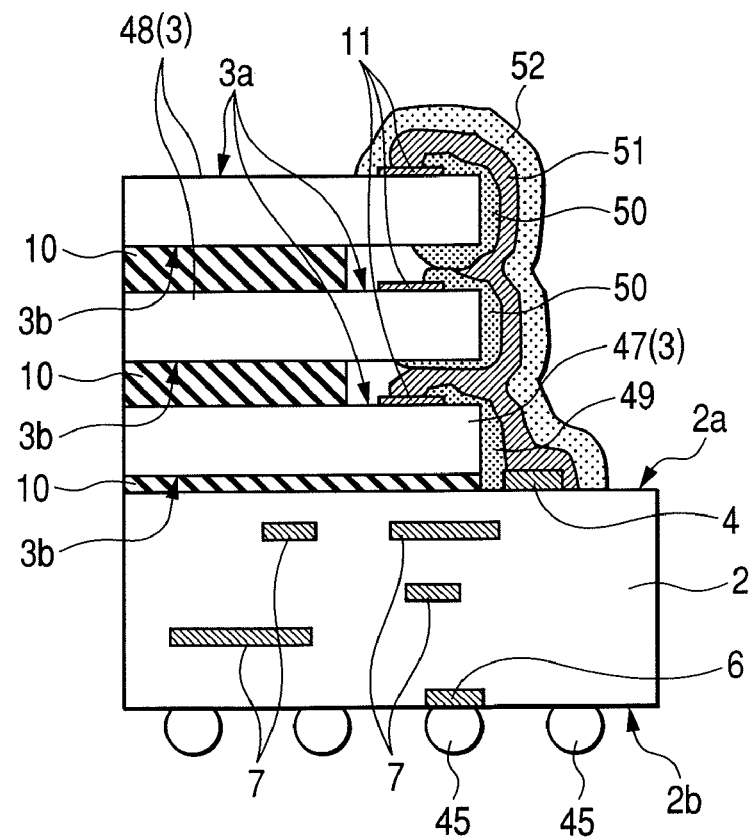
FIG. 32 is a schematic enlarged sectional view showing a part of a semiconductor device in accordance with a first modification example to the fourth embodiment of the present invention.

FIG. 32 is an enlarged sectional view of a part relating to a first modification example to the fourth embodiment. FIG. 32 corresponds to FIG. 31 of the fourth embodiment. This modified embodiment is configured to disable an electrical connection between an electrode 11 of a predetermined semiconductor chip 3 and the third metal layer 51.

As shown in FIG. 32, at the stage of forming third underlying insulation layer 49 and the fourth underlying insulation layers 50, the process makes the third underlying insulation layer 49 and/or the fourth underlying insulation layers 50 protrude into the stack area of the semiconductor chips 3 (electronic parts) to stuff the space between two electronic parts which are stacked. Because the third underlying insulation layer 49 and the fourth underlying insulation layers 50 are formed outside of the row of the electrodes, the gap between the chips which are stacked is stuffed by the third underlying insulation layer 49 and/or the fourth underlying insulation layers 50. The third metal layer 51 does not reach an electrode 11 positioned inside the insulation layer. In this way, it is possible to disable the connection between an electrode 11 of a certain semiconductor chip 3 (for example, the electrode not used electrically) and the third metal layer 51. In the example of FIG. 32, the gap between two second semiconductor chips 48 is stuffed.

As an alternative method for disabling the connection between the third metal layer 51 and an electrode 11, it is also possible to cover an intended electrode of a certain semiconductor chip 3 with the third underlying insulation layer 49 or the fourth underlying insulation layer 50.

Figure 33:
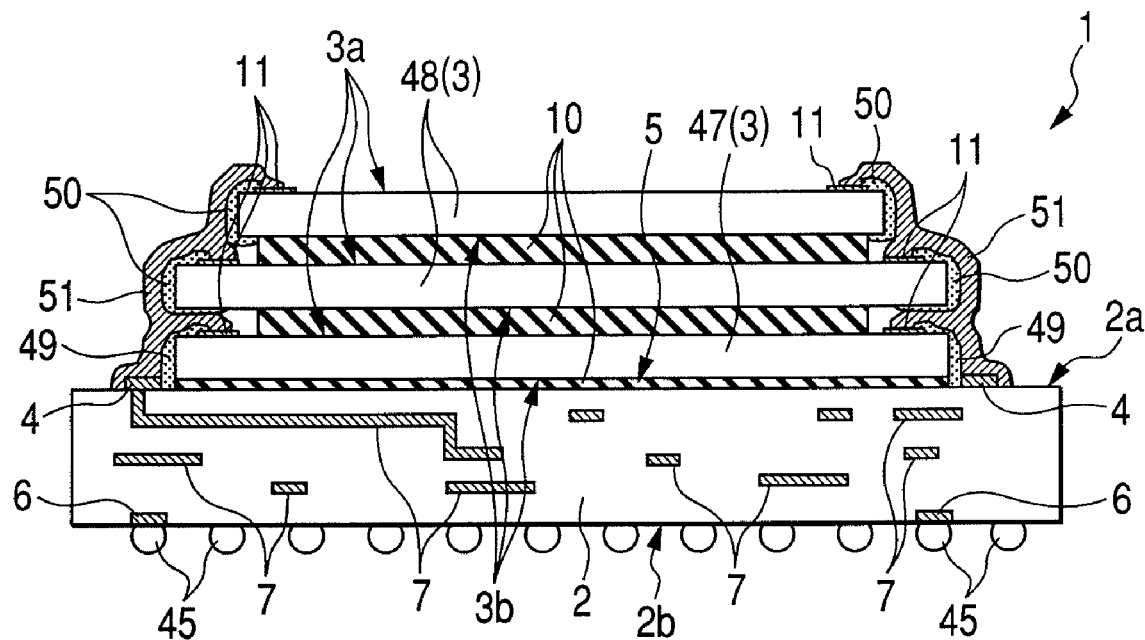
FIG. 33 is a schematic sectional view of a semiconductor device in accordance with a second modification example to the fourth embodiment of the present invention.

FIG. 33 is a schematic sectional view of a semiconductor device relating to a second modification example to the fourth embodiment. Based on the semiconductor device 1 of the fourth embodiment, the semiconductor device 1 relating to the second modification example to the fourth embodiment is configured such that at least one of the semiconductor chips 3 which are electronic parts is smaller than the lowest first semiconductor chip 47 (first electronic part). As shown in FIG. 33, specifically, the top second semiconductor chip 48 is smaller than other chips, the second semiconductor chip 48 and the first semiconductor chip 47. In this case, the top portion of the third metal layer 51 further extends into the chip stack area so as to be overlaid on the electrode 11 of the top second semiconductor chip 48.

In the second modification example to the fourth embodiment, one semiconductor chip 3 is placed in each layer (each stage); alternatively, plural smaller semiconductor chips 3 may be installed in a certain stage.

Figure 34:
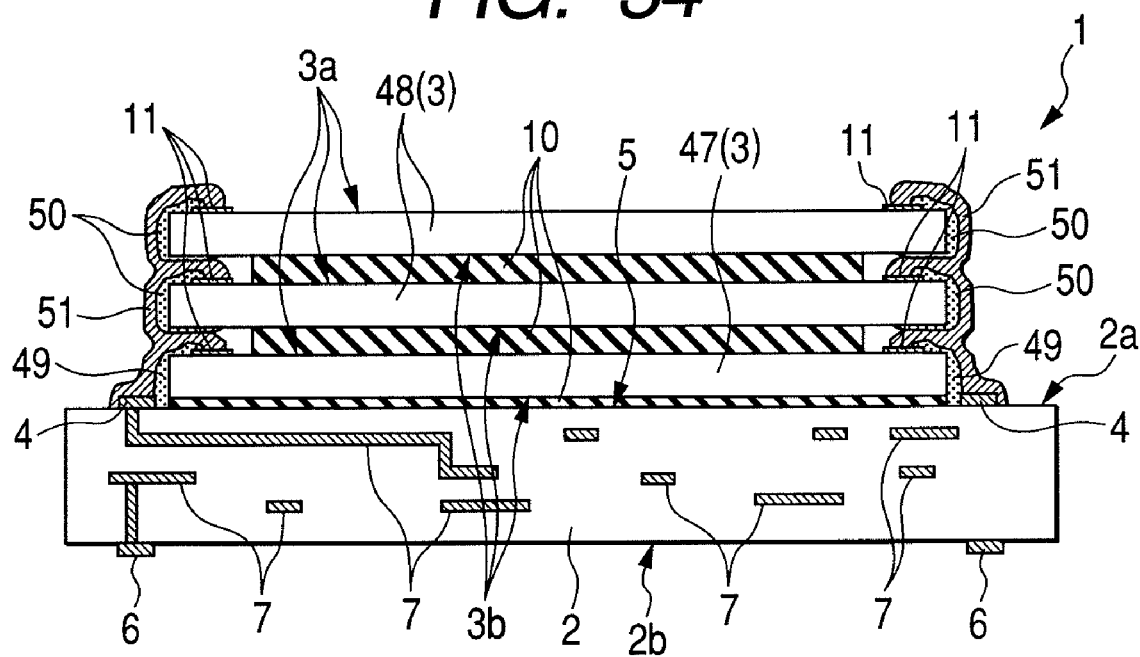
FIG. 34 is a schematic sectional view of a semiconductor device in accordance with a third modification example to the fourth embodiment of the present invention.
Figure 35:
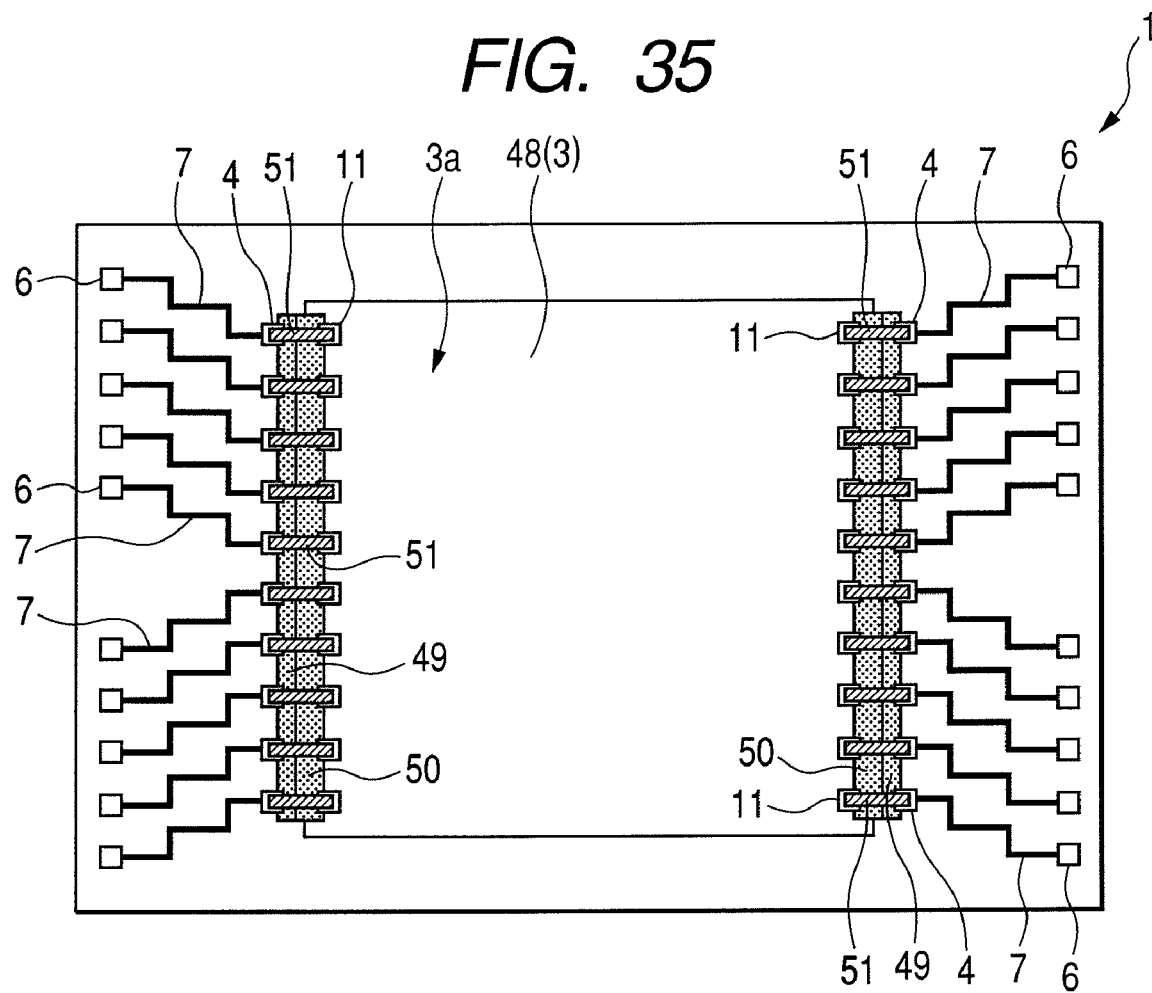
FIG. 35 is a schematic plan view showing connections in the semiconductor device of the third modification example to the fourth embodiment.

FIG. 34 and FIG. 35 are diagrams relating to a semiconductor device that is a third modification example to the fourth embodiment of the present invention. Based on the semiconductor device 1 of the fourth embodiment, the semiconductor device 1 of the third modification example is arranged such that a flexible wiring substrate (FPC) is used as the wiring substrate 2. As seen in the schematic sectional view of the semiconductor device of FIG. 34, the underlying electrodes 6 on the second surface 2b of the flexible wiring substrate (wiring substrate 2) are made exposed as external electrode terminals in the semiconductor device 1 of the third modification example to the fourth embodiment.

FIG. 35 is a schematic plan view showing connections in the semiconductor device 1. In FIG. 35, to an electrode 11 of the top second semiconductor chip 48, a portion of the third metal layer 51 provided overlaid on the third underlying insulation layer 49 and the fourth underlying insulation layer 50 provided on the rim of and extending to the top surface of the top second semiconductor chip 48 is connected. FIG. 35 is a plan view in which the third surface insulation layer 52 covering the third metal layer 51 is removed. The semiconductor chip 3 depicted in FIG. 35 is the top second semiconductor chip 48. In FIG. 35, the external electrode terminals formed with the underlying electrodes 6 are noted as small squares. Bold lines connecting these underlying electrodes 6 and the connecting pads 4 are wiring sections 7 provided inside the flexible wiring substrate.

The third modification example to the fourth embodiment has an advantage that a lighter and smaller package is provided.

Fifth Embodiment

Figure 36:
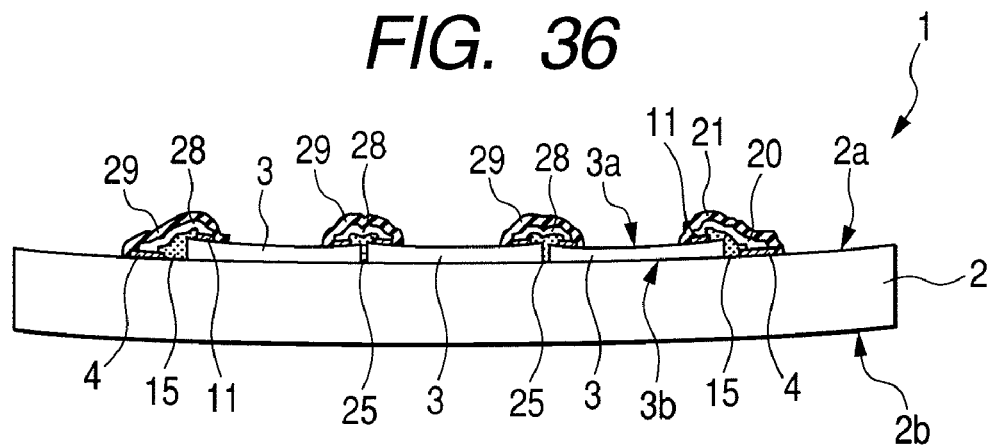
FIG. 36 is a schematic sectional view of a semiconductor device in accordance with a fifth embodiment of the present invention.

FIG. 36 is a schematic sectional view showing a principal part of a semiconductor device in accordance with a fifth embodiment of the present invention. The fifth embodiment presents an example where the parts mount 5 on the wiring substrate 2 has a curvature structure (the substrate structure has a curvature) in the semiconductor device 1 of the first embodiment. In this example, specifically, the first surface 2a of the wiring substrate 2 has a concave curvature; i.e., it gradually sags toward the center. By making the semiconductor chips 3 as thin as about 100 μm, the semiconductor chips 3 are fixed to the wiring substrate 2, curved along the curvature, by the bonding force of the bonding material 10.

The semiconductor device 1 of the fifth embodiment has an advantage of adaptability to optics.

Figure 37:
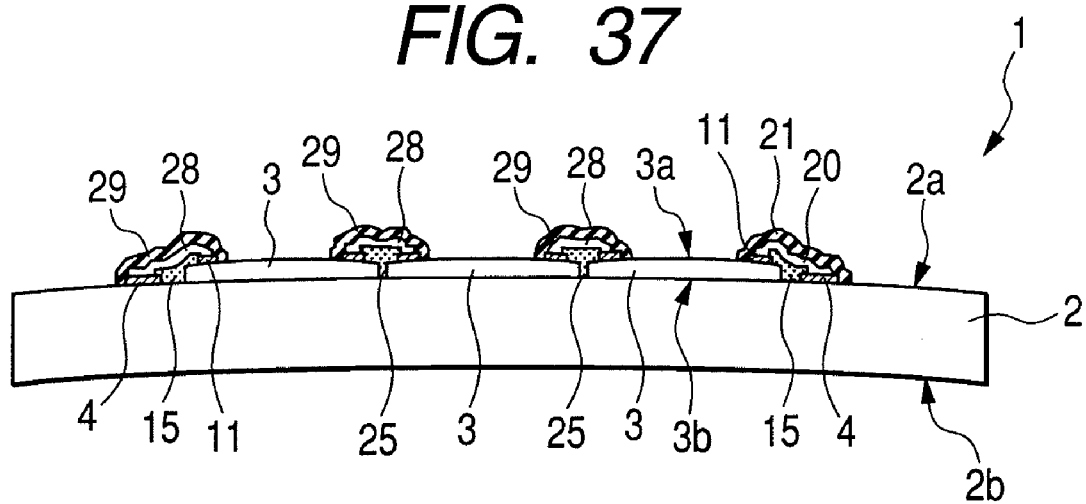
FIG. 37 is a schematic sectional view of a semiconductor device in accordance with a first modification example to the fifth embodiment.

FIG. 37 is a schematic sectional view showing a principal part of a semiconductor device that is a modification example to the fifth embodiment of the present invention. The semiconductor device 1 shown in FIG. 37 is an example in which the first surface 2a of the wiring substrate 2 has a convex curvature; i.e., it gradually rises toward the center. By making the semiconductor chips 3 as thin as about 100 μm, the semiconductor chips 3 are fixed to the wiring substrate 2, curved along the curvature, by the bonding force of the bonding material 10.

The semiconductor device 1 of the modification example to the fifth embodiment an advantage of adaptability to optics.

Sixth Embodiment

Figure 38:
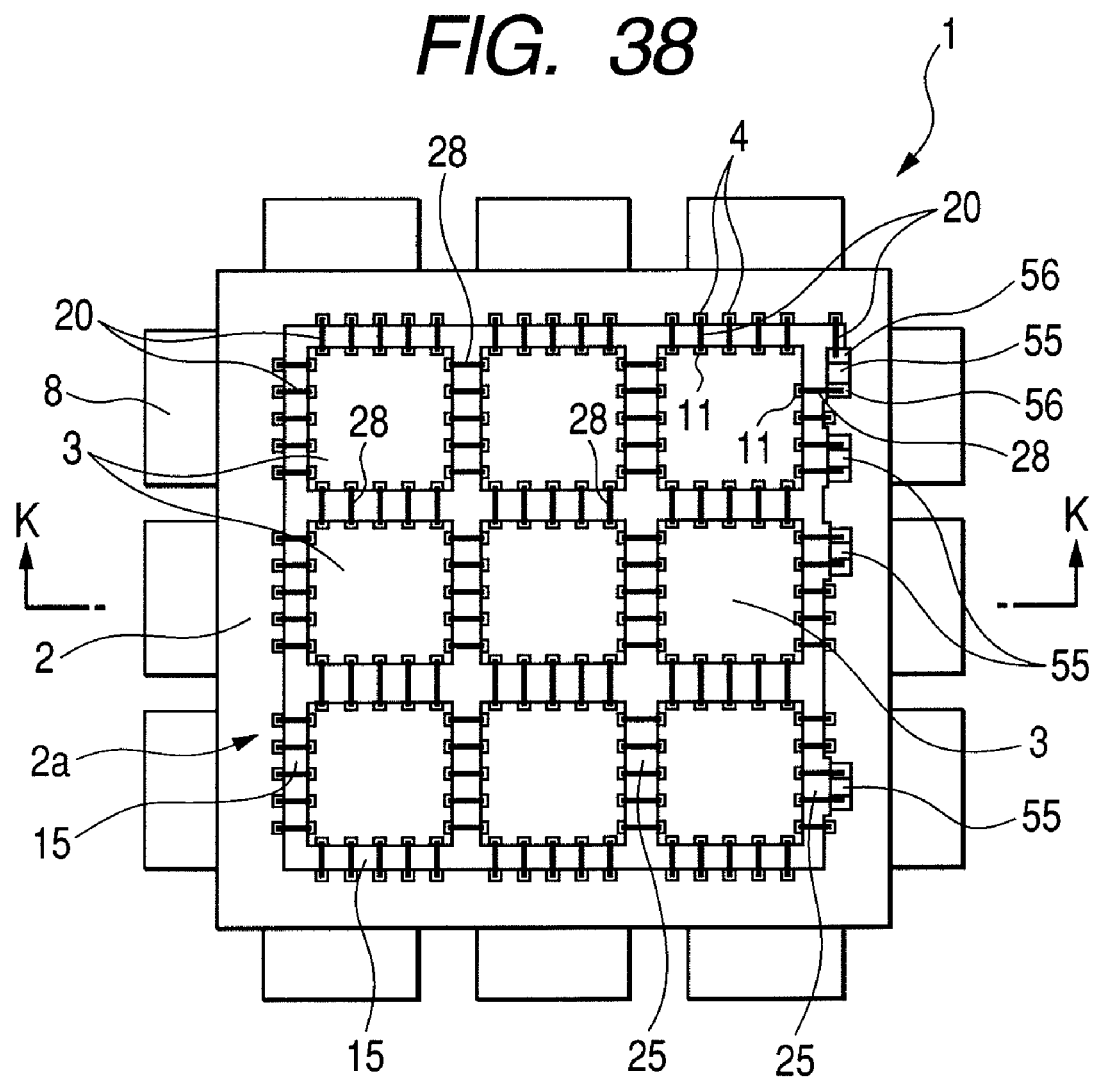
FIG. 38 is a schematic sectional view of a semiconductor device in accordance with a sixth embodiment of the present invention.
Figure 39:
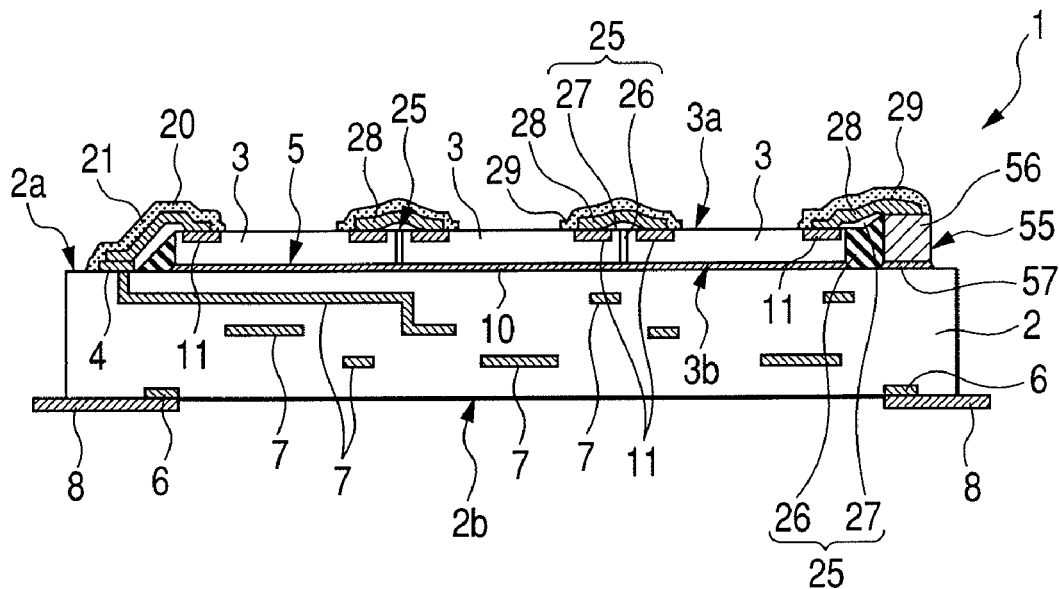
FIG. 39 is a schematic enlarged sectional view taken along a K-K line in FIG. 38.
Figure 40:
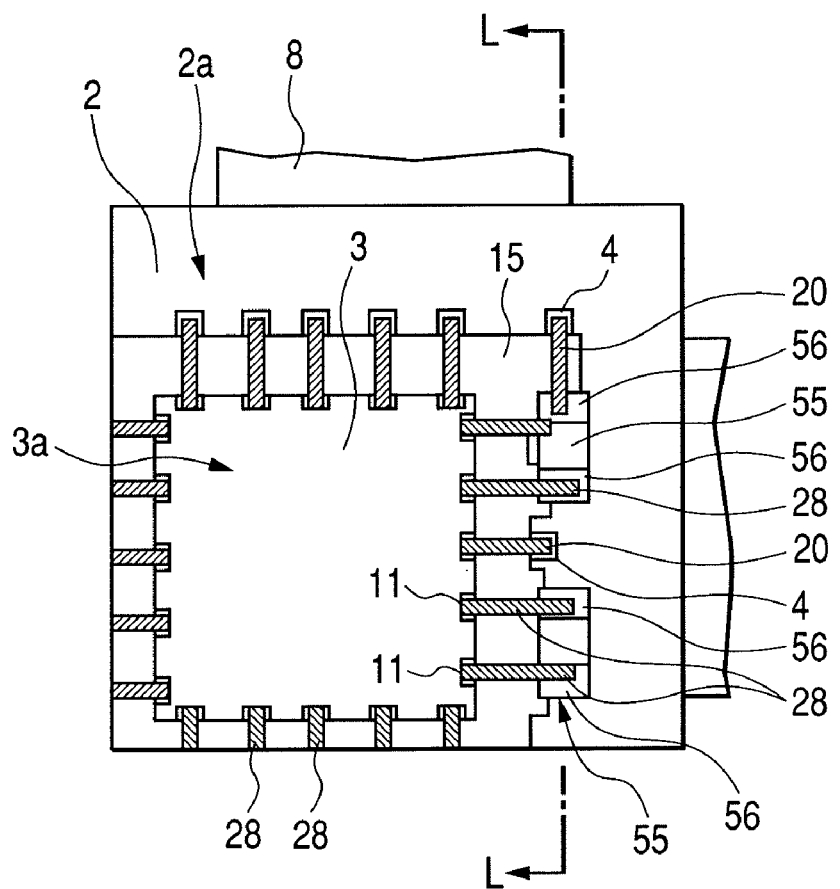
FIG. 40 is a schematic enlarged plan view of a part of FIG. 38.
Figure 41:
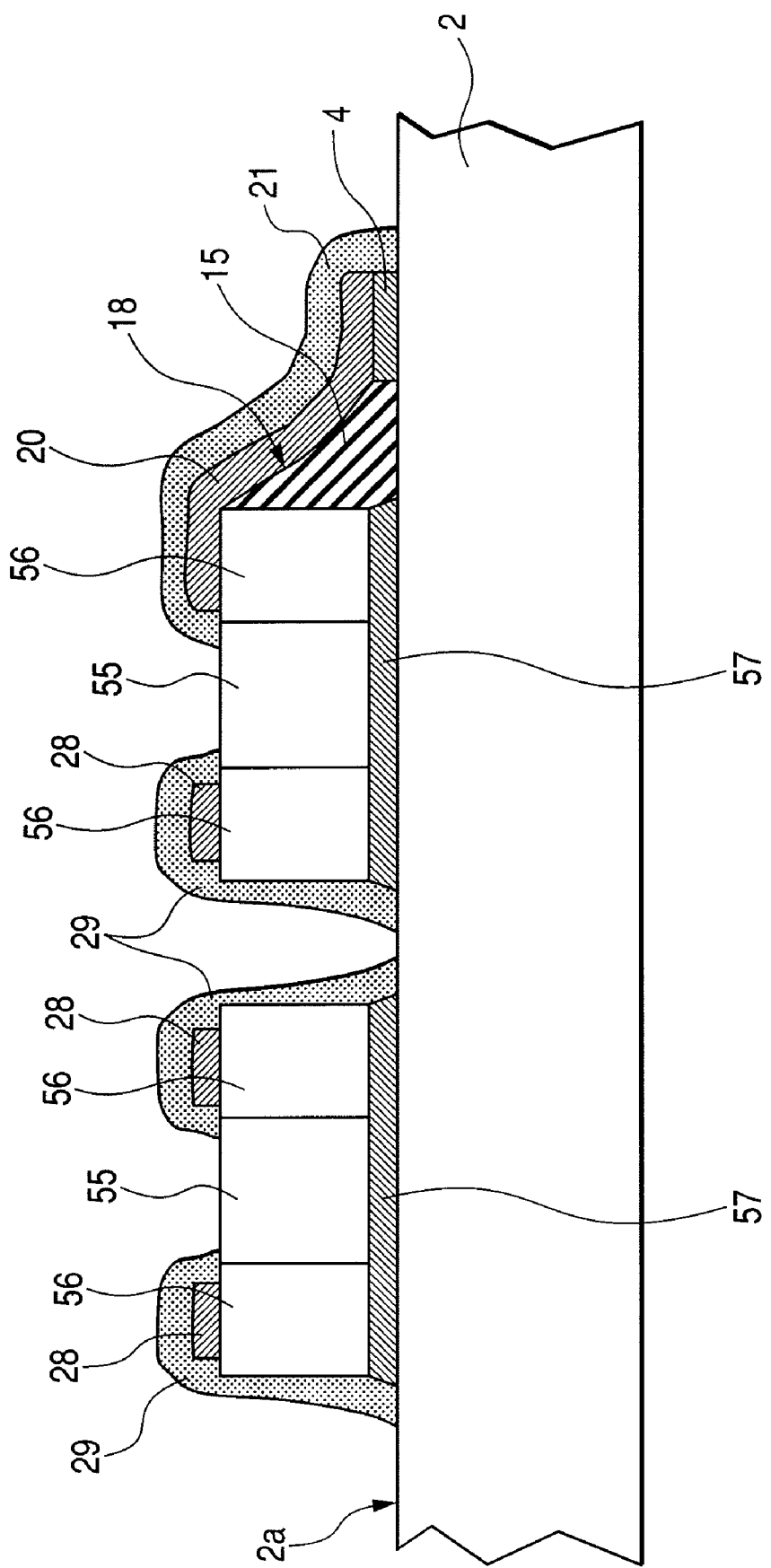
FIG. 41 is a schematic enlarged sectional view taken along an L-L line in FIG. 40.

FIGS. 38 through 41 are diagrams relating to a semiconductor device in accordance with a sixth embodiment of the present invention. FIG. 38 is a schematic plan view of the semiconductor device. FIG. 39 is a schematic enlarged sectional view taken along a K-K line in FIG. 38. FIG. 40 is a schematic enlarged plan view of a part of FIG. 38. FIG. 41 is a schematic enlarged sectional view taken along an L-L line in FIG. 40.

The semiconductor device 1 of the sixth embodiment sixth embodiment is an example in which the semiconductor device 1 of the first embodiment is arranged such that electronic parts other than semiconductor chips are mounted on the wiring substrate. In the sixth embodiment, as the electronic parts other than semiconductor chips, passive parts having plural exposed electrodes on the first surface, for example, chip parts 55 having electrodes 56 at both ends are mounted. Each chip part 55 makes any of the following elements: chip resistor, chip capacitor, chip inductor, etc.

FIG. 38 is a plane view of the semiconductor device 1, in which the first surface insulation layer 21 and the second surface insulation layer 29 are removed. Based on the semiconductor device 1 of the first embodiment shown in FIG. 1 and FIG. 2, the semiconductor device 1 of the sixth embodiment is configured such that, as shown in FIG. 38 and FIG. 39, on the right edge of the chip cluster, the chip parts 55 are fixed to the first surface 2a of the wiring substrate 2 by, for example, an electrically insulating bonding material 57. In the figure, four chip parts 55 are fixed.

As shown in FIG. 39, a second underlying insulation layer 25 is formed between adjacent semiconductor chips 3 of the first embodiment. Similarly, between the electrode 56 of a chip part 55 and a neighboring semiconductor chip 3, a second underlying insulation layer 25 consisting of a second filling layer 26 and a second insulation layer 27 is formed. On the top of the second underlying insulation layer 25, a second metal layer 28 which provides an electrical connection between the electrode 56 of the chip part 55 and the electrode 11 of the semiconductor chip 3 is formed. The second metal layer 28 is protected by covering of the second surface insulation layer 29.

For one of the chip parts 55 shown in FIG. 40 and FIG. 41 (a right chip part 55 in FIG. 41), one of the electrodes 56 at its both ends is connected to the electrode 11 of the neighboring semiconductor chip 3 by metal paste wiring provided by the second metal layer 28, as shown in FIG. 39. The other electrode 56 is electrically connected to the connecting pad 4 provided on the first surface 2a of the wiring substrate 2 by the first metal layer 20. As shown in FIG. 41, the first metal layer 20 is formed on the first underlying insulation layer 15 formed between the connecting pads 4 and the other electrode 56 of the chip part 55. The first underlying insulation layer 15 may consist of two layers, namely, the first filling layer 16 and the first insulation layer 17, as is the case for the first embodiment. Since both ends of the chip part 55 are the electrodes 56, electrical connection may connect to at least a part of the electrodes 56. However, if the first metal layer 20 extends to the top surface (first surface) of the electrode 56 as shown in FIG. 41, the first underlying insulation layer 15 is preferably defined to have a sloping plane 18 on the side of the edge face of the electrode 56.

In the sixth embodiment, the electrode 56 connection of the chip part 55 is not overlaid on a connecting pad such as a land which is a wiring provision on wiring substrate 2. Each electrode 56 connection of the chip part 55 may be overlaid by an electrically conducting joint material such as solder. In this case, the appropriate electrode 56 of the chip part 55 is connected to the electrode of another neighboring electronic part by metal paste wiring provided by the second metal layer 28 as shown in FIG. 39.

In the sixth embodiment, connections of electronic parts other than semiconductor chip, where required, are connected by metal paste wiring provided by the first metal layer 20 and the second metal layer 28. Accordingly, even for typical semiconductor devices which are sealed by electrically insulating resin seals, if appropriate electrodes are exposed on the top of the seal, these electrodes can be fixed to the wiring substrate 2 by metal paste wiring in the same way as for the above chip parts 55.

In the image pickup device of the sixth embodiment, not only the parts for image pickup, but also other circuit elements for drive control of the image pickup device can be installed on a single wiring substrate.

Like the semiconductor device 1 of the sixth embodiment, assembling of more electronic parts allows for application of the invention to products in other fields. Applications of the invention may include, for example, CCD and MOS sensors, mobile electronic devices, micro sensors (endoscopes, capsular endoscopes), monitor cameras (products required to have a wide range of angles of view), etc.

While the invention made by the present inventors has been described specifically hereinbefore based on several embodiments, it will be appreciated that the present invention is not limited to the foregoing embodiments and various modifications may be made without departing from the gist of the invention. While an ultraviolet curing resin is used as electrically insulating paste in the described embodiments, other electrically insulating resins may be used. Electrically insulating resin materials which can be used may include, for example epoxy resin, acrylic resin, silicon resin, etc.

In the foregoing description, the invention made by the present inventors has been explained with respect to its application to the technique for manufacturing an image pickup device, which is regarded as the background usage field of the invention. However, the present invention is not so limited and may also be applied to SiP (System in Package), SoC (System on chip), MCM (Multi chip module), etc. which are in demand for use in, for example, mobile phones and mobile electronic devices.

The present invention can be applied to at least a semiconductor device in which plural electronic parts are arrayed and fixed onto the first surface of the wiring substrate or a semiconductor device in which plural electronic parts are stacked in order on the first surface of the wiring substrate.

What is claimed is:

1. A semiconductor device comprising:
    a wiring substrate having a first surface and a second surface opposite to said first surface; a parts mount defined on said first surface for arraying and fixing a plurality of electronic parts; a plurality of connecting pads arranged in place outside said parts mount; and external electrode terminals on said first surface and/or said second surface;
    a plurality of electronic parts having a first surface and a second surface opposite to said first surface, said first surface having a plurality of electrodes and said second surface being fixed to said parts mount via a bonding material;
    a first underlying insulation layer having electrically insulating properties, provided between said connecting pads of said wiring substrate and said electrodes of said electronic parts and formed on said wiring substrate and on the surface of said electronic parts, wherein said connecting pads and said electrodes are electrically connected,
    a first metal layer formed overlaid on said first underlying insulation layer, one end of the first metal layer being connected to said connecting pads and the other end of the first metal layer being connected to said electrodes;
    a second underlying insulation layer having electrically insulating properties, provided between the respective electrodes, which are electrically connected, of adjacent electronic parts and formed on the surface of said electronic parts or on the surface of said electronic parts and between said electronic parts;
    a second metal layer formed overlaid on said second underlying insulation layer, one end of the second metal layer being connected to the electrodes of one of said adjacent electronic parts and the other end of the second metal layer being connected to the electrodes of the other one of said adjacent electronic parts; and
    a first surface insulation layer made of an insulating material for covering said first metal layer and a second surface insulation layer made of an insulating material for covering said second metal layer.

2. The semiconductor device according to claim 1, wherein:
   said first underlying insulation layer is formed of a first filling layer made of an insulating material, having a sloping plane which at least fills a gap on the side of said electronic parts and extends from the first surface of said wiring substrate to the first surface of said electronic parts, and a first insulation layer made of an insulating material, which is formed at least overlaid on said first filling layer;
   said second underlying insulation layer is formed of a second filling layer made of an insulating material, which at least fills a gap between adjacent electronic parts, and a second insulation layer made of an insulating material, which is formed at least overlaid on said second filling layer and defines a flat surface or a smoothly curved surface between the electrodes of adjacent electronic parts.

3. The semiconductor device according to claim 2, wherein said first filling layer and said first insulation layer are made of different materials and said second filling layer and said second insulation layer are made of different materials.

4. The semiconductor device according to claim 1, wherein said plurality of electronic parts are semiconductor chips of the same type and having equal dimensions.

5. The semiconductor device according to claim 4, wherein said semiconductor chips are sensor chips, in each of which an image pickup element having an image pickup surface corresponding to said first surface is formed.

6. The semiconductor device according to claim 1, wherein said electronic parts are semiconductor chips and passive parts having a plurality of electrodes exposed on said first surface.

7. A semiconductor device comprising:
   a wiring substrate having a first surface and a second surface opposite to said first surface; a parts mount defined on said first surface for fixing electronic parts; a plurality of connecting pads arranged in place outside said parts mount; and external electrode terminals on said first surface and/or said second surface; and
   a plurality of electronic parts having a first surface and a second surface opposite to said first surface, said first surface having a plurality of electrodes on the rim and said second surface being a fixing surface, wherein the electronic parts are stacked in order via a bonding material on said first surface of said wiring substrate,
   wherein the second surface of a lowest first electronic part among said plurality of electronic parts which are stacked is fixed to said parts mount of said wiring substrate via said bonding material,
   wherein a second electronic part which is fixed on top of said electronic part via said bonding material, among said plurality of electronic parts which are stacked, is electrically independently fixed onto the underlying electronic part via said bonding material,
   wherein a third underlying insulation layer made of an insulating material is formed in a region extending from said electrodes of said lowest first electronic part to said connecting pads of said wiring substrate and configured to expose said connecting pads and said electrodes,
   wherein a fourth underlying insulation layer made of an insulating material is formed on the rim, the first surface, and the second surface of said second electronic part which is stacked and fixed onto another electronic part and configured to expose said electrodes,
   wherein a third metal layer is formed overlaid on said connecting pads of said wiring substrate,
   wherein said third metal layer is formed overlaid on said third underlying insulation layer provided on the rim of said first electronic part and on said fourth underlying insulation layer on the rim of said second electronic part and said third metal layer protrudes out of said third or fourth underlying insulation layer in predetermined positions and extends to connect to the appropriate electrodes,
   wherein said third metal layer is covered with a third surface insulation layer made of an insulating material.

8. The semiconductor device according to claim 7, wherein at least one of said electronic parts is smaller than said lowest first electronic part.

9. The semiconductor device according to claim 7, wherein all said electronic parts are semiconductor chips, wherein at least one semiconductor chip is a sensor chip in which an image pickup element is formed, at least one semiconductor chip is a logic chip in which a logic circuit is formed, and at least one semiconductor chip is a memory chip in which a memory is formed, and the top semiconductor chip among the plurality of semiconductor chips which are stacked is said sensor chip.

10. A method of manufacturing a semiconductor device, comprising the steps of:
   (a) preparing a wiring substrate having a first surface and a second surface opposite to said first surface; a parts mount defined on said first surface for arraying and fixing a plurality of electronic parts; a plurality of connecting pads arranged in place outside said parts mount; and external electrode terminals on said first surface and/or said second surface;
   (b) preparing a plurality of electronic parts having a first surface and a second surface opposite to said first surface, said first surface having a plurality of electrodes and said second surface being fixed to said parts mount via a bonding material;
   (c) arraying and fixing said plurality of electronic parts onto said parts mount of said wiring substrate via a bonding material
   (d) forming a first underlying insulation layer having electrically insulating properties on said wiring substrate and on the surface of said electronic parts between said connecting pads of said wiring substrate and said electrodes of said electronic parts, wherein said connecting pads and said electrodes are electrically connected, and forming a second underlying insulation layer having electrically insulating properties on the surface of said electronic parts or on the surface of said electronic parts and between said electronic parts between the respective electrodes, which are electrically connected, of adjacent electronic parts;
   (e) forming a first metal layer on top of the first underlying insulation layer to provide electrical connections between the connecting pads of the wiring substrate and forming a second metal layer on top of the second underlying insulation layer to provide electrical connections between predetermined electrodes of adjacent electronic parts; and
   (f) forming a first surface insulation layer made of an insulating material to cover said first metal layer and forming a second surface insulation layer made of an insulating material to cover said second metal layer.

11. The method of manufacturing a semiconductor device according to claim 10, wherein:
   in said step (d), said first underlying insulation layer is formed by the steps of:

(g) forming a first filling layer made of an insulating material, having a sloping plane which at least fills a gap on the side of said electronic parts and extends from the first surface of the wiring substrate to the first surface of the electronic parts; and (h) forming a first insulation layer made of an insulating material, which is formed at least overlaid on said first filling layer, said second underlying insulation layer is formed by the steps of:

(i) forming a second filling layer made of an insulating material, which at least fills a gap between adjacent electronic parts; and (j) forming a second insulation layer made of an insulating material, which is formed at least overlaid on said second filling layer and defines a flat surface or a smoothly curved surface between said electrodes of said adjacent electronic parts.

12. The method of manufacturing a semiconductor device according to claim 11, wherein:

in said step (d), said first filling layer and said first insulation layer are formed from different materials and said second filling layer and said second insulation layer are formed from different materials.

13. The method of manufacturing a semiconductor device according to claim 11, wherein:

said first filling layer and said second filling layer are formed using an electrically insulating resin having a viscosity of 40-220 pa·s, said first insulation layer and said second insulation layer are formed using an electrically insulating resin having a viscosity of 10-120 pa·s, and said first surface insulation layer and said second surface insulation layer are formed using an electrically insulating resin having a viscosity of 1-30 pa·s, and said resin is hardened by curing.

14. The method of manufacturing a semiconductor device according to claim 10, wherein:

in said step (c), as said electronic parts, sensor chips of the same type and having equal dimensions, in each of which an image pickup element having an image pickup surface corresponding to said first surface is formed, are fixed to said parts mount of said wiring substrate.

15. The method of manufacturing a semiconductor device according to claim 10, wherein:

in said step (c), as said electronic parts, semiconductor chips and passive parts having a plurality of electrodes exposed on said first surface are fixed to said parts mount.

16. The method of manufacturing a semiconductor device according to claim 10, wherein:

said step (c) of arraying and fixing a plurality of semiconductor chips as said electronic parts onto said parts mount of said wiring substrate via said bonding material comprises the steps of:

(k) floating said plurality of semiconductor chips with said first surface down in a liquid contained in a basin and vibrating said liquid, thereby letting adjacent semiconductor chips get in contact with each other and align lengthwise and crosswise on the surface of said liquid;

(l) transforming said liquid to a hardening body by curing;

(m) drawing or spraying a boding material onto said second surface of said semiconductor chips;

(m) positioning and putting said wiring substrate with said first surface down on said plurality of semiconductor chips, pressing said wiring substrate against said hardening body to bond said semiconductor chips to said wiring substrate by said bonding material, and curing said bonding material to fix said semiconductor chips to said wiring substrate; and (o) removing the wiring substrate to which the semiconductor chips were fixed from the basin.

17. The method of manufacturing a semiconductor device according to claim 16, wherein:

an agar solution is used as the liquid;

said step (l) comprises leaving said liquid as is for a predetermined period of time to allow said liquid to harden naturally; and said step (o) comprises melting said hardening body with hot water of a certain temperature to liquefy and, then, removing said wiring substrate.

18. The method of manufacturing a semiconductor device according to claim 10, wherein:

said step (c) of arraying and fixing a plurality of semiconductor chips as said electronic parts onto said parts mount of said wiring substrate via a bonding material comprises the steps of:

(p) drawing or spraying a reactive curing resin liquid on the top surface of said wiring substrate placed with said first surface facing up to form a layer with a predetermined thickness;

(q) floating said plurality of semiconductor chips with said second surface down in said resin liquid and vibrating said resin liquid, thereby letting adjacent semiconductor chips get in contact with each other and align lengthwise and crosswise on the surface of said resin liquid; and (r) hardening said resin liquid by reactive curing to make said bonding material and fixing said semiconductor chips to said wiring substrate by said bonding material.

19. The method of manufacturing a semiconductor device according to claim 18, wherein:

said step (p) comprises drawing or spraying an ultraviolet curing resin liquid which is used as said reactive curing resin liquid on the top surface of said wiring substrate to form a layer with a predetermined thickness; and said step (r) comprises hardening said ultraviolet curing resin liquid by exposure of said ultraviolet curing resin liquid to ultraviolet irradiation to make said boding material.

20. The method of manufacturing a semiconductor device according to claim 18, wherein:

said step (p) comprises drawing or spraying a thermoplastic resin liquid which is used as said reactive curing resin liquid, after being liquefied by heating, on the top surface of said wiring substrate to form a layer with a predetermined thickness; and said step (r) comprises hardening said resin liquid by curing at normal temperature to make said bonding material.

* * * * *